United States Patent [19]

Vinal

[11] Patent Number: 5,440,160
[45] Date of Patent: Aug. 8, 1995

[54] HIGH SATURATION CURRENT, LOW LEAKAGE CURRENT FERMI THRESHOLD FIELD EFFECT TRANSISTOR

[75] Inventor: Albert W. Vinal, Cary, N.C.

[73] Assignee: Thunderbird Technologies, Inc., Research Triangle Park, N.C.

[21] Appl. No.: 177,847

[22] Filed: Jan. 5, 1994

Related U.S. Application Data

[63] Continuation-in-part of Ser. No. 37,636, Feb. 23, 1993, Pat. No. 5,374,836, which is a continuation-in-part of Ser. No. 977,689, Nov. 18, 1992, Pat. No. 5,369,295, which is a continuation of Ser. No. 826,939, Jan. 28, 1992, Pat. No. 5,194,923.

[51] Int. Cl.$^6$ ............................................. H01L 29/78
[52] U.S. Cl. ................... 257/327; 257/344; 257/403
[58] Field of Search ............... 257/327, 336, 340, 344, 257/345, 386, 403, 404, 408

[56] References Cited

U.S. PATENT DOCUMENTS

| | | |
|---|---|---|
| Re. 32,800 | 12/1988 | Han et al. |
| 3,653,978 | 4/1972 | Robinson et al. |
| 3,789,504 | 2/1974 | Jaddam |
| 3,872,491 | 3/1975 | Hanson et al. |
| 4,042,945 | 8/1977 | Lin et al. |
| 4,108,686 | 8/1978 | Jacobus, Jr. |
| 4,274,105 | 6/1981 | Crowder et al. |
| 4,491,807 | 1/1985 | Hoover |
| 4,697,198 | 9/1987 | Komori et al. |
| 4,701,775 | 10/1987 | Cosentino et al. |
| 4,737,471 | 4/1988 | Shirato et al. |
| 4,771,012 | 9/1988 | Yabu et al. |
| 4,819,043 | 4/1989 | Yazawa et al. |
| 4,831,422 | 5/1989 | Ohno |
| 4,841,346 | 6/1989 | Noguchi |
| 4,899,202 | 2/1990 | Blake et al. |
| 4,907,048 | 3/1990 | Huang |
| 4,928,156 | 5/1990 | Alvis et al. |
| 4,984,043 | 1/1991 | Vinal |
| 4,990,974 | 2/1991 | Vinal |
| 4,994,872 | 2/1991 | Nishizawa et al. |
| 5,119,152 | 6/1992 | Mizuno |

(List continued on next page.)

FOREIGN PATENT DOCUMENTS 0070744   1/1983   European Pat. Off.

(List continued on next page.)

OTHER PUBLICATIONS

*Characteristics of P-Channel MOS Field Effect Transistors with Ion-Implanted Channels*, Hswe, M. et al., Solid-State Electronics, vol. 15, pp. 1237-1243, 1972.

(List continued on next page.)

Primary Examiner—Sara W. Crane
Assistant Examiner—Courtney A. Bowers
Attorney, Agent, or Firm—Bell, Seltzer, Park & Gibson

[57] ABSTRACT

A high saturation current, low leakage, Fermi threshold field effect transistor includes a predetermined minimum doping concentration of the source and drain facing the channel to maximize the saturation current of the transistor. Source and drain doping gradient regions between the source/drain and the channel, respectively, of thickness greater than 300 Å are also provided. The threshold voltage of the Fermi-FET may also be lowered from twice the Fermi potential of the substrate, while still maintaining zero static electric field in the channel perpendicular to the substrate, by increasing the doping concentration of the channel from that which produces a threshold voltage of twice the Fermi potential. By maintaining a predetermined channel depth, preferably about 600 Å, the saturation current and threshold voltage may be independently varied by increasing the source/drain doping concentration facing the channel and by increasing the excess carrier concentration in the channel, respectively. A Fermi-FET having a gate insulator thickness of less than 120 Å, and a channel length of less than about 1 μm can thereby provide a P-channel saturation current of at least 4 amperes per centimeter of channel width and an N-channel saturation current of at least 7 amperes per centimeter of channel width, with a leakage current of less than 10 picoamperes per micron of channel length using power supplies of between 0 and 5 volts.

36 Claims, 40 Drawing Sheets

U.S. PATENT DOCUMENTS

| | | |
|---|---|---|
| 5,151,759 | 9/1992 | Vinal . |
| 5,192,990 | 3/1993 | Stevens . |
| 5,194,923 | 3/1993 | Vinal . |
| 5,362,982 | 11/1994 | Hirase et al. ............ 257/336 |
| 5,367,186 | 11/1994 | Vinal et al. ............ 257/327 |
| 5,369,295 | 11/1994 | Vinal ............ 257/288 |
| 5,371,396 | 12/1994 | Vinal et al. ............ 257/412 |
| 5,374,836 | 12/1994 | Vinal et al. ............ 257/344 |

FOREIGN PATENT DOCUMENTS

| | | |
|---|---|---|
| 0073623 | 3/1983 | European Pat. Off. . |
| 0274278 | 7/1988 | European Pat. Off. . |
| 3138747 | 4/1983 | Germany . |
| 55-87481 | 7/1980 | Japan . |
| 55-87483 | 7/1980 | Japan . |
| 56-91473 | 7/1981 | Japan . |
| 57-10268 | 1/1982 | Japan . |
| 59-29460 | 2/1984 | Japan . |
| 61-53775 | 3/1986 | Japan . |
| 61-160975 | 7/1986 | Japan . |
| 62-248255 | 10/1987 | Japan . |
| 63-53975 | 3/1988 | Japan . |
| 1097139 | 4/1987 | U.S.S.R. . |

OTHER PUBLICATIONS

*The Junction MOS (JMOS) Transistors—A High Speed Transistor for VLSI,* Sun, E. et al., IEEE, pp. 791–794, 1980.

*Optimization of Sub–Micron P–Channel FET Structure,* Chiang, S. et al., IEEE, pp. 534–535, 1983.

*Gate Material Work Function Considerations for 0.5 Micron CMOS,* Hillenius, S. J. et al., IEEE, pp. 147–150, 1985.

*A Normally–Off Type Buried Channel MOSFET for VLSI Circuits,* Nishiuchi, K. et al., IEDM Technical Digest, 1979, pp. 26–29.

*Ultra–High Speed CMOS Circuits in Thin SIMOX Films,* A. Kamgar et al., IEDM vol. 89, pp. 829–832, 1989.

*Fabrication of CMOS on Ultrathin SOI Obtained by Epitaxial Lateral Overgrowth and Chemical–Mechanical Polishing,* G. Shahidi et al., IEDM vol. 90, pp. 587–590, 1990.

*Submicron MOSFET Structure for Minimizing Channel Hot–Electron Injection,* Takeda E. et al., 1981 Symposium on VLSI Technology, Hawaii (9/81), Dig. Tech. Papers pp. 22–23.

*A New Half–Micrometer P–Channel MOSFET with Efficient Punchthrough Stops,* Odanaka S., et al., IEEE Transactions on Electron Devices, vol. ED–33, No. 3, Mar., 1986, pp. 317–321.

*Depleted Implant MOSFET,* IBM Technical Disclosure Bulletin, vol. 32, No. 10B, Mar., 1990, pp. 235–249.

*High Performance Subhalf–Micrometer P–Channel Transistors for CMOS VLSI,* A. E. Schmitz et al.; IEDM 84, pp. 423–426.

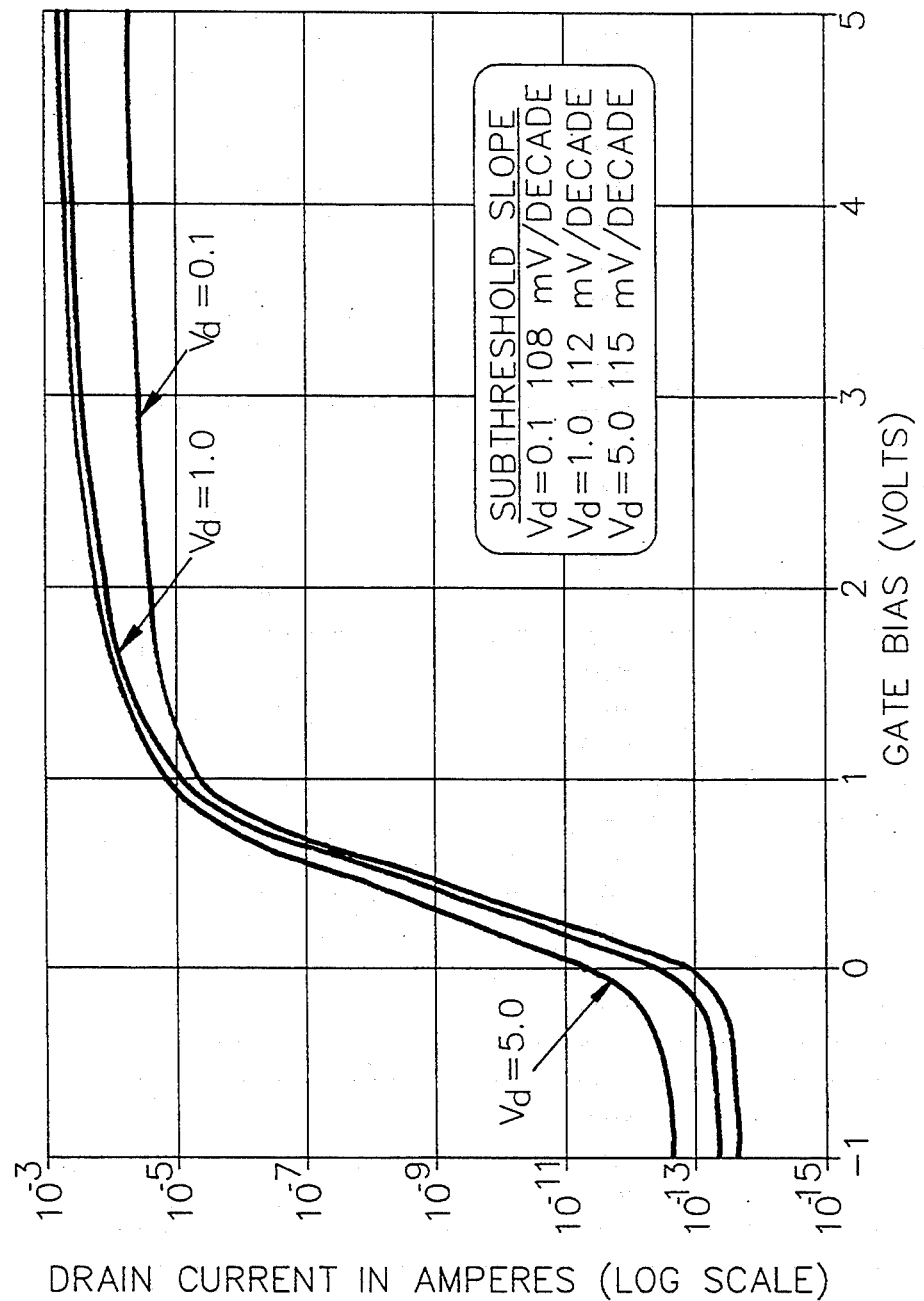

HIGH SATURATION CURRENT, LOW LEAKAGE CURRENT FERMI THRESHOLD FIELD EFFECT TRANSISTOR

CROSS-REFERENCE TO RELATED APPLICATIONS

This application is a continuation-in-part of application Ser. No. 08/037,636, filed Feb. 23, 1993, now U.S. Pat. No. 5,374,836, which is a Continuation-in-Part of application Ser. No. 07/977,689, filed Nov. 18, 1992, now U.S. Pat. No. 5,369,295, which is itself a Continuation of application Ser. No. 07/826,939, filed Jan. 28, 1992, now U.S. Pat. No. 5,194,923. The disclosures of all these prior applications are hereby incorporated herein by reference.

FIELD OF THE INVENTION

This invention relates to field effect transistor devices and more particularly to integrated circuit field effect transistors which are capable of producing high currents and low leakage currents.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

A high speed, high performance field effect transistor is described in U.S. Pat. Nos. 4,984,043 and 4,990,974, both by coinventor Albert W. Vinal, both entitled Fermi Threshold Field Effect Transistor and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects. Device performance is substantially independent of device dimensions.

Notwithstanding the vast improvement of the Fermi threshold FET compared to known FET devices, there was a need to lower the capacitance of the Fermi-FET device. Accordingly, in U.S. patent application Ser. No. 07/826,939, now U.S. Pat. No. 5,194,923, and application Ser. No. 07/977,689, both by coinventor Albert W. Vinal, and both entitled Fermi Threshold Field Effect Transistor With Reduced Gate and Diffusion Capacitance, a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid patent and patent application, the low capacitance Fermi-FET is preferably implemented using a Fermi-tub region having a predetermined depth and a conductivity type opposite the substrate conductivity type and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there is a continuing need to increase the saturation current per unit channel width which is produced by the Fermi-FET device. Higher current Fermi-FET devices will allow even greater integration density, and/or much higher speeds for logic devices, memory devices, microprocessors and other integrated circuit devices. However, saturation current must not be obtained at the expense of high leakage current. High leakage current dramatically increases the idle power consumption of the device. Finally, as portable and laptop computers proliferate, it is desirable to lower the threshold voltage of a Fermi-FET transistor, without adversely impacting operation thereof. Lower threshold voltage devices are better able to operate with 3 volt or lower power supplies, which are increasingly being used for portable and other energy conscious applications.

SUMMARY OF THE INVENTION

It is therefore an object of the invention to provide an improved Fermi threshold field effect transistor (Fermi-FET).

It is another object of the invention to provide a Fermi-FET which is capable of producing very high current per unit channel width.

It is yet another object of the invention to provide a Fermi-FET which is capable of producing very high current per unit channel width, with very low leakage current.

These and other objects are provided, according to the present invention by a Fermi-FET wherein the source and drain regions are doped the second conductivity type at a predetermined concentration facing the channel which is sufficiently high to maximize the saturation current of the Fermi-FET. It has been found that stored free charge at the source/drain-channel interface limits the amount of saturation current of the Fermi-FET. Accordingly, a predetermined minimum doping concentration of the source and drain facing the channel is provided, according to the present invention, to maximize the saturation current of the field effect transistor. Doping beyond this predetermined concentration will not significantly increase the saturation current of the field effect transistor. The predetermined concentration $N_{domin}$ of the source and/or drain which maximizes the saturation current is given by:

$$N_{domin} = \frac{1}{2e_s\phi_x q} \left[ \frac{e_s e_i L_o (V_{gmax} - V_t)}{Y_f (2e_s T_{ox} + \delta e_i)} \right]^2$$

Where:
$E_s$ = Permittivity of substrate
$\phi_x$ = Flat band voltage between source/drain diffusion doping and channel doping
$q = 1.6 \times 10^{-19}$ coulomb
$e_i$ = Permittivity of the gate insulator
$L_o$ = Channel length
$V_{gmax}$ = Maximum gate voltage anticipated
$V_t$ = Threshold voltage.
$Y_f$ = Depth of the Fermi-channel adjacent the source and drain regions
$T_{ox}$ = Insulator thickness
$\delta$ = Flow depth of excess carriers in the channel A source doping gradient region and preferably a drain doping gradient region are also provided between the source region and the channel and between the drain region and the channel, respectively. The doping gradient regions are doped at a doping gradient which decreases from the source/drain doping concentration adjacent the source/drain regions to the channel doping concentration adjacent the channel. The source/drain doping gradient regions preferably surround the source and drain regions respectively.

It has been found that a source and drain doping gradient region thickness of at least 300 Å is required in order to support the high saturation currents described above. Also, in order to supply the high saturation current described above, the gate insulating layer and gate electrodes preferably extend over the source/drain doping gradient regions. Finally, the substrate doping concentration is greater than the tub doping concentration, preferably by a factor of at least four, to minimize substrate doping concentration from effecting the criteria required for Tub depth and doping to achieve zero perpendicular field across the Fermi-channel.

A Fermi-FET according to the present invention provides high saturation currents without adversely increasing the leakage current of the Fermi-FET. For example, a Fermi-FET having a gate insulator thickness of less than 120 Ångstroms and a channel length of less than about 1 micron can provide a P-channel saturation current of at least 4 amperes per centimeter and an N-channel saturation current of at least 7 amperes per centimeter, with a leakage current of less than 10 picoamperes per micron using power supplies of between 0 and 5 volts. This performance cannot be achieved by a conventional MOSFET, of surface channel or buried channel type, wherein significant static electric field is produced in the channel perpendicular to the substrate surface.

According to another aspect of the invention, the threshold voltage of a Fermi-FET may be lowered from twice the Fermi potential of the substrate, while still maintaining zero static electric field in the channel perpendicular to the substrate, by maintaining a predetermined channel depth, preferably about 600 Ångstroms, and increasing the doping concentration of the channel to lower the threshold voltage to below twice the Fermi potential. The channel doping may be lowered to produce a desired threshold voltage according to the following relationship:

$$\Delta V_T = -q N_{ch} Y_f \left( \frac{Y_f}{2e_s} + \frac{T_{ox}}{e_i} \right)$$

Where:
$\Delta V_T$ = Change in threshold voltage from twice the Fermi potential of the substrate
$q = 1.6 \times 10^{-19}$ coulomb
$T_{ox}$ = Oxide insulator thickness
$N_{ch}$ = Impurity concentration in the channel
$Y_f$ = Depth of the Fermi-channel adjacent the source and drain regions
$e_s$ = Permittivity of substrate
$e_i$ = Permittivity of the gate insulator The channel concentration should be maintained at less than about $5 \times 10^{16}$ so as to prevent carrier mobility from dropping and thereby lowering saturation current.

The above described aspects of the present invention may be used in combination in order to obtain a Fermi-FET with independently controlled saturation current and threshold voltage. In particular, for a given channel depth, preferably on the order of 600 Ångstroms, the source/drain doping concentration may be varied to independently control the maximum saturation current of the device, while the channel doping concentration may be varied to independently control the threshold voltage of the device. Thus, independent control of saturation current and threshold voltage in a Fermi-FET may be obtained.

As described above, a high current Fermi-FET according to the present invention is capable of producing a drain saturation current of at least 4 amperes per centimeter of channel width (P-channel) and 7 amperes per centimeter of channel width (N-channel) at a leakage current of less than 10 picoamperes per micron of channel width for channel lengths less than 1 micron and gate insulating layer thicknesses of less than about 120 Ångstroms. These values cannot be achieved in a conventional MOSFET which includes electric fields which are oriented perpendicular to the channel carrier flow direction. A detailed comparison of a Fermi-FET and a conventional MOSFET has revealed that saturation velocity is a vector quantity which is governed by the electric field parallel to the substrate, in the carrier flow direction, and also the electric field which is perpendicular to the substrate and perpendicular to the carrier flow direction. Since the Fermi-FET eliminates the vertical (perpendicular) component, saturation current is maximized compared to a conventional MOSFET. In a conventional MOSFET, saturation current can be increased, but at the expense of unacceptably high leakage current. Only the Fermi-FET can produce a Fermi-FET transistor with high saturation current and acceptably low leakage current.

The present invention may also be used in combination with the source injector regions, gate sidewall spacer and bottom leakage control region of parent application Ser. No. 08/037,636. As described therein, the injector region is of the same conductivity type as the Fermi-tub region and the source region, and is adjacent the source region and facing the drain region. The injector region is preferably doped at a doping level which is intermediate to the relatively low doping concentration of the Fermi-tub and the relatively high doping concentration of the source. The injector region controls the depth of the carriers injected into the channel and enhances injection of carriers in the channel, at a predetermined depth below the gate. The gate sidewall extends from adjacent the source injector region to adjacent the gate electrode of the Fermi-FET. The gate sidewall spacer preferably comprises an insulator having permittivity which is greater than the permittivity of the gate insulating layer. For example, in typical field effect transistor devices, where the gate insulator is silicon dioxide, the gate sidewall spacer is preferably silicon nitride. The gate sidewall spacer also preferably extends from adjacent the drain injector region to adjacent the gate electrode. The gate sidewall spacer typically surrounds the gate electrode on the sidewall thereof. The gate sidewall spacer lowers the pinch-off voltage of the device and increases the saturation current of the device.

The bottom leakage control region is doped at a high concentration relative to the substrate and extends across the substrate from between an extension of the facing ends of the source and drain regions or source and drain injector regions, and extends to both sides of the Fermi-tub/substrate junction.

BRIEF DESCRIPTION OF THE DRAWINGS

FIGS. 6A and 6B graphically illustrate simulated bottom current and subthreshold leakage behavior for N-channel and P-channel high current Fermi-FETs respectively.

DETAILED DESCRIPTION OF PREFERRED EMBODIMENTS

Figure 1:
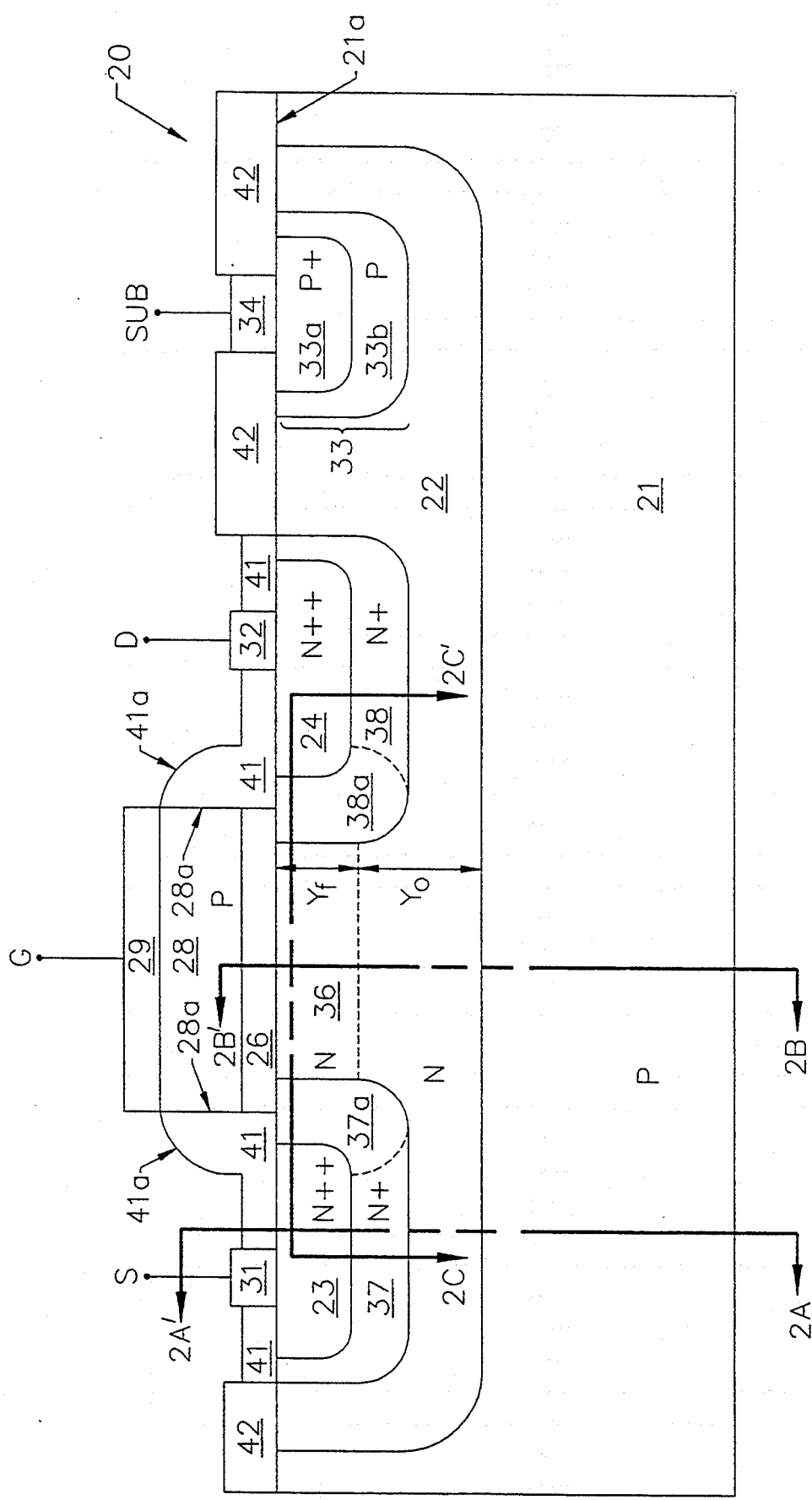
FIG. 1 illustrates a cross-sectional view of an N-channel high current Fermi-FET.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Before describing the high saturation current, low leakage current Fermi threshold field effect transistor of the present invention, the Fermi threshold field effect transistor with reduced gate and diffusion capacitance of application Ser. Nos. 7/826,939 and 07/977,689 (also referenced as the "low capacitance Fermi-FET" or the "Tub-FET") will first be described. A more complete description may be found in these applications, the disclosures of which are hereby incorporated herein by reference.

After describing the low capacitance Fermi-FET, a Fermi-FET including the injector regions, gate sidewall spacer regions, and bottom leakage control region of application Ser. No. 08/037,636 will then be described. A more complete description may be found in this applications the disclosure of which is hereby incorporated herein by reference.

Then, a detailed description of the present invention will be provided. Control of saturation current by controlling doping of the source/drain diffusions facing the channel will be described. Control of threshold voltage will then be described. Finally, a theoretical comparison between a conventional MOSFET and a Fermi-FET will be provided, and it will be shown that a conventional MOSFET cannot produce the desired combination of high saturation current and low leakage current of the Fermi-FET.

Fermi-FET with Reduced Gate and Diffusion Capacitance

The following summarizes the low capacitance Fermi-FET including the Fermi-tub. Additional details may be found in application Ser. Nos. 07/826,939 and 07/977,689.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta e_s} + \frac{T_{ox}}{e_i}} \quad (1)$$

Where $Y_f$ is the depth of the conduction channel called the Fermi channel, $e_s$ is the permittivity of the substrate, and $\beta$ is the factor that determines the average depth of the charge flowing within the Fermi channel below the surface. $\beta$ depends on the depth dependant profile of carriers injected from the source into the channel. For the low capacitance Fermi-FET, $\beta \approx 2$. $T_{ox}$ is the thickness of the gate oxide layer and $e_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_o$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependant on the difference between [the sum of the depth of the Fermi-tub and the depletion depth $Y_o$ in the substrate] and the depth of the diffusions $X_d$. The diffusion depth is preferably the same depth as the Fermi channel. For deeper configurations, diffusion depth is less than the depth of the Fermi-tub, $Y_{Tub}$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_o$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, to achieve a value twice the Fermi potential of the substrate adjacent the gate insulating layer. The sum of the voltages between the substrate contact and the substrate and between the polysilicon gate and the gate electrode are essentially zero.

When the substrate is doped at a doping density $N_s$, has an intrinsic carrier concentration $N_i$ at temperature T degrees Kelvin and a permittivity $e_s$, and the field effect transistor includes a substrate contact for electrically contacting the substrate, and the channel extends a first predetermined depth $Y_f$ from the surface of the substrate and the Fermi-tub region extends a second predetermined depth $Y_o$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth ($Y_f$) is equal to:

$$Y_f = \sqrt{\frac{2e_s}{qN_s\alpha} \frac{KT}{q} \ln\left(\frac{N_p}{N_s}\right)}, \quad (2)$$

where q is $1.6 \times 10^{-19}$ coulombs and K is $1.38 \times 10^{-23}$ Joules/°Kelvin. The second predetermined depth ($Y_o$) is equal to:

$$Y_o = \sqrt{\frac{2e_s\phi_s}{qN_s\alpha(\alpha + 1)}}, \quad (3)$$

where $\phi_s$ is equal to $2\phi_f + KT/q \ln\alpha$, and $\phi_f$ is the Fermi potential of the semiconductor substrate.

High Current Fermi-FET. Structure

Referring now to FIG. 1, an N-channel high current Fermi-FET according to application Ser. No. 08/037,636 is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of application Ser. Nos. 07/977,689 and 07/826,939. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_o$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, according to application Ser. No. 08/037,636, a source injector region 37a of second conductivity type, here N-type, is provided adjacent the source region 23 and facing the drain region. As will be described below, the source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as N+ and source and drain regions 23, 24 are designated as N++. A unijunction transistor is thereby formed.

The high current Fermi-FET of application Ser. No. 08/037,636 provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize sub-threshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.05-0.15 $\mu$m. The doping concentration of the source and drain regions 23 and 24 respectively, is typically 1E19 or greater. The depth $(Y_f+Y_o)$ of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Design of 0.8 $\mu$m High Current Fermi-FET

Figure 2A:
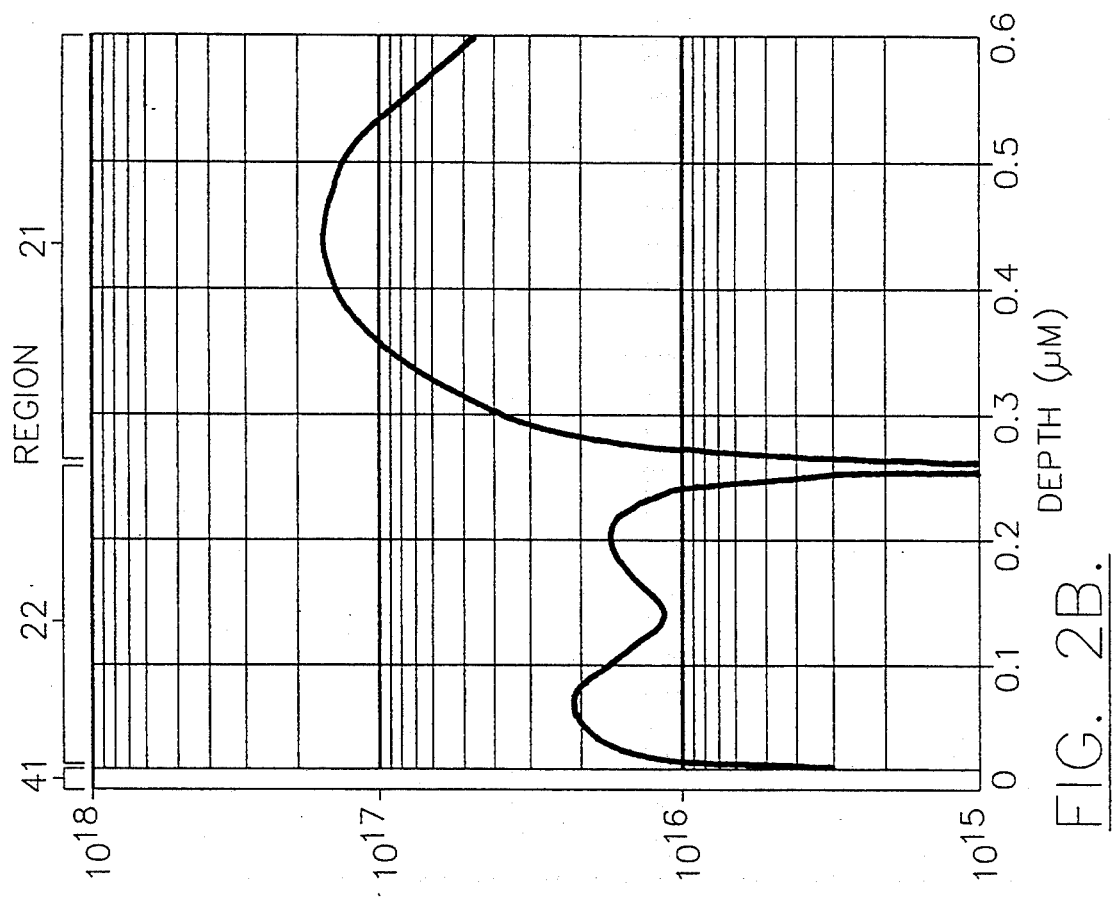
FIGS. 2A–2C graphically illustrate preferred doping profiles and geometries for the high current Fermi-FET of FIG. 1 having a 0.8 μm channel.
Figure 2B:
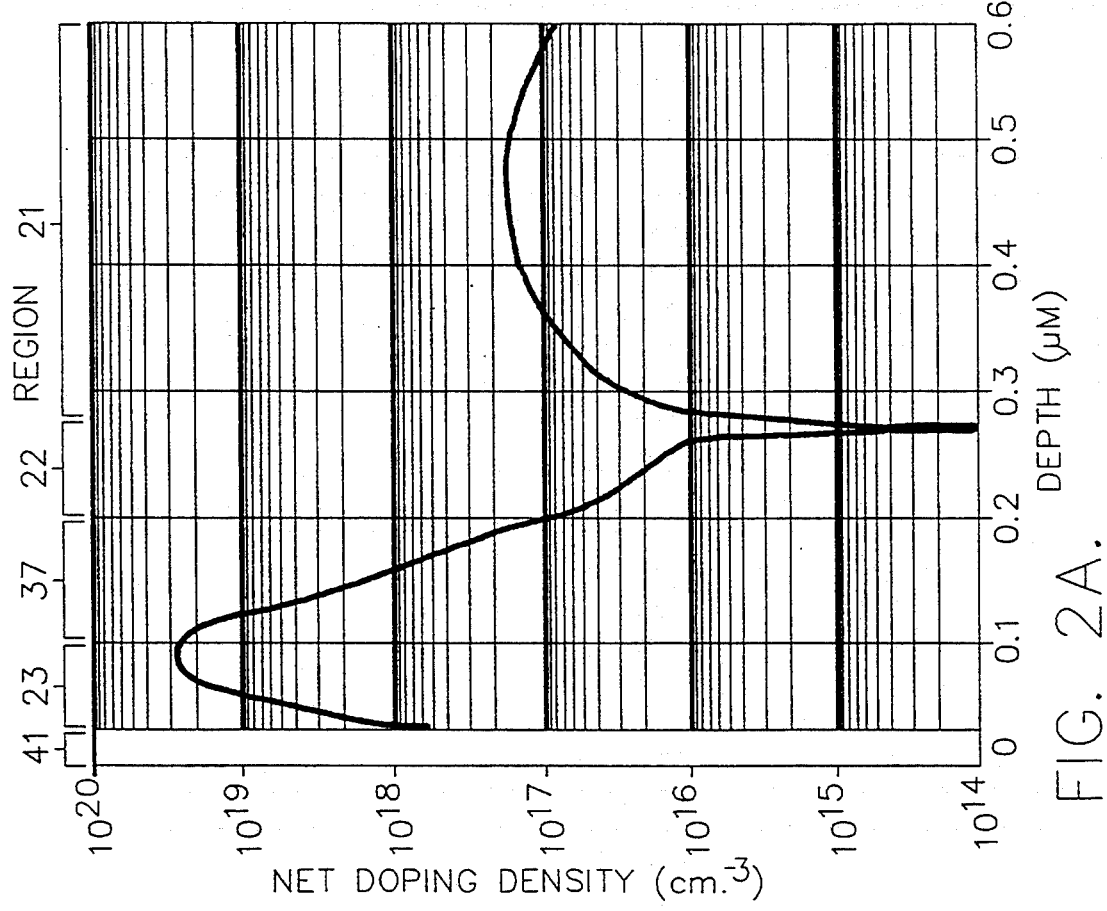
Figure 2C:
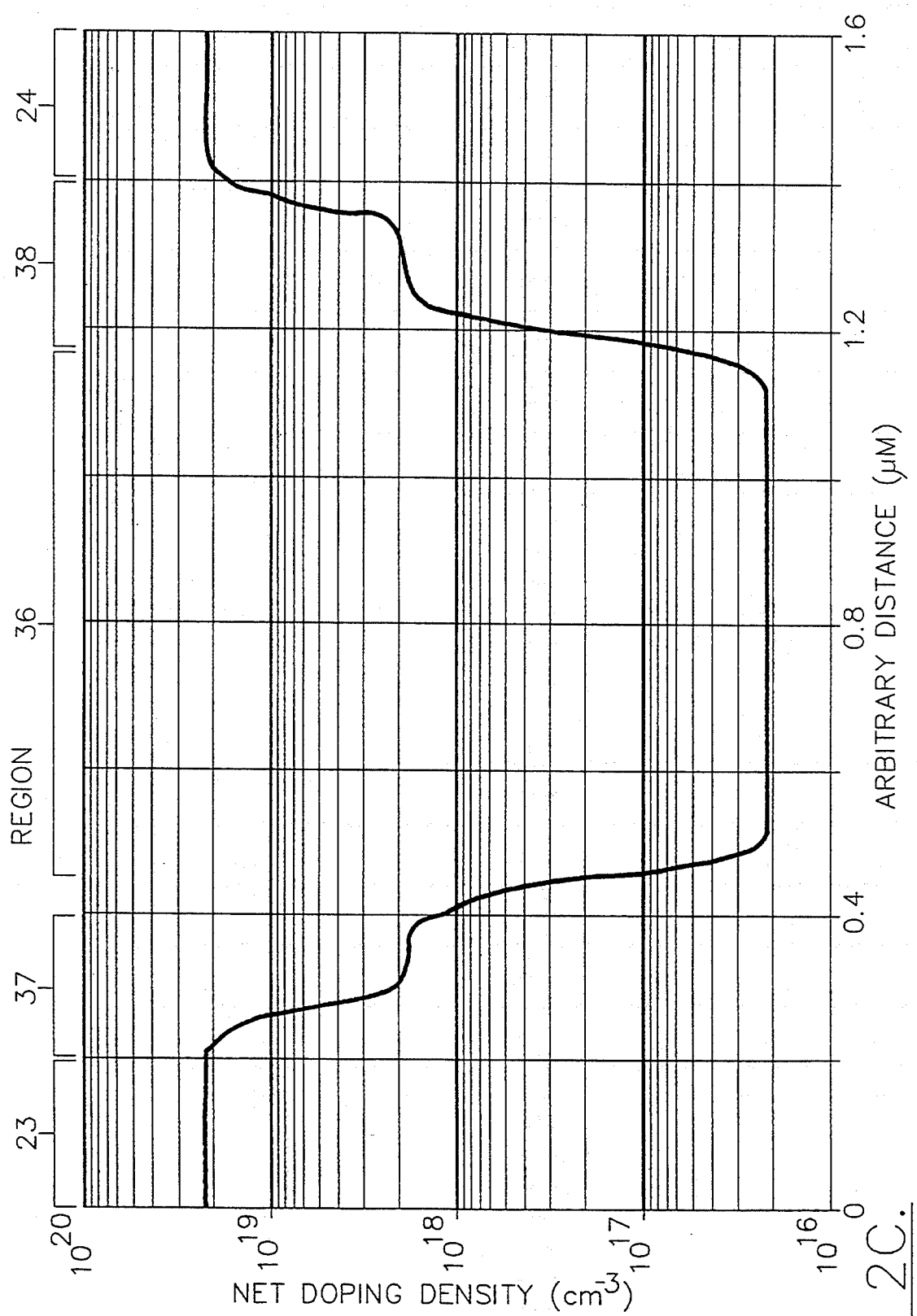

Referring now to FIGS. 2A-2C, preferred doping profiles and geometries for designing a 0.8 $\mu$m channel high current Fermi-FET as illustrated in FIG. 1 will now be described. It will be understood by those having skill in the art that both N and P channel FETs are fabricated in a similar fashion. FIGS. 2A-2C are simulation results which graphically illustrate N-channel high current Fermi-FET doping profiles to produce a 0.8 $\mu$m channel length device leading to the drain current properties illustrated in FIGS. 5B and 5C. It is well known to those having skill in the art how to achieve these doping profiles, using many well known techniques.

In the examples of FIGS. 2A-2C, the P-type doping concentration of the polysilicon gate electrode 28 is 2E19 for either P- or N-channel FETs. The SiO$_2$ gate insulating layer 26 is 140 Å thick. The thickness of the polysilicon gate electrode 28 is 3000 Å. The height of the gate sidewall spacer 41 is also 3000 Å, and the gate sidewall spacer 41 is fabricated of silicon nitride. The width of the source injector tub region portion 37a facing the drain is about 0.1 $\mu$m and the gate insulating layer 26 overlaps this region by about 0.05 $\mu$m.

Referring now to FIG. 2A, a vertical doping profile along the line 2A-2A' of FIG. 1, perpendicular to the face 21a and centered about the source 23 is described. The region to which the profile applies is also labeled at the top of the horizontal axis of FIG. 2A. As shown, the gate sidewall spacer region 41 has a thickness of about 140 Å0 and the source region 23 has a depth of about 2000 Å from the face 21a. Source injector tub region 37 has a depth of about 2000 Å from face 21a and Fermi-tub 22 has a depth $(Y_f+Y_o)$ of 2200 Å from the face 21a. The thickness of substrate 21 is about 1 $\mu$m. The source injector tub 37 doping concentration is about 2E18 and the source region 23 doping is about 2.5E19.

FIG. 2B is a doping profile taken along line 2B-2B' in FIG. 1. As shown in FIG. 2B, the Fermi-tub 22 has been implanted using a double implantation process which produces a double hump. However, it will be understood by those having skill in the art that multiple implants or other techniques may be used to produce a more uniform doping profile for the Fermi-tub if desired. The Fermi-tub 22 depth is shown to be about 2200 Å with an average concentration in the flat region of 1.8E16. The effective humpback substrate doping concentration is about 1E17.

FIG. 2C illustrates a doping profile along lines 2C-2C' of FIG. 1. In other words, it is a doping profile from the middle of source region 23 through source injector region 37a through channel 36 and through drain injector region 38a and to the middle of drain 24. These regions are denoted in the FIG. 2C as well.

Operation of the Injector and Gate Sidewall Spacer Regions

Figure 3:
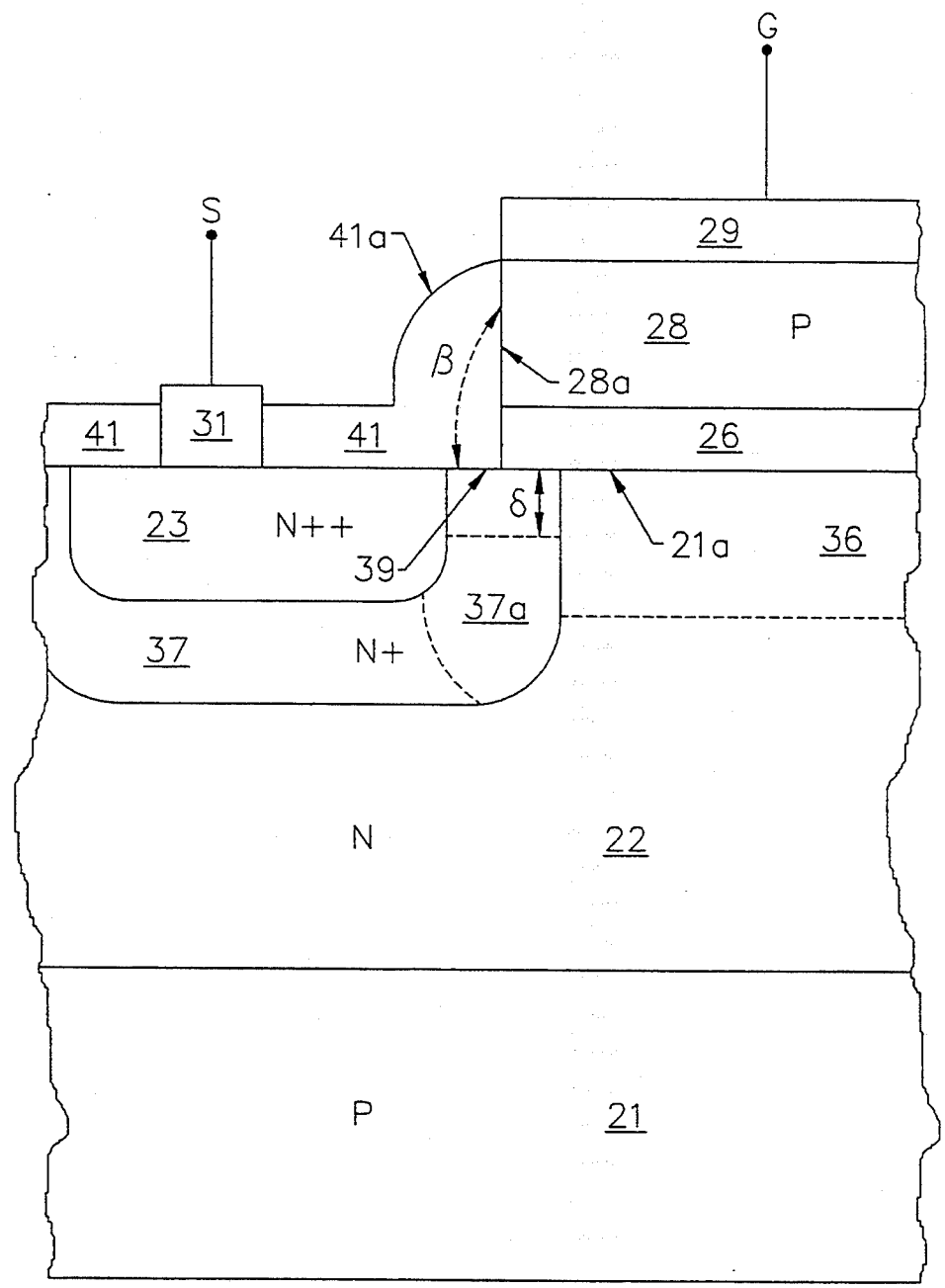
FIG. 3 illustrates an enlarged cross-sectional view of a portion of the high current Fermi-FET of FIG. 1.

Referring now to FIG. 3, an enlarged cross section of the area between source 23 and polysilicon gate electrode 28 is illustrated, in order to explain the operation of source injector region 37a and gate sidewall spacer region 41. When gate voltage exceeds source voltage, an electric field $E_{ii}$ terminates at interface 39 between the injector region 37a and the spacer 41. This field $E_{ii}$ is produced by the potential difference between the polysilicon gate electrode 28 and the surface of the injector region 37a at interface 39. This electric field creates charge accumulation within depth $\delta$ at the surface of the injector 37a, as illustrated in FIG. 3. From boundary conditions at the injector-insulator interface 39 and use of the divergence theorem, the following conditions prevail:

$$e_s E_s = e_{ii} E_{iin} \quad (4)$$

where $e_s$ is the permittivity of the substrate 21, $E_s$ is the electric field in injector 37a at interface 39, $e_{ii}$ is the permittivity of the spacer region 41 and $E_{iin}$ is the electric field in spacer region 41 at the interface 39.

Therefore, the electric field at the surface of the silicon $E_s$ is expressed in terms of the different permittivities at the interface and the electric field in the injector insulator, $E_{iin}$:

$$E_s = \frac{e_{ii}}{e_s} E_{iin} \tag{5}$$

When the source 23 is at ground potential and the polysilicon gate electrode 28 is at gate voltage $V_g$ above ground (N-channel), the injector insulator field $E_{iin}$ is expressed as the difference between gate and injector surface potential $\phi_s$ divided by the effective spacer region insulator thickness $\beta T_{in}$, where $V_t$ is the threshold voltage:

$$E_{iin} = \frac{(V_g - V_t) - \phi_s}{\beta T_{iin}} \tag{6}$$

Fringe field factor $\beta$ is generally greater than one and is due to the length of the fringe field path from the sidewall 28a of the polysilicon gate electrode 28 and the interface 39, as illustrated in FIG. 3. For long channel devices $\beta$ approaches 1.0. For short channel devices $\beta > 1.0$. The difference is due to the depth of the charge accumulation layer in the polysilicon gate electrode layer 28 above the insulator interface. For short channel devices this depth increases tending to increase fringe factor $\beta$.

The gate sidewall spacer 41 may be the same material as the gate insulating layer 26. However in general the permittivity $e_{ii}$ of the sidewall spacer 41 should be higher than the permittivity $e_{gi}$ of the gate insulating layer 26. Preferably the ratio $e_{ii}/e_{gi}$ should be at least equal to fringe factor $\beta$. If $\beta = 1$, the increased permittivity acts to lower sub-threshold leakage current. A good choice of materials is silicon dioxide (SiO$_2$) for the gate insulator 26 and silicon nitride (Si$_3$N$_4$) for the gate sidewall spacer 41.

Based on Equations (5) and (6) the surface electric field $E_s$ is:

$$E_s = \frac{e_{ii}}{e_s}\left(\frac{(V_g - V_t) - \phi_s}{\beta T_{in}}\right) = \frac{q}{e_s}\int_O^\delta N_{ac}(y)dy \tag{7}$$

where $\delta$ is the depth of the accumulation region, q is the electron charge, and $N_{ac}(y)$ is the depth dependent concentration of the accumulation charge at the surface of the injector.

Since Fermi-FET conduction depends on accumulation rather than inversion, a similar expression can be written for the equivalent total accumulation of majority carriers under the gate electrode with low drain voltage. The actual flow depth $\delta$ of this charge is controlled by the injection profile. The expression is:

$$E_{si} = \frac{e_{ii}}{e_s}\left(\frac{(V_g - V_t) - \phi_s}{T_{gin}}\right) = \frac{q}{e_s}\int_O^\delta N_{gac}(y)dy \tag{8}$$

A fundamental relationship between surface potential $\phi_s$ and surface field $E_s$ will now be derived. The total charge in the channel region 36 when drain voltage is close to zero, is:

$$Q = ZL_oq \int_O^\delta N_{ch}(y)dy \tag{9}$$

Where $N_{ch}(y)$ is the volume density of channel charge measured in the vertical direction, and $\delta$ is the depth of flow charge at the source end of the channel. Using the divergence theorem, the vertical electrical field intensity $E_s$ in silicon at the insulator-silicon interface 39 at the source end of the channel is:

$$E_s = \frac{q}{e_s}\int_0^\delta N_{ch}(y)dy \tag{10}$$

Comparing Equations (9) and (10), surface field $E_s$ is independent of charge distribution within the depth direction of the channel and only depends on total charge per unit gate area $Q^*$. Thus:

$$E_s = \frac{Q}{ZL_oe_s} = \frac{Q^*}{e_s} \tag{11}$$

The surface potential at the source end of the channel due to this same channel charge distribution is now determined. Using Poisson's equation, surface potential $\phi_s$ under the injector insulator at the source end of the channel is:

$$\phi_s = \frac{q}{e_s}\int_0^\delta \int_0^y N_{ch}(y)dydy \tag{12}$$

It will be shown subsequently that gate induced injection of excess charge into a Fermi channel region at the source-channel interface is quite uniform in flow depth depending on the character of the source injector region 37a. Under these circumstances it is reasonable to assume $N_{ch}(y) = N_{do}$ within flow depth $\delta$. For this condition Equation (12) reduces to:

$$\phi_s = \frac{\delta(q\delta N_{do})}{2e_s} \tag{13}$$

Therefore, from Equation (9), the condition, $N_{ch}(y) = N_{do}$, leads to the following fundamental relationship between surface potential $\phi_s$ and surface field $E_s$:

$$\phi_s = \frac{\delta}{2} E_s \tag{14}$$

Stated in words, surface potential near the source end of the channel is the product of half the flow channel depth $\delta$ and surface field $E_s$.

Equation (14) is substituted into Equation (8) and solved for surface field $E_s$ to obtain:

$$\frac{V_g - V_t}{e_s\left(\frac{T_{gin}}{e_{gin}} + \frac{\delta}{2e_s}\right)} = \frac{q}{e_s}\int_0^\delta N_{ac}(y)dy \tag{15}$$

Factor $\delta$ in (15) corresponds to effective flow depth of carriers in the Tub-FET channel, as shown in FIG. 3. Since effective gate capacitance $C_g^*$, F/cm$^2$ is given by:

$$C_g^* = \cfrac{1}{\left(\cfrac{T_{gin}}{e_{gin}} + \cfrac{\delta}{2e_s}\right)} \quad (16)$$

Equation (15) can be used to predict drain saturation current and its dependence on structure:

$$I_{sat} = ZVq \int_0^\delta N_{gac}(y)dy = C_g^* ZV(V_g - V_t) \quad (17)$$

Stated in words, saturation current depends on the product of effective gate capacitance $C_g^*$, channel width Z, carrier velocity V, and gate drive voltage $V_g - V_t$. Channel length $L_o$ does not appear directly in Equation (17). To reveal the role of channel length, an expression for carrier velocity V in Equation (17) is developed. Equation (17) is rewritten in terms of the product of carrier mobility $\mu$ and lateral field $E_l$:

$$I_{satn} = C_g^* ZV(V_g - V_t) = C_g^* Z\mu_n E_l(V_g - V_t) \quad (18)$$

For electrons:

$$\mu_n = \cfrac{\mu_{no}}{\sqrt{1 + \left(\cfrac{E_1}{E_c}\right)^2}} \quad (19a)$$

$$E_1 = \cfrac{V_p}{L} = \cfrac{V_g - V_t}{2L_o} \quad (19b)$$

$$E_c = \cfrac{V_{sat}}{\mu_{no}} \quad (19c)$$

$$\cfrac{E_1}{E_c} = \cfrac{(V_g - V_t)\mu_{no}}{2L_o V_{sat}} \quad (19d)$$

Substituting Equations (19a)–(19d) into Equation (17) a fundamental solution for drain saturation current is obtained:

$$I_{satn} = \cfrac{C_g^* Z(V_g - V_t)^2 \mu_{no}}{2L_o \sqrt{1 + \left(\cfrac{(V_g - V_t)\mu_{no}}{2L_o V_{sat}}\right)^2}} \quad (20)$$

where $C_g^*$ is given by Equation (16).

A similar expression for a P-Channel device is given by:

$$I_{satp} = \cfrac{C_g^* Z(V_g - V_t)^2 \mu_{po}}{2L_o \left[1 + \cfrac{(V_g - V_t)\mu_{po}}{2L_o V_{sat}}\right]} \quad (21)$$

For short N-channel devices and large gate drive, saturation current reduces to a simple equation independent of channel length and carrier mobility:

$$I_{sat} = C_g^* ZV_{sat}(V_g - V_t) \quad (22)$$

Accordingly, channel length $L_o$ below about one micron, plays only a minor role in determining drain saturation current of the Fermi-FET. The most fundamental control of saturation current is injector and insulator thickness, their relative permittivities, and effective flow depth $\delta$. The injector tub doping concentration and depth are chosen such that flow depth $\delta$ is adjusted to be greater than 200 Å.

Figure 4A:
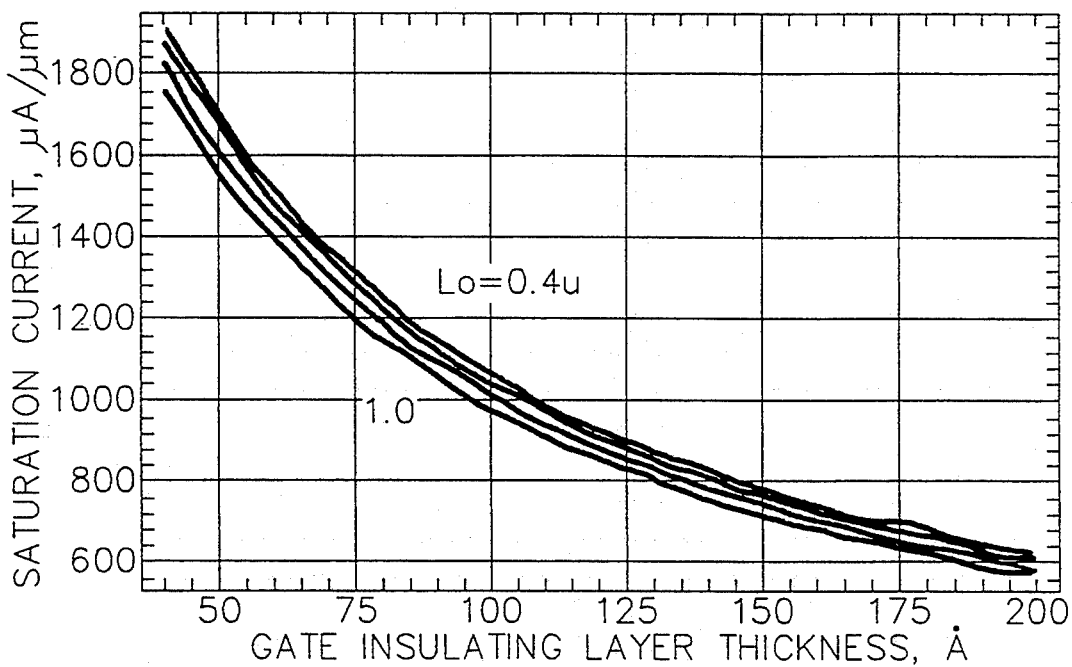
FIGS. 4A and 4B graphically illustrate simulated drain saturation current for N-channel and P-channel Fermi-FETs respectively, as a function of channel length and gate insulating layer thickness.
Figure 4B:
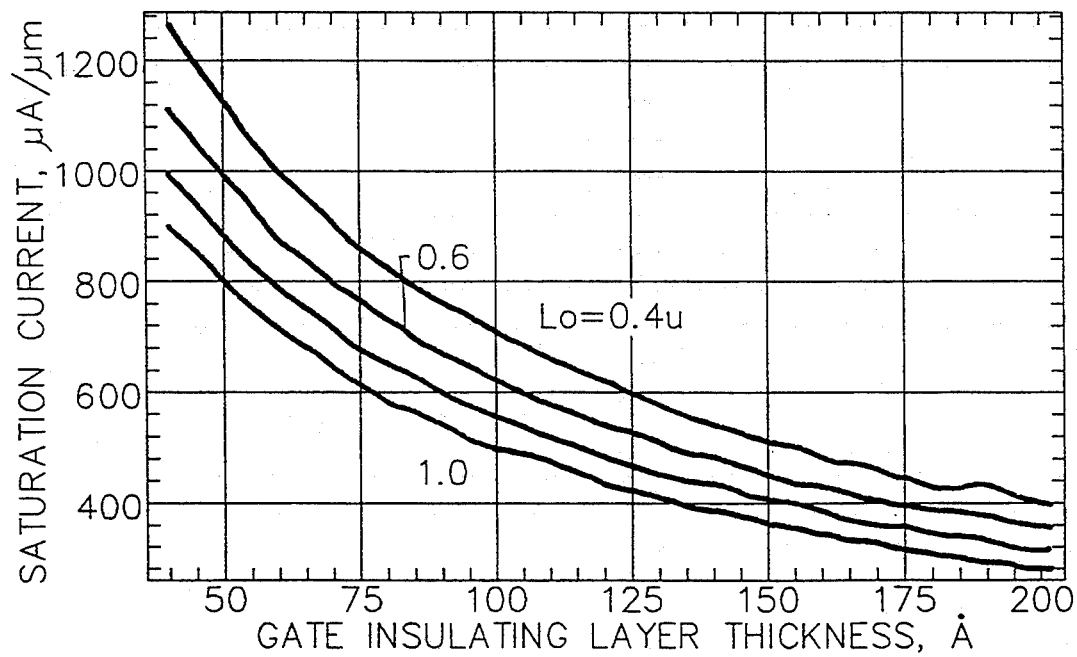
Figure 4C:
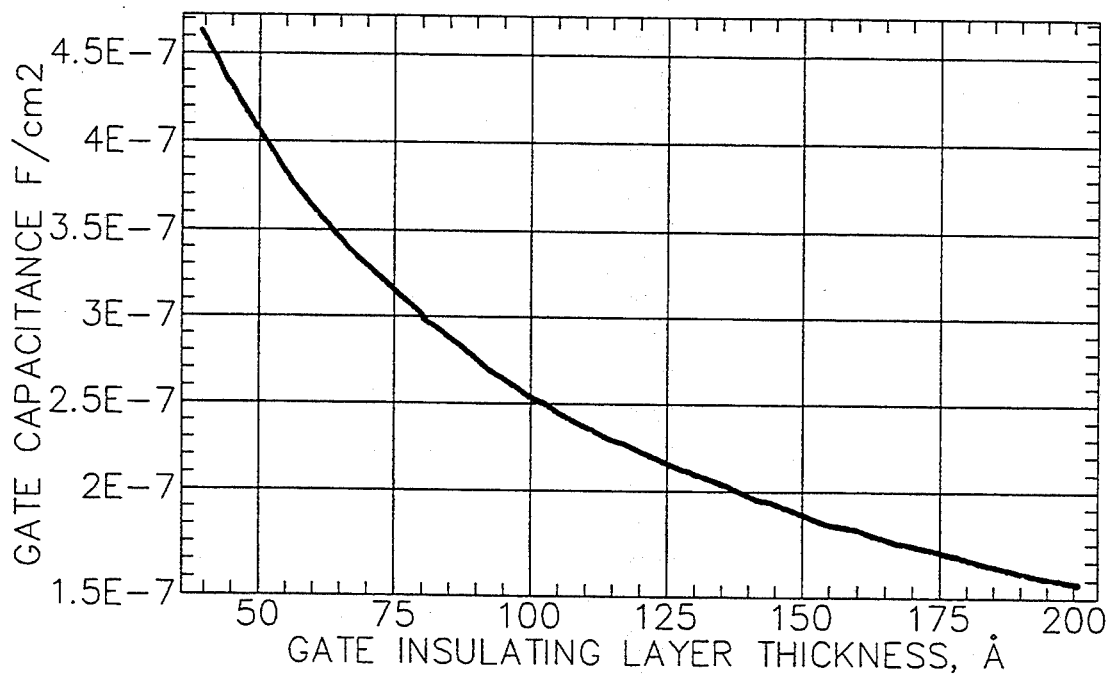
FIG. 4C graphically illustrates simulated gate capacitance versus gate insulating layer thickness for a Fermi-FET.

FIGS. 4A and 4B are plots of simulated drain saturation current for N and P-channel Tub-FET's as a function of channel length $L_o$ and gate insulating layer thickness $T_{gin}$. Note the relative insensitivity to N-channel length compared to insulator thickness. P-channel devices are more sensitive to channel length due to lateral field effects on hole velocity. FIG. 4C is a plot of simulated gate capacitance versus gate insulating layer thickness for $\delta = 200$ Å.

When the following equation is satisfied in the design of a Tub-FET, the lowest pinch-off voltage with maximum saturation current and the least sub-threshold bottom current are obtained for a given injector tub depth. This equation relates the permittivity of the injector 37, spacer 41 and gate insulator 26:

$$\cfrac{e_{ii}}{e_s}\left(\cfrac{(V_g - V_t)}{\beta T_{iin}}\right) \geq \cfrac{e_{gi}}{e_s}\left(\cfrac{(V_g - V_t)}{T_{gin}}\right) \quad (23)$$

From Equation (18) the following is also one of the Tub-FET design considerations:

$$\cfrac{e_{ii}}{e_{gi}} \geq \cfrac{\beta T_{iin}}{T_{gin}} \quad (24)$$

If $T_{iin} = T_{gin}$ then $$\cfrac{e_{ii}}{e_{gi}} \geq \beta \quad (25)$$

For practical high current Fermi-FET designs, one can use silicon nitride ($Si_3N_4$) for the gate sidewall spacer 41 and silicon dioxide ($SiO_2$) for the gate insulator 26. The permittivity of silicon nitride is 7E-13 F/cm, and silicon dioxide is 3.45E-13 F/cm. The ratio is greater than $\beta = 1.5$. It will be shown subsequently that very high drive current Fermi-FET's, 1.6 ma/micron N-channel and 0.8 ma/micron P-channel devices, preferably use a 100 Å silicon nitride gate insulator. Unlike silicon dioxide insulators, silicon nitride insulators have high field strength, 1E7 V/cm, and therefore can be thin while maintaining high gate breakdown voltage while improving insulation integrity with time. For Fermi-FET devices that use a nitride gate insulator, the spacer and injector insulator can be nitride, but an injector and side-wall insulator material with twice the permittivity is preferred. It will also be understood by those having skill in the art that gate sidewall spacer 41 need not extend directly onto face 21a, but that a thin insulating layer, of a material other than that of the sidewall spacer 41, may be formed at interface 39 between injector 37 and sidewall spacer 41.

Figure 5A:
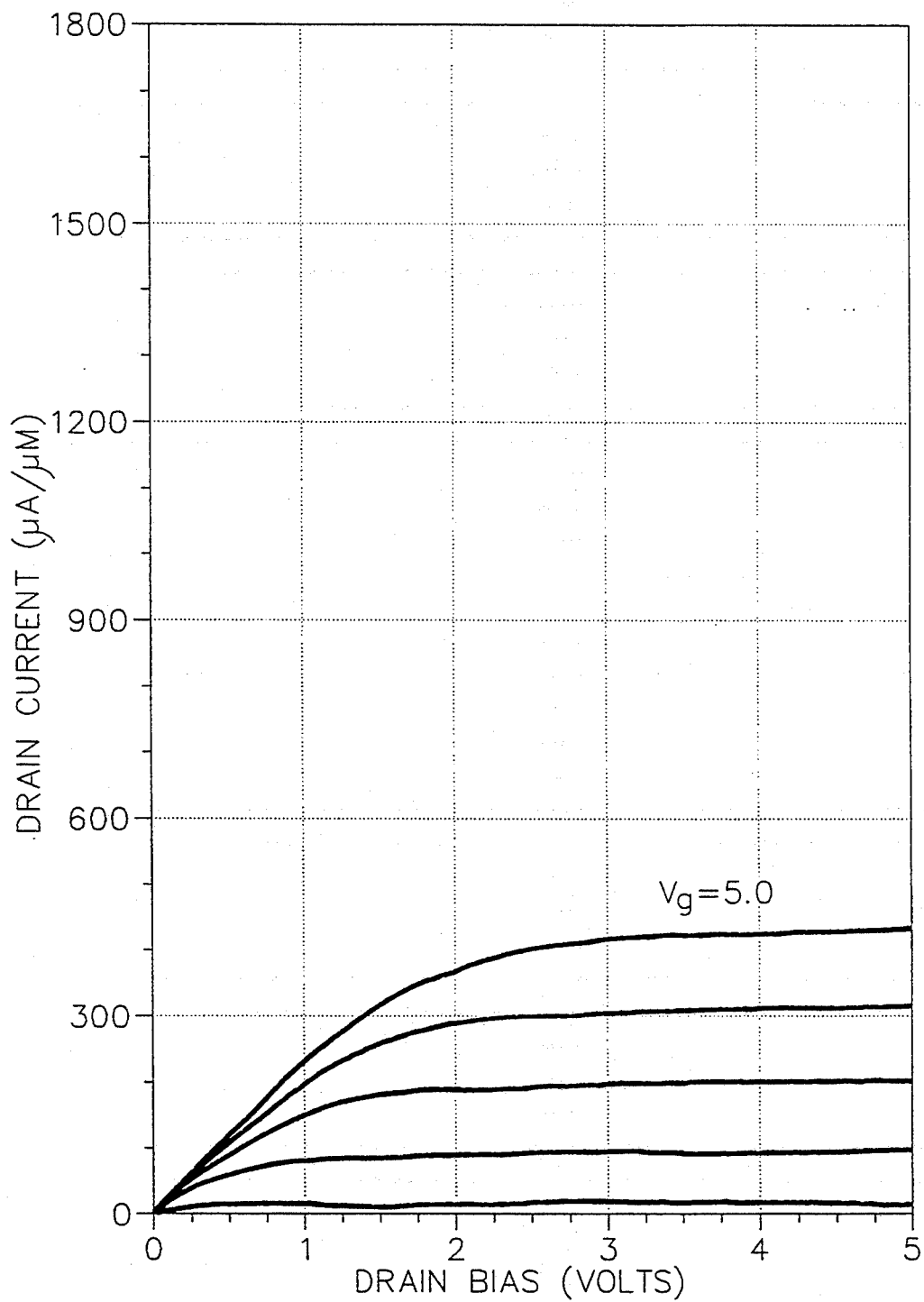
FIG. 5A graphically illustrates simulated transistor drain current characteristics of a conventional 0.8 μm N-channel MOSFET.
Figure 5B:
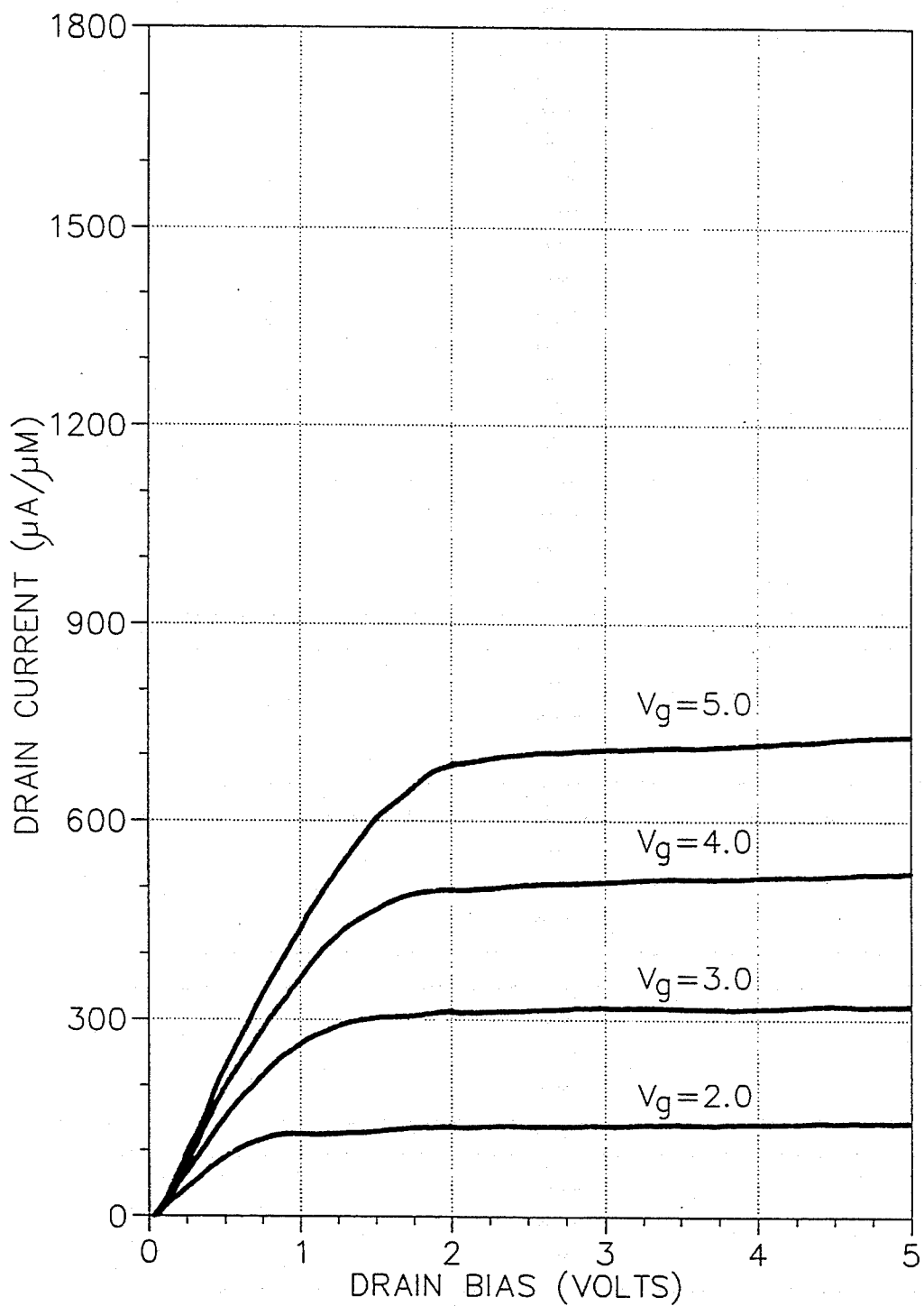
FIGS. 5B and 5C graphically illustrate simulated transistor drain current characteristics of a 0.8 μm N-channel high current Fermi-FET.
Figure 5C:
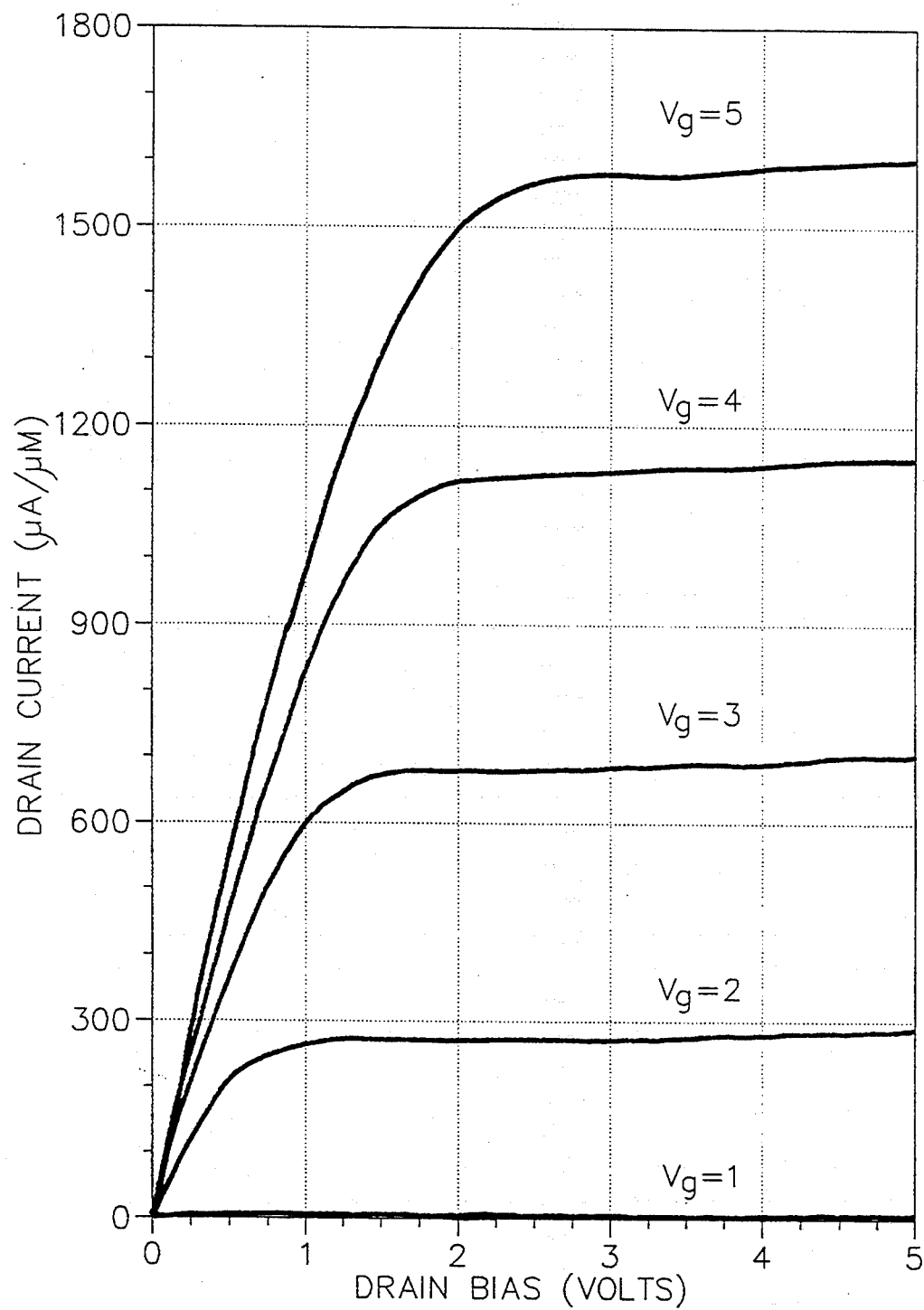

FIGS. 5B and FIG. 5C are simulations of the drain current performance of 0.8 micron N-Channel high current Fermi-FET devices. FIG. 5A is a similar simulation for a state of the art 0.8 micron MOS N-Channel device. FIG. 5A depicts 5 Volt MOS technology with a 150 Å $SiO_2$ gate insulator. FIG. 5B is a simulation of high current Fermi-FET performance with a 140 Å $SiO_2$ gate insulator. FIG. 5C is a simulation of high current Fermi-FET performed with a 100 Å silicon nitride gate insulator. In both cases, the drain current and pinch-off properties of high current Fermi-FET devices are far superior to MOS or buried channel technology. Similar dramatic improvement occurs for P-channel high current Fermi-FET devices compared to MOS or buried channel technology. P-channel saturation current is typically half N-channel saturation current, and pinch-off voltage is about twice the N-channel value.

Figure 6B:
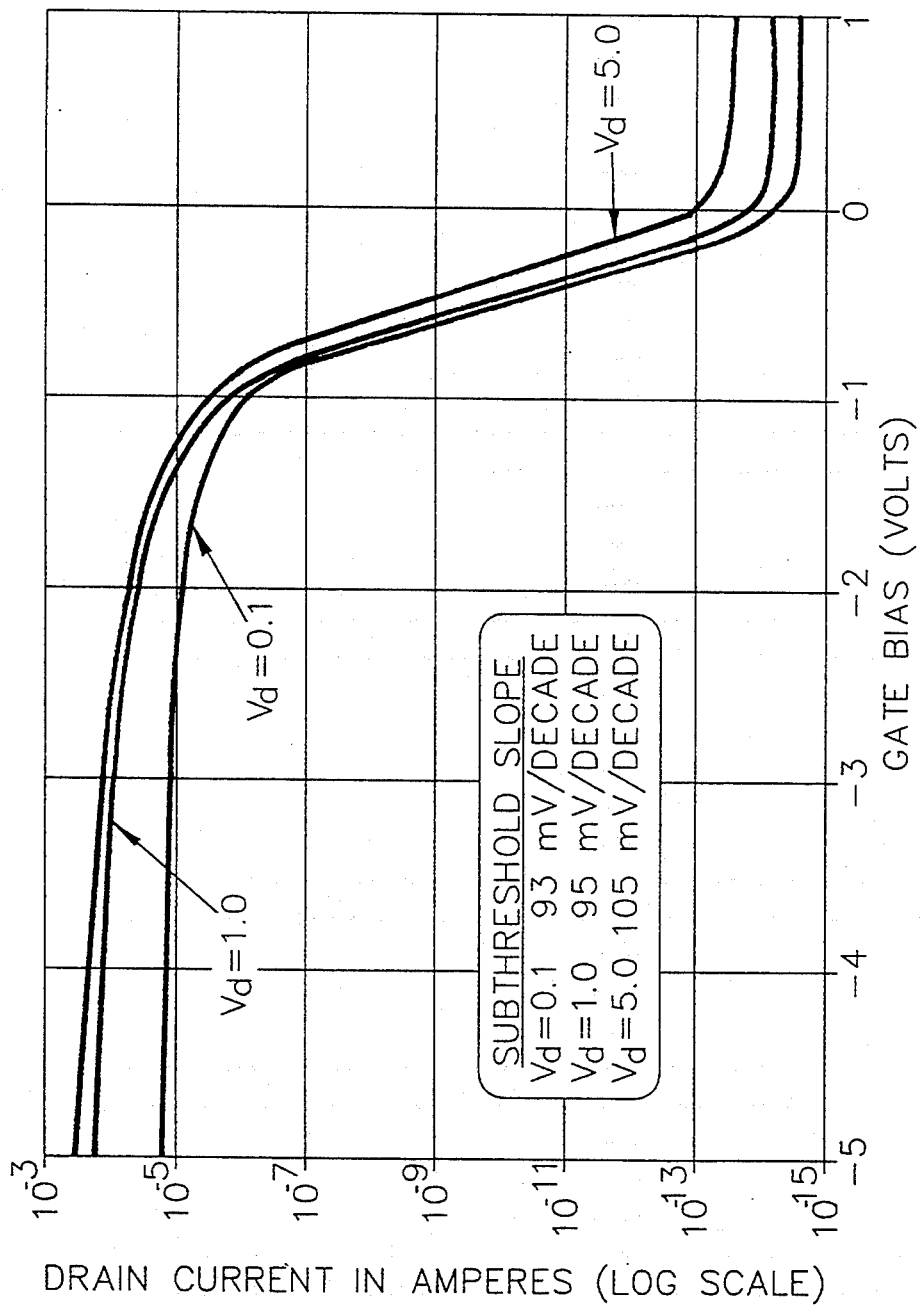

Typical bottom current and sub-threshold leakage behavior for the high current Fermi-FET devices of FIGS. 5B and 4C, are illustrated in FIGS. 6A and 6B. N-Channel high current Fermi-FET behavior is shown in FIG. 6A, and P-channel behavior in FIG. 6B. These figures illustrate N-channel current for an 0.8 $\mu$m transistor per $\mu$m width, and P-channel current for an 0.8 $\mu$m transistor per $\mu$m width, respectively. Bottom current is typically 2E-13 A/$\mu$m at 5 Volt drain bias at room temperature. This can be lowered to 2E-15 A/$\mu$m using the short channel techniques described below.

Figure 7:
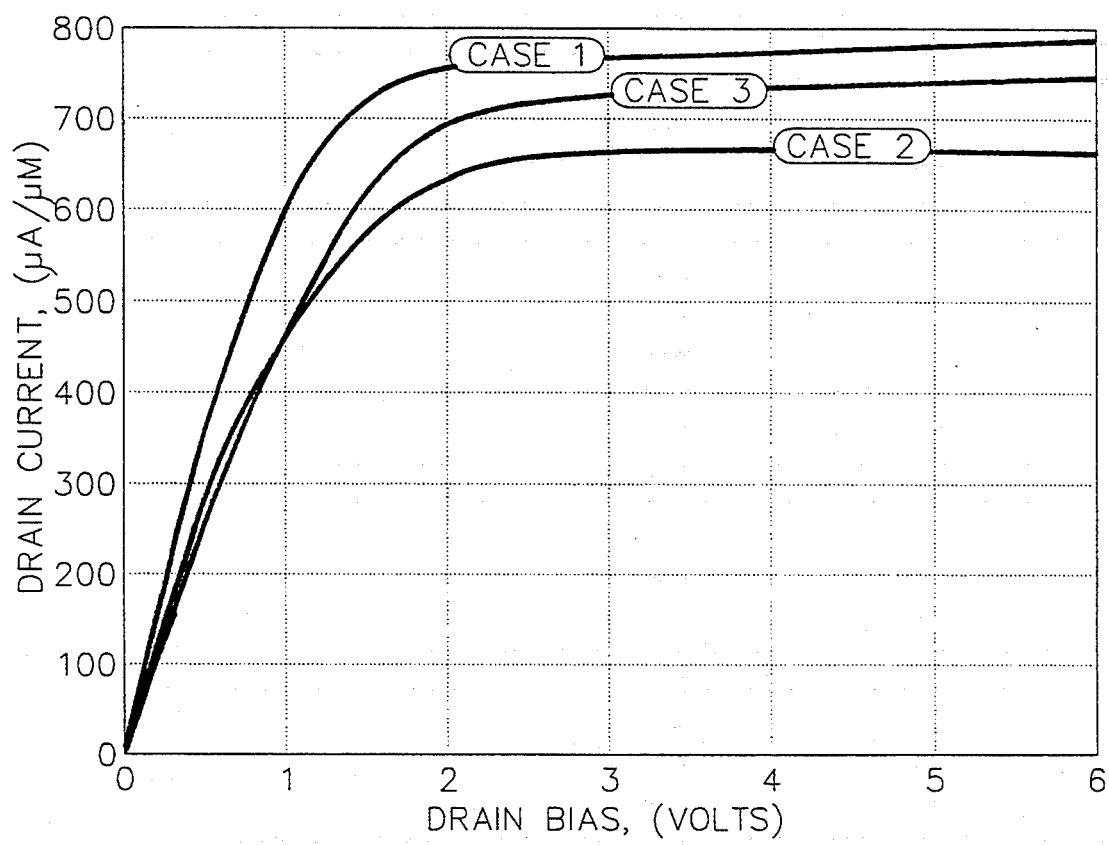
FIG. 7 graphically illustrates simulated worst case comparisons of drain current versus drain bias for different sidewall spacer structures in a high current Fermi-FET.

FIG. 7 illustrates a worst case simulated comparison plot of 5 Volt N-channel high current Fermi-FET drain current with different side-wall spacer structures 41 (FIG. 1). In all plots, the SiO$_2$ gate insulator 28 thickness is 132 Å. The different structures are illustrated in FIGS. 8A–8C.

Figure 8A:
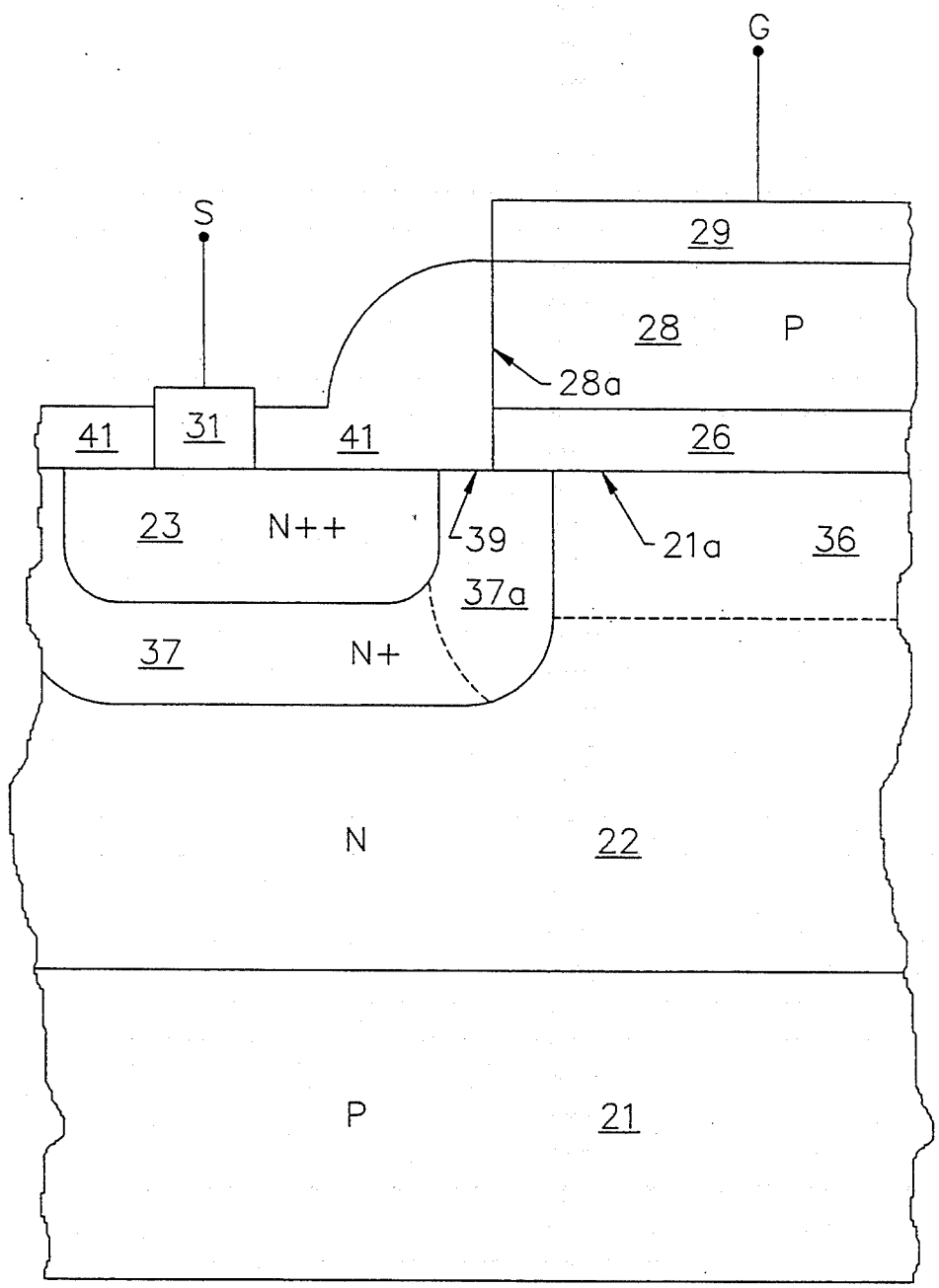
FIGS. 8A–8C illustrate enlarged cross-sections of the sidewall spacer structures which are graphically illustrated in FIG. 7.
Figure 8B:
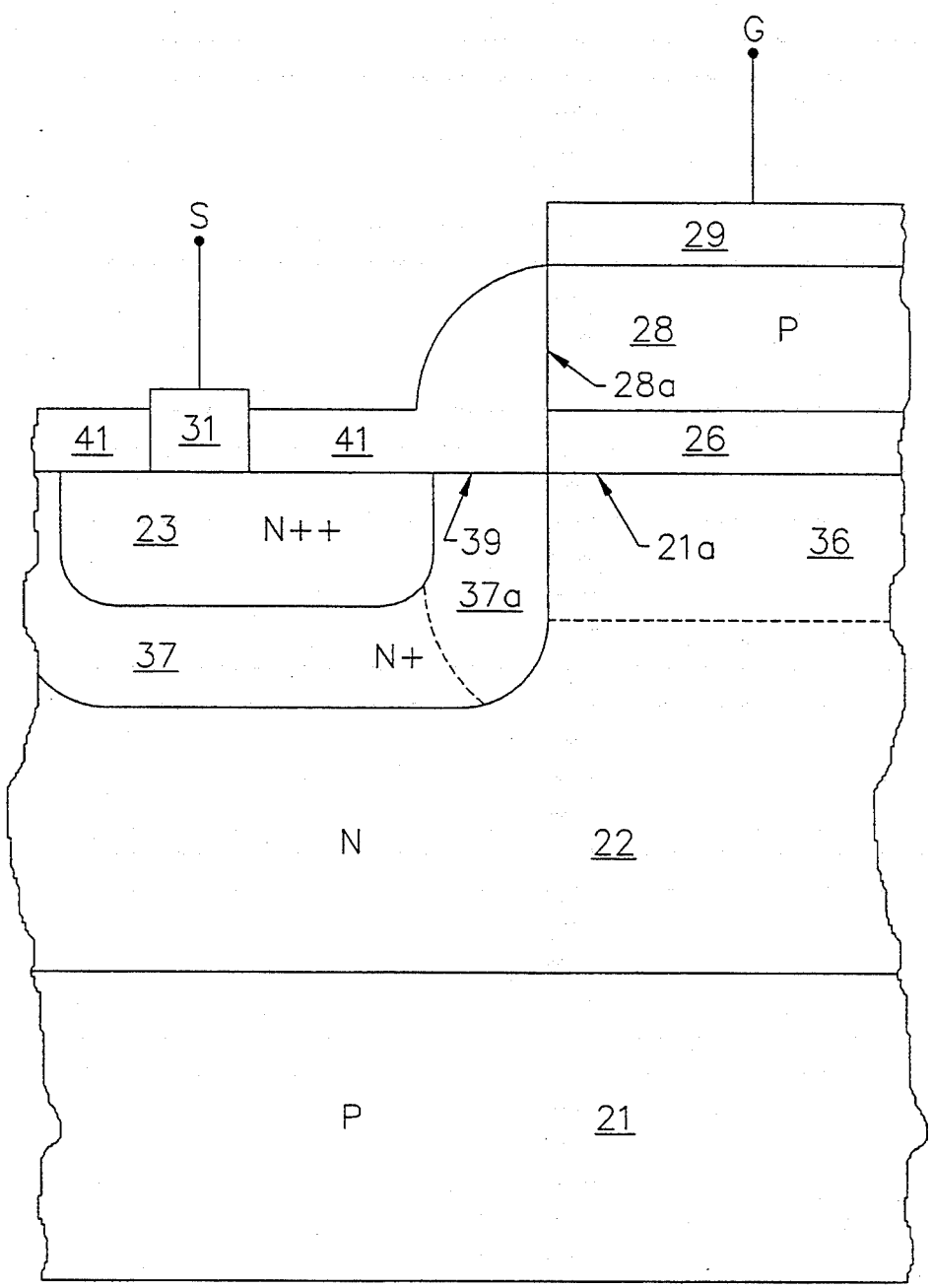
Figure 8C:
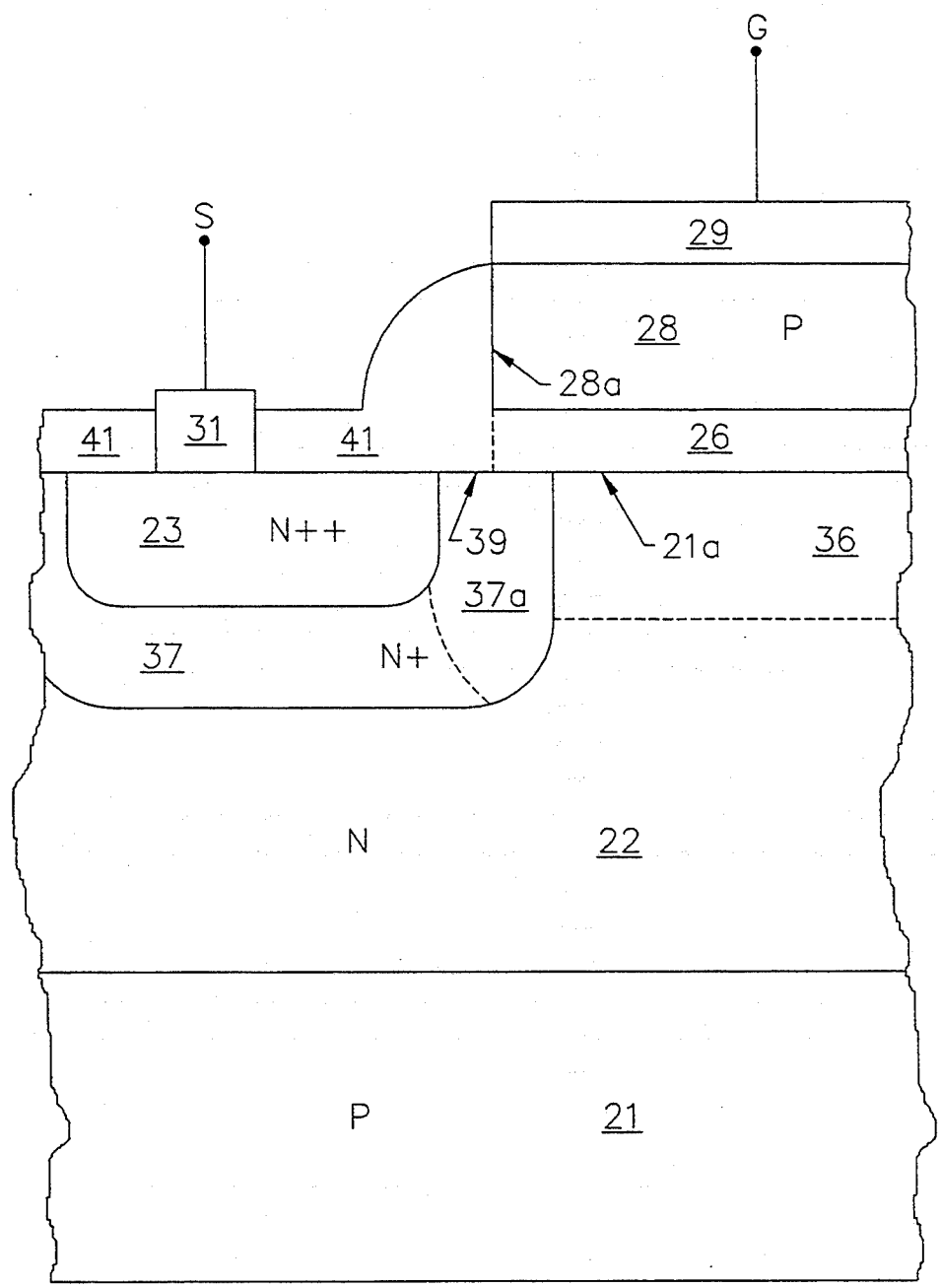

FIG. 8A illustrates Case 1 where the gate sidewall spacer 41 is silicon nitride, while the gate insulator 26 is silicon dioxide. The gate insulator 26 is also shown to slightly overlap the tip of the injector 37a at interface 39. Case 2, FIG. 8B, illustrates the gate sidewall spacer 43 as silicon nitride and the gate insulator 26 as silicon dioxide. In this case, the gate insulator 26 does not overlap the source injector region 37a at interface 39, but is contiguous with its edge. Case 3, FIG. 8C, illustrates both gate sidewall spacer 41a and gate insulator 43, of silicon dioxide. This structure is also constructed such that the edge of the polysilicon gate 28 slightly overlaps the source injector region 37a at interface 39. In all cases, the effective channel length was 0.71 $\mu$m.

As shown in FIG. 7, Case 1 produces the greatest drain saturation current with the least pinch-off voltage. It has also been found that Case 1 yields the lowest sub-threshold bottom current for any drain voltage. Case 1 also satisfies the conditions specified by Equations (24) and (25). Accordingly, Case 1 is preferred, so that the gate insulating region 26 extends partially over source injector region 37a at interface 39, and the gate sidewall spacer region 41 has greater permittivity than gate insulating region 26.

Low Leakage Current Fermi Threshold Field Effect Transistor

Figure 9A:
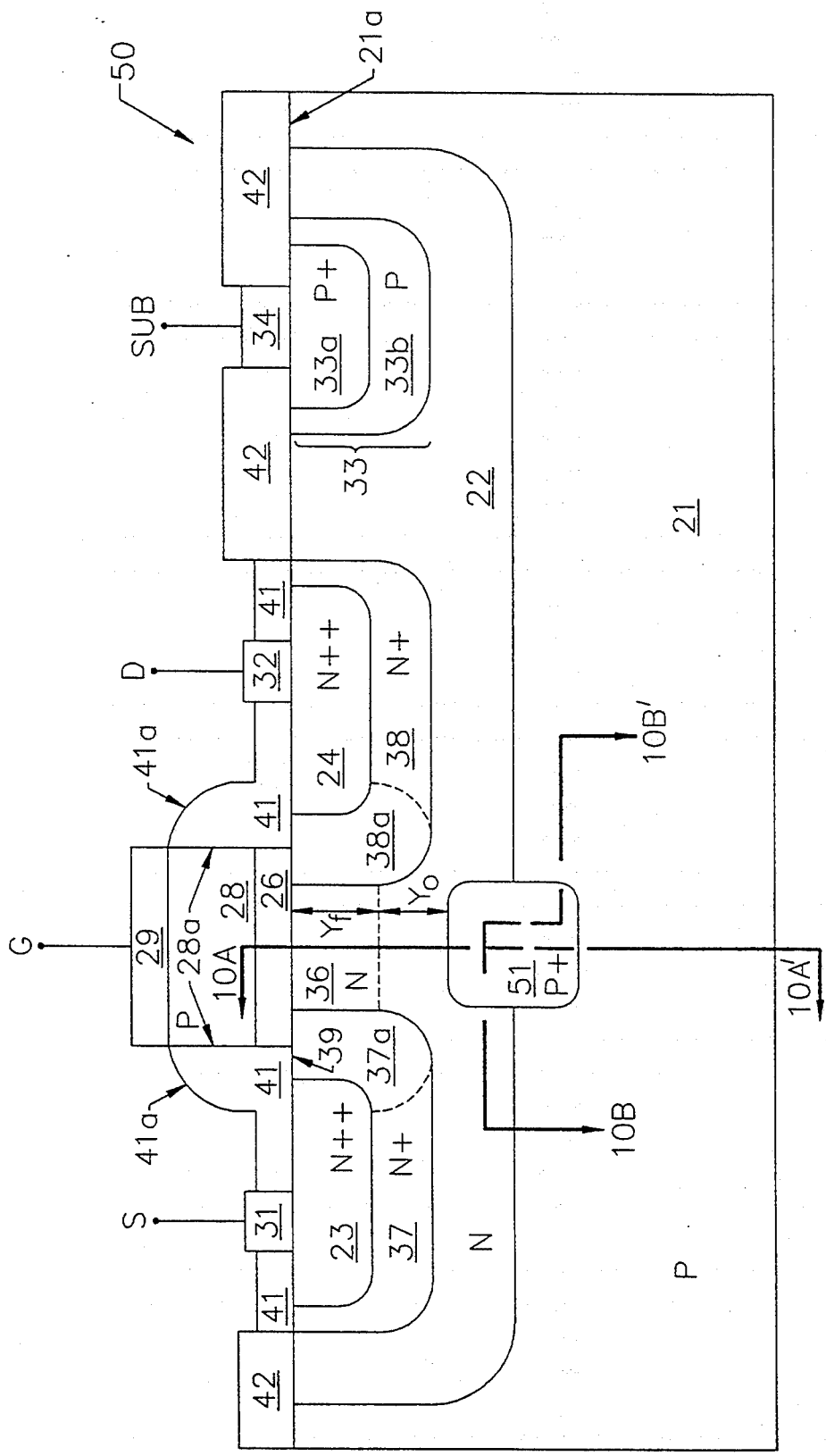
FIG. 9A illustrates a cross-sectional view of a first embodiment of a short channel low leakage current Fermi-FET.
Figure 9B:
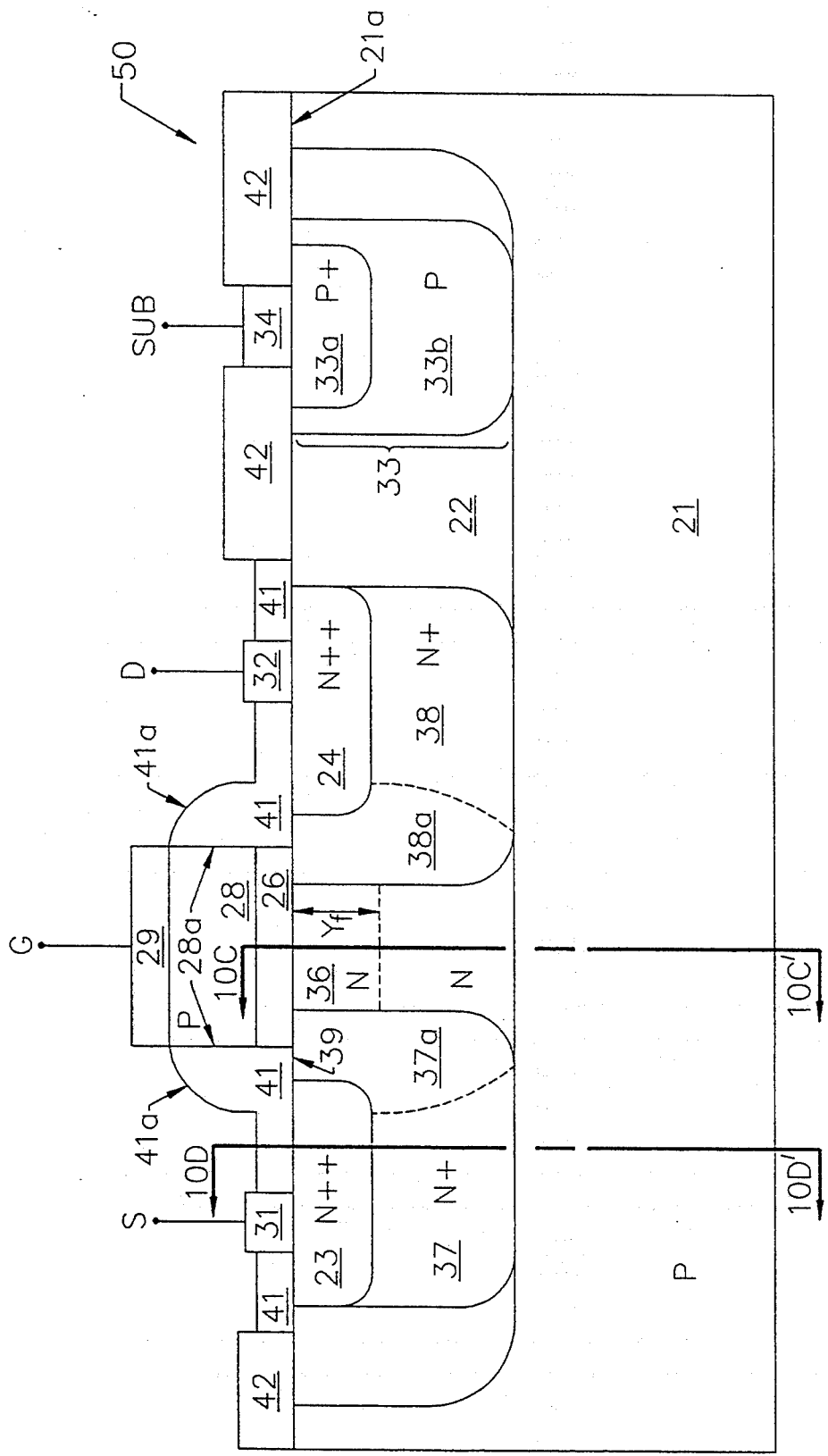
FIG. 9B illustrates a cross-sectional view of a second embodiment of a short channel low leakage current Fermi-FET.

Referring now to FIGS. 9A and 9B, Fermi-FETs which have short channels yet produce low leakage current according to application Ser. No. 08/037,636, will now be described. These devices will hereinafter be referred to as "low leakage current Fermi-FETs". The low leakage current Fermi-FET 50 of FIG. 9A includes a bottom leakage current control region 51 of first conductivity type, here P conductivity type, and doped at a high concentration relative to the substrate 21. Accordingly, it is designated as P+ in FIG. 9A. The low leakage current Fermi-FET 60 of FIG. 9B includes extended source and drain injector regions 37a, 38a, which preferably extend to the depth of the Fermi-tub 22.

Referring now to FIG. 9A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_o$. The remainder of the Fermi-FET transistor of FIG. 9A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 9A.

The bottom leakage current control region 51 minimizes drain induced injection in short channel Fermi field effect transistors, i.e. those field effect transistors having a channel length of approximately 0.5 $\mu$m or less, while maintaining low diffusion depletion capacitance. For example, at 5 volts, leakage current of 3E-13A or less may be maintained.

The bottom leakage current control region may be designed using Equation (2) where $Y_o$ is the depth from the channel to the top of the bottom leakage control region as shown in FIG. 9. Factor $\alpha$ is the ratio between the P+ doping of the bottom leakage current control region 51 and the N doping of the Fermi-tub 22. Preferably $\alpha$ is set to about 0.15 within the bottom leakage control region, i.e. below the gate 28. Below the source and drain regions 23 and 24, $\alpha$ is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 9B, an alternate design for bottom leakage control extends the depth of source injector region 37a and drain injector region 38a, preferably to the depth of the Fermi-tub ($Y_f+Y_o$). As shown in FIG. 9B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about 1.5E18/cm$^3$. The depth of substrate contact region 33b also preferably is extended to approach the Fermi-tub depth. The remainder of the Fermi-FET transistor 60 of FIG. 9B is identical with that described in FIG. 1, except that a shorter channel is illustrated.

Design of 0.5 $\mu$m Low Leakage Current Fermi-FET

Figure 10B:
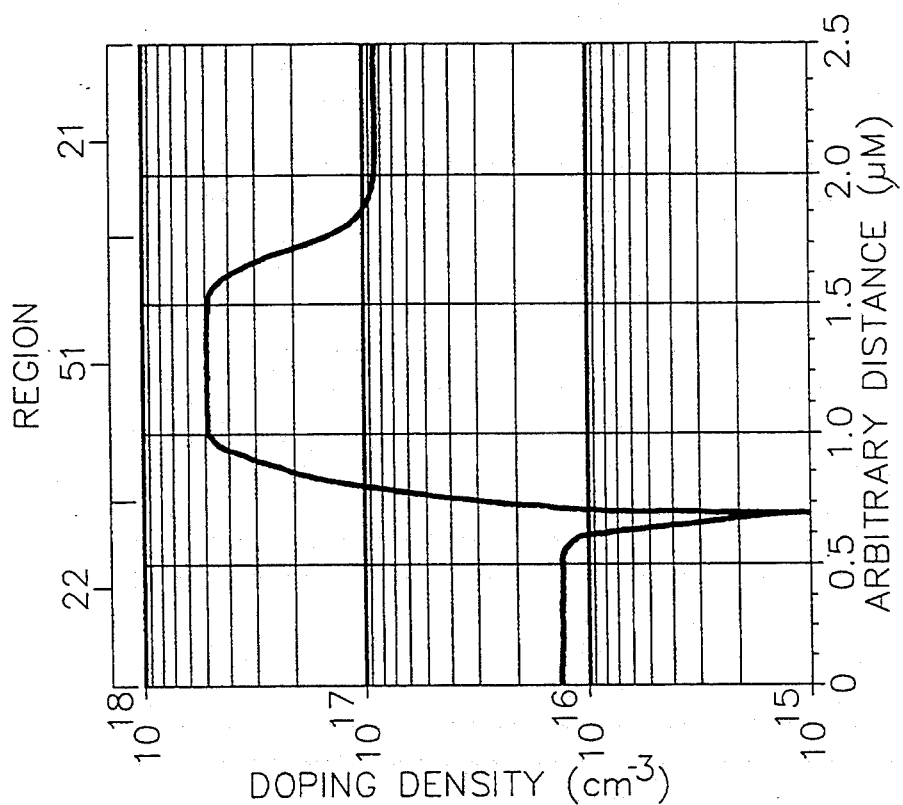
FIGS. 10A and 10B graphically illustrate preferred doping profiles and geometries for designing a 0.5 μm channel low leakage current Fermi-FET of FIG. 9A.
Figure 10A:
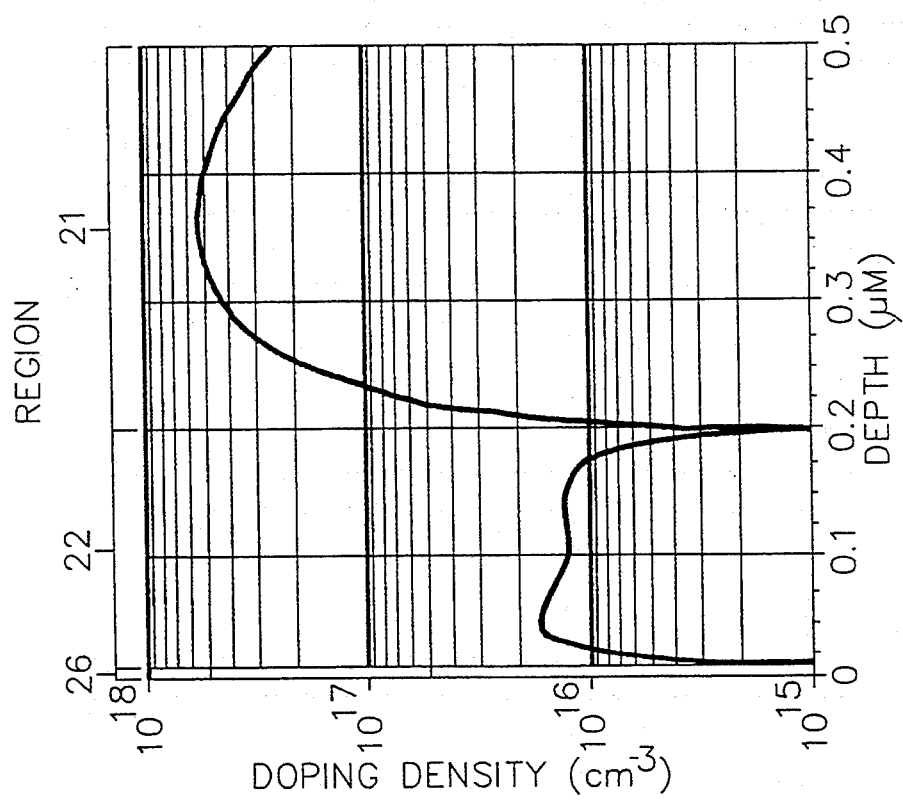

Referring now to FIGS. 10A–10B, preferred doping profiles and geometries for designing a 0.5 $\mu$m channel low leakage current Fermi-FET as illustrated in FIG. 9A will now be described. It will be understood by those having skill in the art that both N and P channel FETs are fabricated in a similar fashion. All geometries and doping profiles are identical to those described in FIGS. 2A–2C, except that the length of channel region 36, between facing surfaces of injector regions 37a and 38a, is 0.5 $\mu$m rather than 0.8 $\mu$m, and the bottom leakage control current control region 51 is added as already described. It is well known to those having skill in the art how to achieve these doping profiles, using many well known techniques.

FIG. 10A illustrates a vertical doping profile along line 10A–10A' of FIG. 9A and centered about the channel 36. The region to which the profile applies is also labelled at the top of the horizontal axis of FIG. 10A. As shown, bottom current leakage current control region 51 extends from 1950 Å to 4000 Å in depth from the top face 21a of substrate 21 Accordingly, it is centered about the interface between Fermi-Tub 22 and substrate 21. Doping concentration is 5E17. In contrast with FIGS. 2A–2C, the substrate 21 is doped at 1E17.

FIG. 10B illustrates a doping profile along line 10B–10B' of FIG. 9A. As shown, bottom leakage current control region 51 extends horizontally between source injector region 37a and drain injection region 38a for about the same length as the channel length, i.e. about 0.5 μm.

Figure 10D:
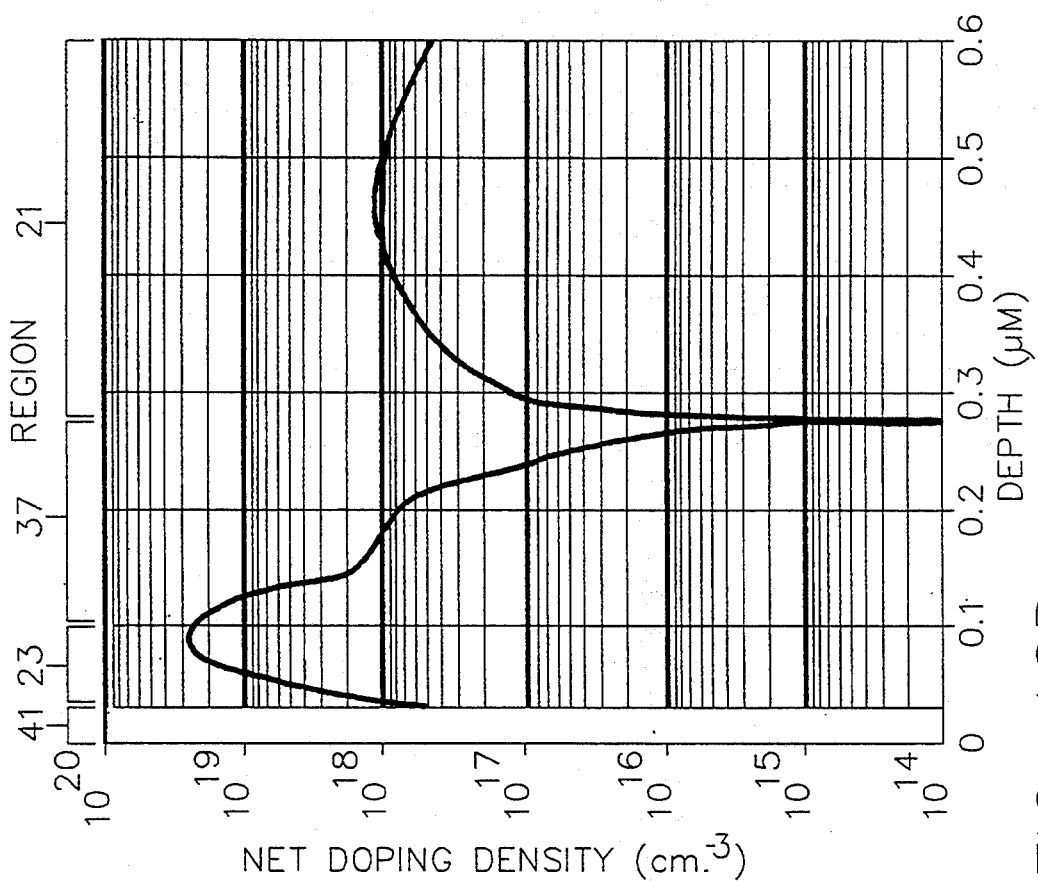
FIGS. 10C and 10D graphically illustrate preferred doping profiles and geometries for designing a 0.5 μm channel low leakage current Fermi-FET of FIG. 9B.
Figure 10C:
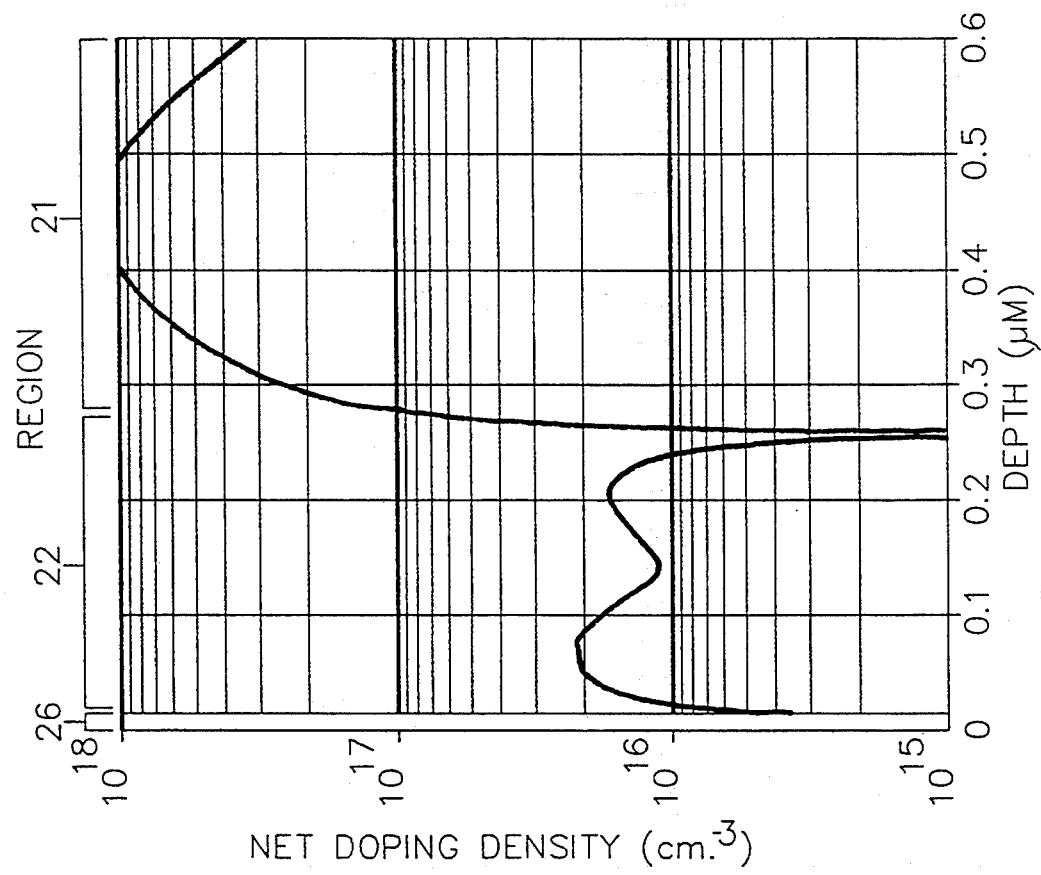

Referring now to FIGS. 10C–10D, preferred doping profiles and geometries for designing a 0.5 μm channel low leakage current Fermi-FET as illustrated in FIG. 9B will now be described. It will be understood by those having skill in the art that both N and P channel FETs are fabricated in a similar fashion. All geometries and doping profiles are identical to those described in FIGS. 2A–2C except that the depths of source injector region 37, drain injector region 38 and substrate contact 33b have been extended to the tub depth of about 2000 Å, and the length of channel region 36, between facing surfaces of injector regions 37a and 38a, is 0.5 μm rather than 0.8 μm.

FIG. 10C illustrates a vertical doping profile along line 10C–10C' of FIG. 9B and centered about the channel 36. As shown, substrate concentration is about 1E18. FIG. 10D illustrates a doping profile along line 10D–10D' of FIG. 9B. As shown, the source injector tub 37 extends to the depth of the Fermi-tub.

Operation of the Bottom Leakage Current Control Region

The operational theory of the bottom leakage current control region 51 of FIG. 9A, and the deep injection regions of FIG. 9B, to lower leakage current in short channel devices, will now be described. Subthreshold considerations will first be described to define the terms which apply to bottom leakage current. A discussion of how injector tub depth influences bottom leakage current will then be provided as well as a discussion of drain induced injection and drain field threshold lowering.

Figure 11:
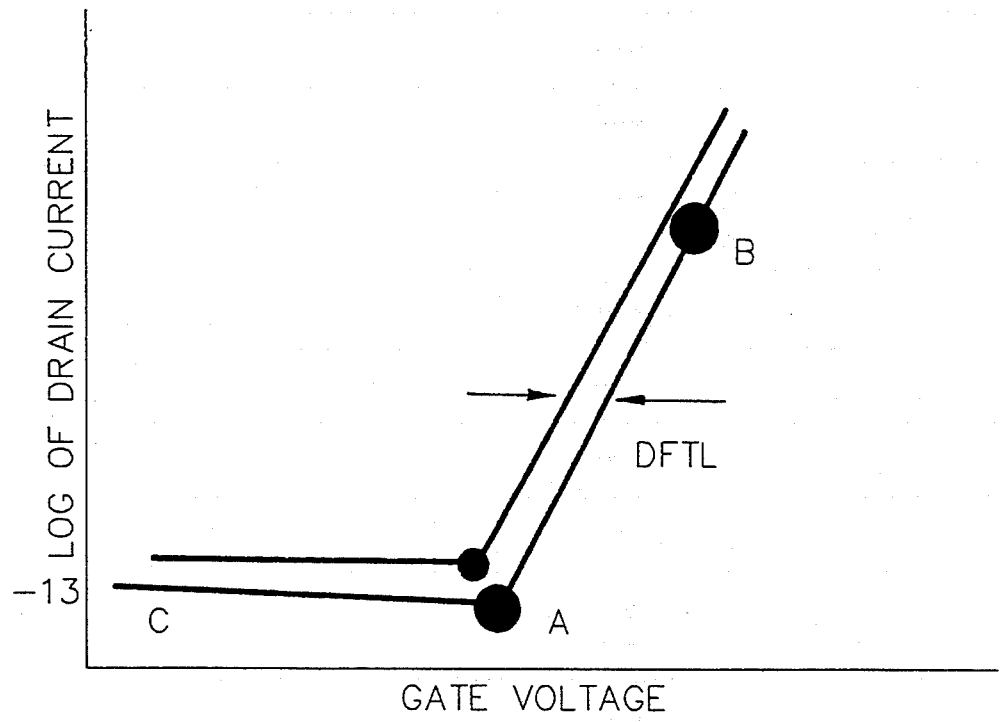
FIG. 11 graphically illustrates basic sub-threshold voltage-current behavior of a field effect transistor.

In solving the equations that describe the sub-threshold behavior of the Fermi-FET, some new definitions are needed. FIG. 11 graphically illustrates basic behavior. There are four primary features of sub-threshold current behavior. These behavior regions are labeled A, B, and C and $D_{FTL}$ in FIG. 11. Point A defines "sub-threshold threshold, $V_{stt}$. Point B defines normal conduction threshold. Point C defines "bottom leakage current" as influenced by drain voltage. Finally, the arrows for $D_{FTL}$ defines "drain field threshold lowering". Sub-threshold threshold occurs when the injecting gate field is zero.

Referring again to FIGS. 9A and 9B, bottom leakage current dependence on drain voltage is a result of a drain field component that terminates on the source injector diffusion 37a facing the channel 36. This source terminated drain field causes carrier injection into the channel 36. This sub-threshold effect is called "drain induced injection", DII.

DII is a characteristic property of majority carrier Fermi-FET and buried channel field effect devices. Below threshold, the majority carrier channel 36 and Fermi-tub region 22 do not contain charge sites that prevent the drain field from extending across the channel region. As a consequence, the drain field can terminate in the source depletion region facing the channel and cause injection.

In contrast, minority carrier MOS devices require the substrate region to intercede between the source and drain. Drain field is therefore terminated by ionizing the substrate region adjacent the drain diffusion facing the channel. If the substrate region is completely depleted between the source and drain diffusions, the well known punch-through phenomenon occurs leading to abrupt and high injection current.

In summary, MOS device design is troubled by punch-through and threshold problems. Buried channel devices are troubled by both punch-through and DII. However, Fermi-FET devices are troubled only by DII conditions, which can be substantially reduced by the bottom leakage current control region or by increasing the depth of the injector regions 37 and 38. The significant current and speed advantages of the Fermi-FET compared to MOS and buried channel devices far outweigh the design constraints needed to control DII in the former as opposed to eliminating punch-through and threshold troubles in the latter. Both problems become more significant as channel length is shortened.

The following analysis describes the impact of injector depth $Y_d$ on diverting drain field contour lines in majority carrier Fermi-FET devices. The bottom leakage current control region 51 of FIG. 9A or the deep injector tubs of FIG. 9B virtually eliminate DII.

Figure 12A:
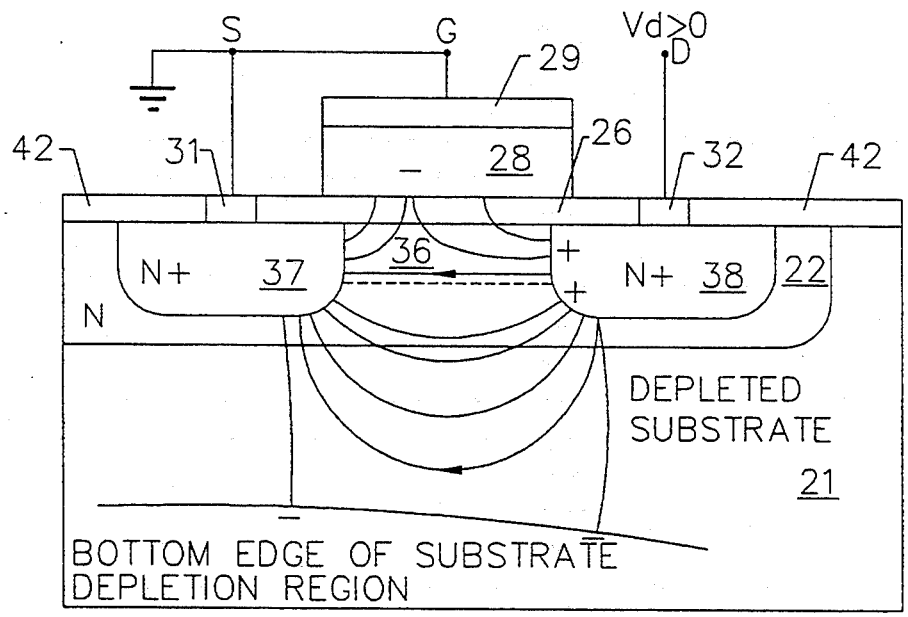
FIGS. 12A and 12B are enlarged cross-sectional views of a field effect transistor illustrating drain induced injection.
Figure 12B:
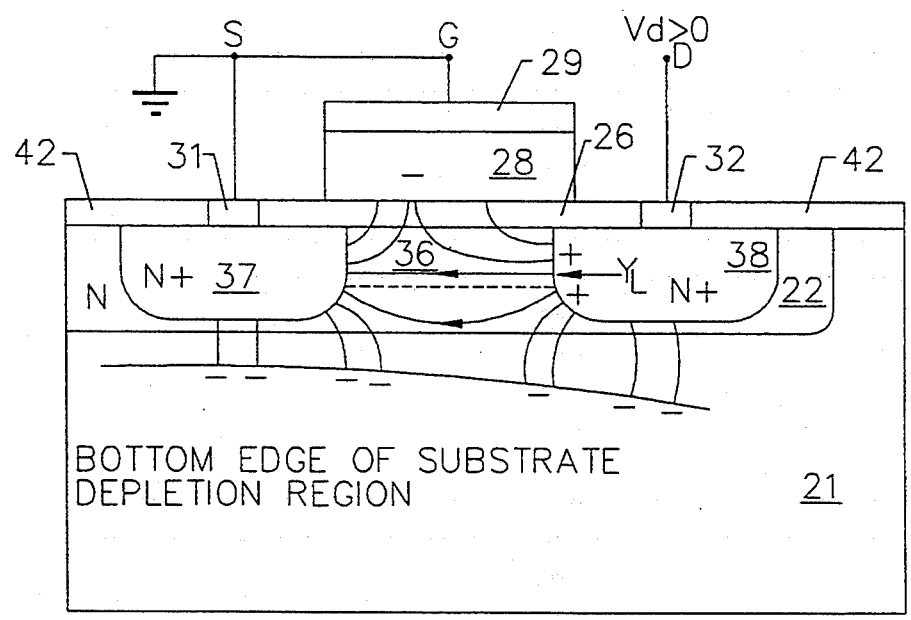

FIG. 12A illustrates field contour lines that occur when Drain Induced Injection becomes a problem in a low capacitance Fermi-FET, including a Fermi-tub 22 and injectors 37, 38 and no sidewall spacer 41. Specifically, the bottom corner region of the injector tubs contribute to excessive DII due to field crowding there. FIG. 12B illustrates proper corrective measures that minimize the effect, by moving the bottom edge of the substrate depletion region 21 closer to the bottom of the source and drain injector tubs 37, 38. The bottom current leakage control region 51 of FIG. 9A also accomplishes this result.

There exists some depth $Y_L$ at the drain injector 38 facing the channel 36 at which the contour integral of the drain electric field terminating on poly gate surface 28 equals the contour integral of the drain field terminating in the substrate region 21. At that point, drain field can terminate at the source 23, facing the channel region. There is an injector tub depth that minimizes the number of field lines that can terminate on the source injector 38. This requirement suggests that $\alpha$ be less than 1. Typically, $\alpha < L_o/2$. When designing Fermi-FET devices, Equation (31) derived below, should be considered. Predicted depth $Y_L$ should not exceed the depth of the injector, otherwise considerable bottom leakage current will flow from the bottom and corners of the diffusions in the sub-threshold regime. Equation (32) derived below, produces minimum bottom current.

Equation (32) also predicts the basic design criteria for the original Fermi-FET as defined by U.S. Pat. Nos. 4,990,974 and 4,984,043. Specifically, when $Y_{tub}=Y_o$ and $Y_o=Y_p$, then $\alpha=1$ and $Y_L=Y_o$. In other words, for that case, the diffusion depth $Y_d$ should be the same as the Fermi channel depth $Y_o$. $Y_p$ is the depletion depth in the substrate region.

Equation (32) will now be derived. Let $R_1$ be an effective radius for the field lines that terminate on the polysilicon gate electrode 28. Let $R_2$ be an effective radius for the field lines that terminate in the substrate region 21. Let $E_d$ be the drain field along these field lines. The electric field between diffusions is nearly uniform in the sub threshold region as compared to the electric field that terminates in the substrate region below the diffusions.

$$\frac{\pi}{2} R_1 E_{sd} + T_{ox} E_{sd} \frac{e_s}{e_i} = V_d + V_{pj} \quad (26)$$

$$\frac{\pi}{2} R_2 E_{sd} = V_d + V_w \quad (27)$$

$$R_2 = Y_{tub} + Y_p - Y_L \quad (28)$$

$$R_1 = Y_L \quad (29)$$

Using Equations (26)-(29) the following expression is obtained:

$$E_d \left[ \frac{\pi}{2} (R_1 - R_2) + \frac{e_s}{e_i} T_{ox} \right] + V_w - V_{pj} = 0 \quad (30)$$

where $V_w$=well potential $KT/q \ln(N^*/N_s)$, and $V_{pj}$=polysilicon gate electrode junction potential $KT/q \ln(N^*/N_{poly})$
If $V_w = V_{pj}$, then:

$$Y_L \cong \frac{Y_{tub} + Y_p - \frac{2e_s}{\pi e_i} T_{ox}}{2} \quad (31)$$

Equation (31) is independent of field strength $E_d$. Substrate depletion depth $Y_p$ should be small by design.

Punch-through is a serious problem for short channel MOS and buried channel devices. High substrate doping is required to minimize the effect. In all FET structures, a second drain induced phenomenon occurs: "drain field threshold lowering", DFTL. Simply explained, DFTL is the result of insulator potential developed near the source end of the channel as a result of the electric field produced by drain voltage that is terminated by the gate when gate voltage is below drain voltage. This drain induced insulator potential is always in a direction to reduce threshold voltage. Punch-through is eliminated by the low capacitance Fermi-FET, however DFTL remains. An expression for the change in threshold voltage $\Delta V_t$ due to DFTL is given below and only applies when drain voltage is greater than gate voltage:

$$\Delta V_t = \frac{V_d - (V_g - V_{fb})}{1 + \frac{e_i(L_o + X_d)}{e_s T_{ox}}} \quad (32)$$

where $L_o$ is channel length and $X_d$ is diffusion depth.

The effects of DFTL increase by the amount drain voltage exceeds gate voltage and is more pronounced at low gate voltage as channel length is shortened. Thinning down gate insulator thickness proportionately reduces the effect.

A method of experimentally measuring the effects of DFTL is to plot sub-threshold behavior of the device. See FIGS. 6A and 6B. DFTL accounts for the left voltage translation of the rising curve, $Log_{10}I_{ch}$, with increasing drain voltage $V_d$.

High Saturation Current Fermi-FET

Figure 13:
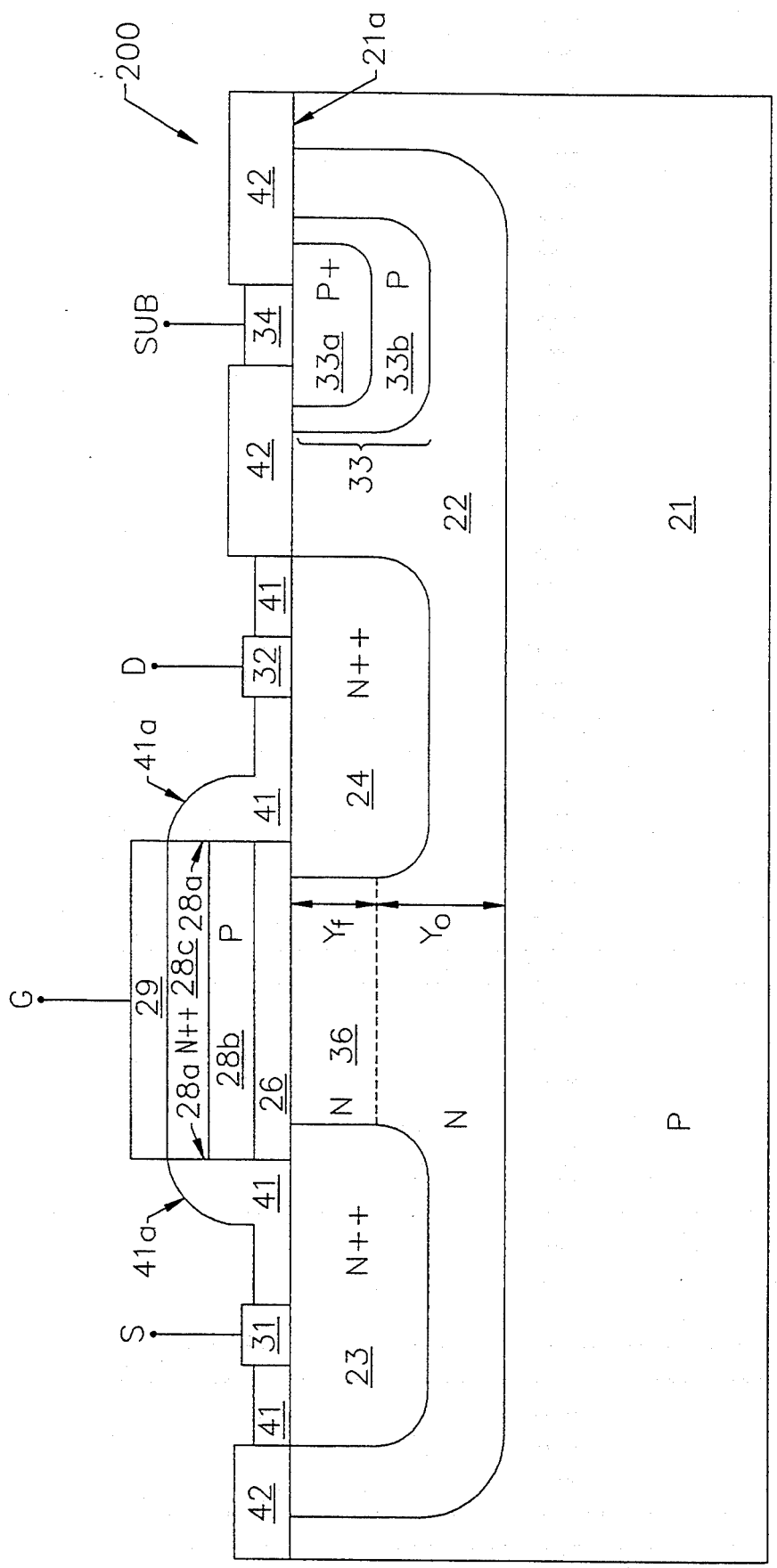
FIG. 13 illustrates a cross-sectional view of an N-channel, high current, low leakage current Fermi-FET according to the invention.

Referring now to FIG. 13, a high saturation current Fermi-FET according to the present invention is illustrated. The high saturation current Fermi-FET 200 is similar to Fermi-FET 20 of FIG. 1 except that source tub regions 37 and drain tub regions 38 are not present. However, it will be understood by those having skill in the art that these regions may be used as described in application Ser. No. 08/037,636. Also, gate electrode layer 28 includes a first layer 28b of first conductivity type, here P type and a second layer 28c of second conductivity type, here N++ type according to application Ser. No. 08/087,509 entitled Field Effect Transistor Having Polycrystalline Silicon Gate Junction to inventors Vinal and Dennen, and assigned to the assignee of the present invention, the disclosure of which is hereby incorporated herein by reference. However, it will be understood by those having skill in the art that the source and drain tub regions 37 and 38 and/or a single layer gate 28 may also be used.

According to the invention, the second conductivity doping (here N++) of the source region 23 adjacent channel 36 is maintained at a minimum which is sufficiently high to maximize the saturation current of the field effect transistor. Preferably, the doping of the source region 23 and the drain region 24 facing channel 36 is maintained at this minimum doping, and most preferably the doping of the entire source and drain regions 23 and 24 respectively are maintained at this minimum doping. Of course, greater doping levels may be used, but will do little to enhance the saturation current of the transistor.

The concentration in the channel region 36 may be greater than or less than that of the tub region 22, and is less than that of the source and drain regions 23 and 24. The ends of the channel region 36 preferably abut the source and drain diffusions 23 and 24, or the source and drain tubs if present. The source and drain regions are at least as deep as the channel 36 and preferably less than the depth of the tub 22.

The substrate region 21 is the same conductivity tape as the doped polycrystalline silicon gate 28b adjacent the gate insulator 26. The substrate 21 has a doping concentration which is higher than, and preferably at least four times higher than, the tub 22 doping concentration.

It will now be shown that the drain saturation current of the Fermi-FET transistor 200 is controlled by the diffusion doping concentration of the source 23 and drain 24 adjacent the channel 36. The highest drain saturation current is reached, for a given doping concentration, when no perpendicular electric field is allowed to cross the channel 36. Thus, for a given channel length, the diffusion concentration has a minimum value beyond which drain saturation current ceases to increase.

Accordingly, it is not necessary to fabricate very short channel Tub-FETs to achieve high drive current. For example, if a Tub-FET with 0.8 micron channel length is optimized for maximum drive current, the fabrication of devices with a shorter channel does little to increase drive current. Drain saturation currents of 16 amperes per centimeter and 9 amperes per centimeter for N and P channel devices, respectively, can be achieved from Tub-FET device designs using power supply voltages of magnitude value between 0 and 5 volts. To achieve these current levels, gate insulator layer 26 thickness of 100 Å Silicon Nitride or 50 Å Silicon Dioxide or other gate insulating materials with equivalent gate capacitance effects, is required.

Figure 14:
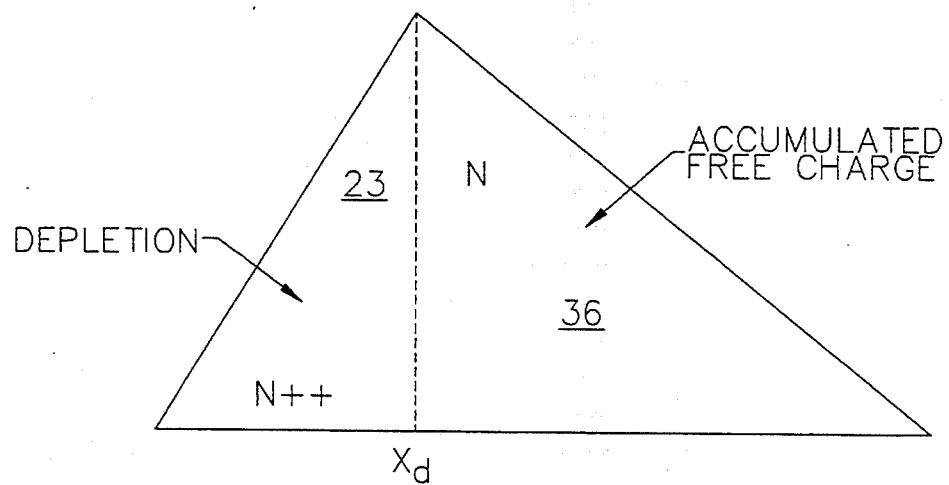
FIG. 14 graphically illustrates accumulated free charge which is stored in the source and/or drain diffusion injection area facing the channel in the transistor of FIG. 13.

Gate capacitance of T-FETs depends on mobile channel charge $Q_{ch}$ per unit gate voltage $(V_g-V_t)$. Gate capacitance is therefore proportional to accumulation efficiency. It has been demonstrated according to the invention that high accumulation efficiency can occur if excess charge can be stored in the source and/or drain diffusion injection area facing the channel. Thus, $$\phi_x = \frac{KT}{q} \ln\left(\frac{N_{do}}{N_{ch}}\right) \tag{33}$$

Where $\phi_x$ is the flat band potential between the source-/drain diffusions and the channel, $KT/q = 26$ mV at room temperature, $N_{do}$ is the source doping concentration and preferably also the drain doping concentration, facing channel 36, and $N_{ch}$ is the doping concentration of channel 36. This is graphically illustrated in FIG. 14.

The minimum depth $X_d$ of the diffusion depletion region is approximated below. The accumulation free charge is identical in value, and opposite in sign, to the total charge in the diffusion depletion region facing the channel:

$$X_d = \sqrt{\frac{2e_s \frac{KT}{q} \ln\left(\frac{N_{do}}{N_{ch}}\right)}{qN_{do}}} \tag{34}$$

Where $e_s$ is the permittivity of the substrate and q is $1.6 \times 10^{-19}$ coulombs.

Figure 15:
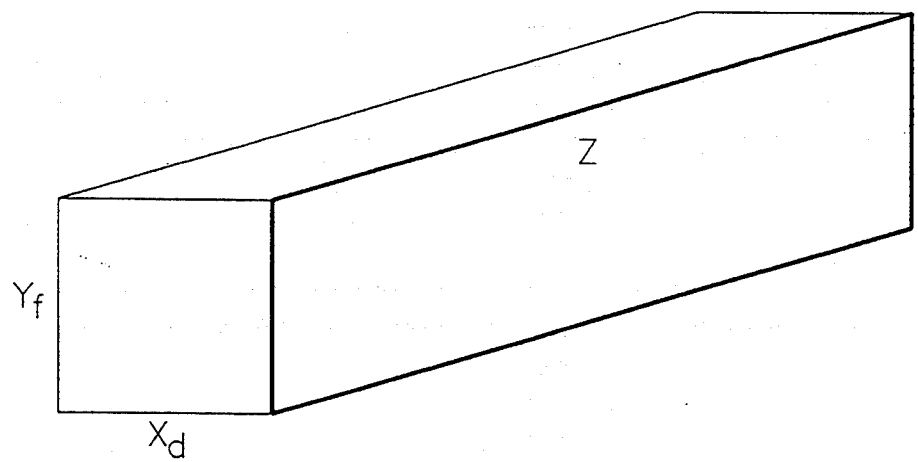
FIG. 15 graphically illustrates an equivalent volume of excess carriers that is free to be accumulated into the channel of the transistor of FIG. 13.

FIG. 15 illustrates an equivalent volume of excess carriers available within the reservoir volume that is free to be accumulated into the channel region. In FIG. 15, $Y_f$ is the depth of channel 36 and Z is the width of channel 36. The following discussion ignores free charge. This component of free charge is discussed subsequently.

The maximum reservoir of free accumulatable charge $Q_r$, is:

$$Q_r = qN_{do}X_dY_fZ \tag{35}$$

Substituting Equation (34) for $X_d$ one obtains $$Q_r = Y_fZ\sqrt{2e_s\phi_x qN_{do}} \tag{36}$$

Where $\phi_x$ is given by Equation (33).

Equation (36) defines the available excess charge for injection. When maximum gate voltage $V_{gmax}$ is applied, above the threshold value, this total available charge must be capable of filling up the channel. When both the source and drain regions are at ground potential, each accumulation reservoir must be capable of filling up half of the channel. As free charge flows into the channel, carriers diffuse across the $N++/N_{ch}$ junction to replace them. The effective channel volume $V_{ch}$ that is filled per diffusion is:

$$V_{ch} = \frac{Z\delta L_o}{2} \tag{37}$$

Therefore the charge transferred to the channel is:

$$Q_{ch} = \frac{q}{2} N_{chex}Z\delta L_o \tag{38}$$

where
$N_{chex}$ = Channel excess carrier concentration
$\delta$ = flow depth of excess carriers.
$L_o$ = Channel length
$Z$ = channel width It can be shown that channel charge is also related to gate capacitance and gate drive voltage $(V_g-V_t)$. The following equality exists:

$$C_g^*ZL_o(V_g-V_t) = qN_{chex}\delta ZL_o \tag{39}$$

Therefore $$qN_{chex}\delta = C_g^*(V_g-V_t) = Q_{ch}^* \tag{40}$$

where $Q_{ch}^*$ is the charge per unit volume.

A basic expression for channel saturation current $I_{sat}$ can be written as follows:

$$I_{sat} = C_g^*(V_g=V_t)ZV_L \tag{41}$$

where $V_L$ is the lateral velocity.

The conditions that control lateral velocity $V_L$ are discussed below. Substituting Equation (40) into Equation (38), an important expression that defines accumulated channel charge due to the source diffusion is found:

$$Q_{ch} = \frac{C_g^*}{2} ZL_o(V_g - V_t) \tag{42}$$

Equating Equation (36) to the available channel charge in Equation (42):

$$Y_fZ\sqrt{2e_s\phi_xqN_{do}} = \frac{C_g^*}{2} ZL_o(V_g - V_t) \tag{43}$$

Equation (43) can be solved for actual gate capacitance $C_g^*$ in terms of the diffusion impurity concentration $N_{do}$ and the depth $Y_f$ of the channel region:

$$C_g^* = \frac{2Y_f\sqrt{2e_s\phi_xqN_{do}}}{L_o(V_{gmax} - V_t)} \; F/cm^2 \tag{44}$$

where:
$Y_f$ = Depth of the Fermi channel adjacent the source and drain diffusions
$N_{do}$ = Average diffusion impurity concentration in depth from the substrate-insulator interface 21a to the bottom of the Fermi channel.
$L_o$ = Channel length
$e_s$ = Permittivity of substrate
$\phi_x$ = Given by Equation (33)
$V_{gmax}$ = Maximum gate voltage anticipated
$V_t$ = Threshold voltage Gate capacitance has a maximum value as determined by independent analysis and is given below:

$$C^*_{gmax} = \frac{1}{\frac{T_{ox}}{e_i} + \frac{\delta}{2e_s}} = \frac{2e_i e_s}{2e_s T_{ox} + \delta e_i} \quad (45)$$

The ratio of Equation (44) to Equation (45) provides an expression for gate capacitance factor $G_f$:

$$G_f = \frac{2Y_f(2e_s T_{ox} + \delta e_i)\sqrt{2e_s\phi_x q N_{do}}}{e_s e_i L_o(V_{gmax} - V_t)} \quad (46)$$

According to Equation (41), maximum saturation current occurs for a given lateral velocity, when gate capacitance factor $G_f = 1.0$.

Figure 16A:
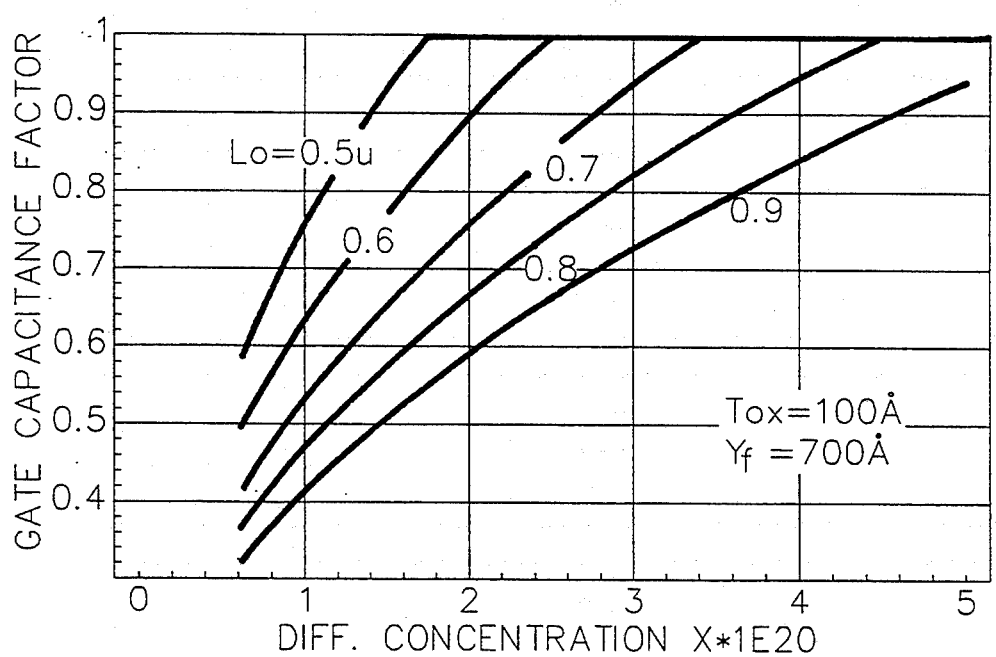
FIGS. 16A–16B graphically illustrate a gate capacitance factor as a function of source/drain diffusion concentration for various channel lengths.
Figure 16B:
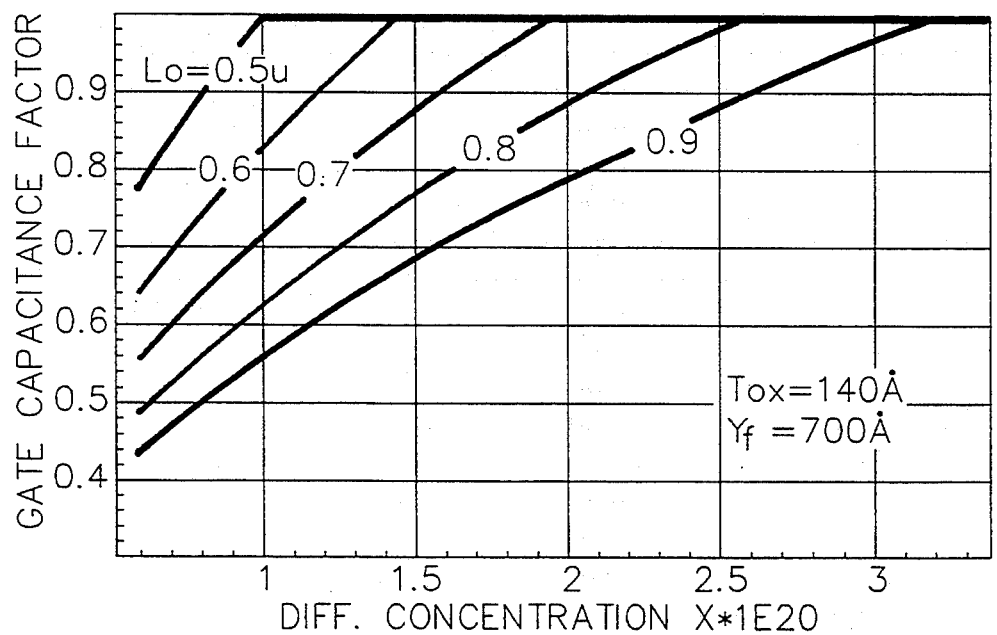

FIGS. 16A and 16B graphically illustrate Equation (46) as a function of source/drain diffusion concentration $N_{do}$ for different channel lengths $L_o$, given $Y_f \approx 600$ Å, $V_{gmax} = 5$ V, $V_t = 0.8$ V, flow depth $\delta = 120$ Å, and $T_{ox} = 100$ Å for FIG. 16A and 140 Å for FIG. 6B. FIGS. 16A and 16B reveal that there is a critical concentration $N_{do}$ that is required to achieve maximum saturation current and this value is different for different channel lengths $L_o$. This maximum occurs when gate capacitance factor $G_f = 1.0$. this maximum depends primarily on channel length $L_o$ and insulator thickness $T_{ox}$. The following expression defines this criticality.

$$N_{domin} = \frac{1}{2e_s\phi_x q}\left[\frac{e_s e_i L_o(V_{gmax} - V_t)}{Y_f(2e_s T_{ox} + \delta e_i)}\right]^2 \quad (47)$$

When designing Fermi Tub-FETs, Equation (47) should be applied to the longest channel $L_o$ possible. Under these circumstances, Tub-FETs with shorter channel length will have essentially the same drain saturation current for the same gate voltage. Very little is to be gained in terms of drive current by making short channel devices. Fermi Tub-FETs designed with 0.8 micron channel length or less have much higher drive current for a given gate voltage than MOS or MOS buried channel device designs at any channel length.

Figure 27:
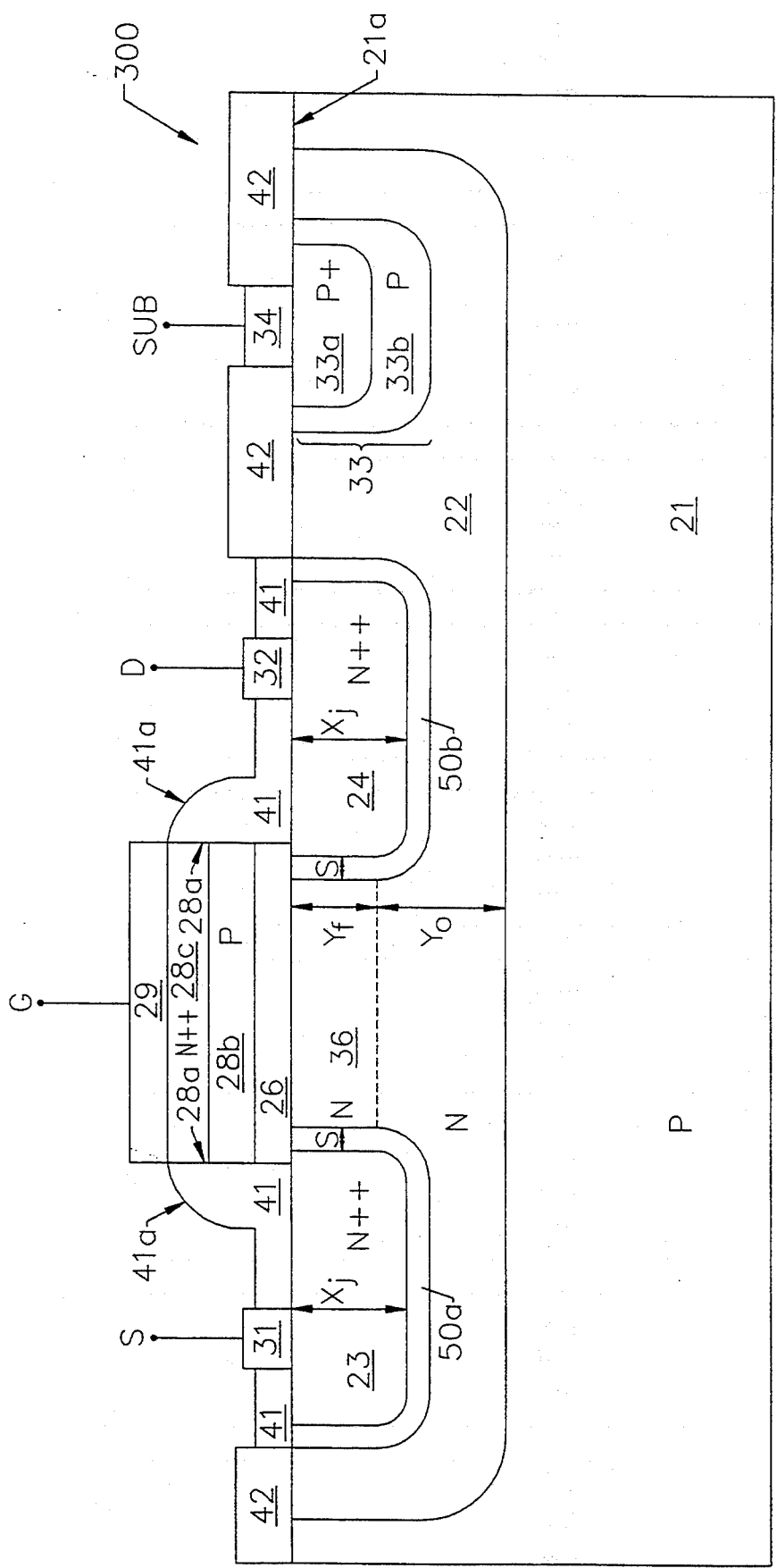
FIG. 27 illustrates a cross-sectional view of a second embodiment of an N-channel, high current, low leakage current, Fermi-FET according to the invention.

Referring now to FIG. 27, a second embodiment of a high saturation current Fermi-FET according to the present invention is illustrated. The high saturation current Fermi-FET 300 of FIG. 27 is similar to Fermi-FET 200 of FIG. 13 except that source doping gradient region 50a, and preferably drain doping gradient region 50b, are added between the source region 23 and the channel 36 and between the drain region 24 and the channel 36, respectively. The source doping gradient region 50a, and preferably the drain doping gradient region 50b, are doped at a doping gradient which decreases from the relatively high source/drain doping concentration adjacent the source and drain regions to the relatively low doping concentration of channel 36 adjacent channel 36.

It has been found, according to the invention, that the source doping gradient region 50a, and the drain doping region 50b, preferably have a thickness S of at least 300 Å in order to support high saturation current in the Tub-FET 300. Also preferably, as shown in FIG. 27, the gate insulating region 26 and the gate electrode 28 overlap the source and drain doping gradient regions 50a and 50b. As also shown in FIG. 27, source doping gradient region 50a and drain doping gradient region 50b preferably surround source 23 and drain 24, respectively.

The theoretical reasons as to why high saturation currents are provided When the source and drain gradient regions 50a and 50b respectively, exceed 300 Å in thickness will now be described. It will also be shown that when used with a source and drain gradient region, a minimum source and drain doping level is as already described in Equation (47) with a substitution of the source and drain depth $X_j$ rather than the Fermi channel depth $Y_f$, when the source and drain are deeper than the Fermi channel; i.e. when $X_j$ is greater than $Y_f$.

It has already been shown that high accumulation efficiency occurs with proper access to free charge stored in the diffusion gradient facing the Fermi-Tub channel region 36 between source and drain diffusions 23 and 24 respectively. At threshold, the Fermi-Tub region 22 may be completely depleted from the bottom to the substrate surface 21a facing the gate insulator as a result of the P-N junction between the Fermi-Tub 22 and substrate 21. Depleting the Fermi-Tub in this manner, eliminates any junction electric field from crossing the surface channel region 36 during majority carrier conduction.

The source/drain diffusion concentration $N_{do}$ and gradient depth S required to provide an adequate reservoir of charge at the edge of the diffusion in the depletion environment will now be determined. Given maximum gate voltage above threshold, an adequate charge reservoir will fill half the channel volume of length $L_o$ with sufficient majority carriers to achieve the limiting gate capacitance value $C_g^*$, where $C_g^*$ is defined as:

$$C_g^* = \frac{1}{\frac{T_{ox}}{e_i} + \frac{\delta}{2e_s}}$$

Where;

$T_{ox}$ = gate insulator 26 thickness
$\delta$ = carrier flow depth
$e_s$ = substrate 21 permittivity
$e_i$ = insulator 26 permittivity Referring to FIG. 27, when the gate electrode 29 is at threshold or below, the substrate-Tub junction completely depletes the Fermi-Tub region up to the gate insulator 26 and a portion of the perimeter of the doping gradient regions 50a, 50b facing the Fermi-Tub. The diffusion impurity concentration $N_{do}$ and gradient thickness S must be sufficient to prevent the entire diffusion gradient thickness S from being consumed during depletion. The following analysis develops a fundamental expression that defines the requirements for diffusion design to achieve maximum drain saturation current from the Fermi FET for a given maximum gate voltage.

Figure 28:
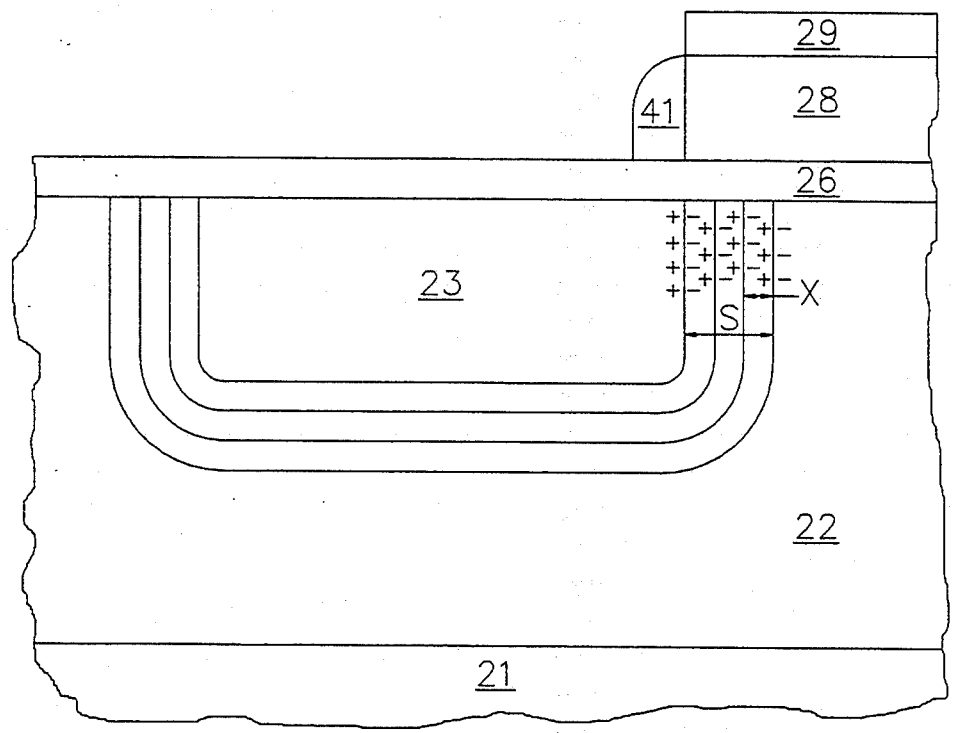
FIG. 28 illustrates an enlarged cross-sectional view of a portion of the Fermi-FET of FIG. 27.

FIG. 28 illustrates a diffusion perimeter whose concentration decreases discretely in steps from higher to lower concentration. This discrete model is useful in obtaining an expression for the diffusion design. FIG. 28 illustrates that a dipole charge configuration occurs at each step. Bound positive charge is due to depletion in the diffusion region, and that free negative charge is lightly bound to the step junction. Charge neutrality must be observed at each step junction. The gate 28 overlaps the doping gradient regions 50a, 50b as shown in the FIG. 28.

As a result of the Tub-substrate junction, the depletion penetration distance into the doping gradient distance S is defined as X in the FIG. 28. When depletion occurs, penetration distance X must be less than distance S. All free charge in distance X is unavailable for accumulation due to carrier diffusion across the substrate junction that is required to satisfy charge neutrality requirements there. Free charge is available in interval S-X to be accumulated within the surface channel when gate voltage is above threshold.

Figure 29:
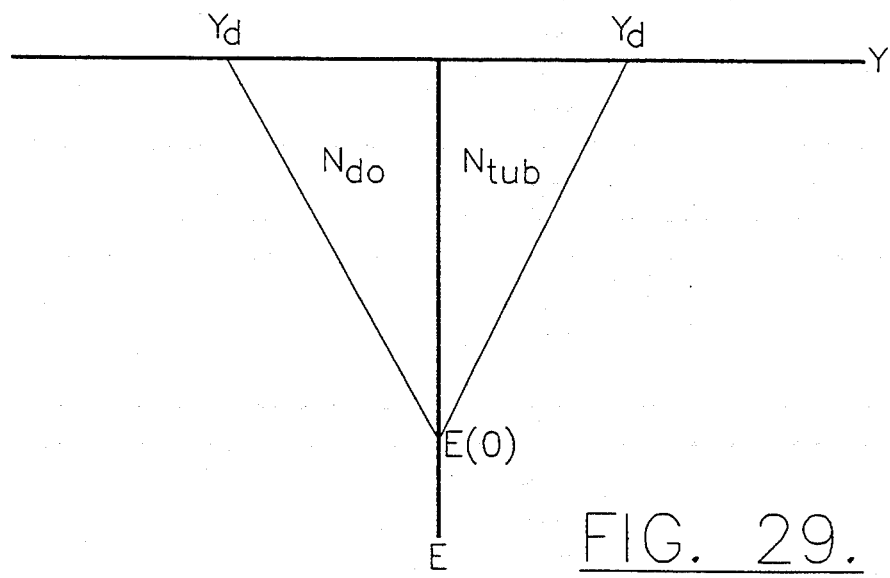
FIG. 29 graphically illustrates the total undepleted reservoir of distributed charge adjacent the source region of the Fermi-FET of FIG. 27.

The total undepleted reservoir of distributed charge can be calculated from an abrupt junction between the Tub and diffusion is shown in FIG. 29

$$Q_{total} = qN_{do}X_jZY_d \tag{48}$$

Where;
$X_j$ = depth of the source/drain diffusion 23/24
$Y_d$ = depletion depth in the diffusion
$Z$ = channel width
$N_{do}$ = maximum source/drain diffusion 23/24 concentration The total potential developed across the $N_{do}-N_{tub}$ junction is:

$$\phi_j = \frac{1}{2}(2Y_d)E(0) = \frac{KT}{q}\ln\left(\frac{N_{do}}{N_{ch}}\right) \tag{49}$$

Where;

$$E(0) = qN_{do}Y_{do}/e_s \tag{50}$$

Free charge is assumed to occupy the same depth $Y_d$. Combining Equations (49) and (50) produces:

$$\phi_j = \frac{qN_{do}}{e_s}Y_{do}^2 = \frac{KT}{q}\ln\left(\frac{N_{do}}{N_{ch}}\right) \tag{51}$$

Solving for $Y_{do}$:

$$Y_{do} = \sqrt{\frac{e_s\frac{KT}{q}\ln\left(\frac{N_{do}}{N_{ch}}\right)}{qN_{do}}} \tag{52}$$

Thus, the maximum available reservoir charge $Q_r$ is:

$$Q_R = X_jZ\sqrt{e_sqN_{do}\frac{KT}{q}\ln\left(\frac{N_{do}}{N_{ch}}\right)} \tag{53}$$

This total charge is distributed along thickness S of the doping gradient region. Therefore free charge density $N_{fc} = Y_{do}N_{do}/S$ exists along the doping gradient region thickness S. When the doping gradient is depleted by distance X, FIG. 28, as a result of depletion within the Tub from the Tub-substrate P-N junction, the reservoir of free charge $Q_r$ left available to fill half of the Fermi channel is:

$$Q_r = qZX_j\int_x^s N_{FC}dx \tag{54}$$

-continued

Where; $\int_0^s N_{FC}dx = Y_{do}N_{do}$.

Based on the definition of free charge density within the doping gradient, free charge $Q_r$ is:

$$Q_r = qN_{do}ZX_jY_{do}\frac{(S-X)}{S} \tag{55}$$

Substituting Equation (52) into Equation (55) a fundamental expression for the reservoir of free charge available to fill half the Fermi-channel may be found. Note that when drain and source voltage are both zero, the free charge in each doping gradient region of depth $X_j$ fills half the channel volume when gate voltage is above threshold. One should not depend on free charge at the bottom of the diffusion to fill the channel because of transit time considerations.

$$Q_r = \frac{Z(S-X)}{S}X_1\sqrt{qN_{do}e_s\frac{KT}{q}\ln\left(\frac{N_{do}}{N_{tub}}\right)} \tag{56}$$

Equating the reservoir of free charge $Q_r$ to that required to fill half of the channel $L_o/2$ given $(Vg-Vt)$ at the maximum value, yields:

$$\frac{Z(S-X)}{S}X_1\sqrt{qN_{do}e_s\frac{KT}{q}\ln\left(\frac{N_{do}}{N_{tub}}\right)} = \tag{57}$$

$$C_g^*(V_{gmax}-V_t)\frac{L_o}{2}Z$$

Solving Equation (57) for gate capacitance per square cm $C_g^*$, a fundamental expression that defines gate capacitance is obtained:

$$C_g^* = \frac{2(S-X)X_j}{S(V_{gmax}-V_t)L_o}\sqrt{qN_{do}e_s\frac{KT}{q}\ln\left(\frac{N_{do}}{N_{tub}}\right)} \tag{58}$$

Next, penetration distance X into the doping gradient region thickness S as a result of depletion by the Tub-substrate P-N Junction will be determined. During the depletion process, charge must be conserved:

$$q\int_0^x N_d(x)dx = \sqrt{2e_s\phi_jqN_a\frac{N_{do}}{N_{do}+N_a}} \tag{59}$$

For purposes of this analysis, the doping gradient region is assumed to be linear in X i.e.:

$$N_d(x) = \frac{N_{do}-N_{tub}}{S}X + N_{tub} \tag{60}$$

and $$\phi_j = \frac{KT}{q}\ln\left(\frac{N_{do}N_a}{N_i^2}\right) \tag{61}$$

Substitution of Equation (60) into Equation (59) produces:

$$q \int_0^x \left( \frac{N_{do} - N_{tub}}{S} x + N_{tub} \right) dx = \sqrt{2e_s\phi_j q N_a \frac{N_{do}}{N_{do} + N_a}} \quad (62)$$

The solution yields a quadratic in x:

$$\frac{N_{do} - N_{tub}}{2SN_{tub}} x^2 + x - \sqrt{\frac{2e_s\phi_j q N_a}{q N_{tub}^2} \left( \frac{N_{do}}{N_{do} + N_a} \right)} = 0 \quad (63)$$

The solution for Equation (63) is:

$$x = \frac{SN_{tub}}{N_{do} - N_{tub}} \left[ \sqrt{1 + \frac{2(N_{do} - N_{tub})}{SN_{tub}} \sqrt{\frac{2e_s\phi_j N_a}{q N_{tub}^2} \left( \frac{N_{do}}{N_{do} + N_a} \right)}} - 1 \right] \quad (64)$$

Thus, Equation (64) is the solution for depletion penetration depth X into the doping gradient region. Note that X is a factor in Equation (58). Equation (64) is used in combination with Equation (58) to determine gate capacitance $C_g^*$, and therefore defines drain saturation current for the maximum anticipated gate voltage $V_{gmax}$. The proper source drain design is realized for a given channel-length $L_o$ when Equation (58) reaches maximum gate capacitance $C_{gmax}^*$.

It may be seen from this analysis that gate capacitance $C_g^*$ and drain saturation current $I_{sat}$ are very low if inadequate channel charge is available for a given gate voltage $V_g$ above threshold voltage $V_t$. This follows since $Q_{ch}^* = C_g^*(V_g - V_t)$ and $I_{sat} = C_g^*(V_g - V_t)V_L Z$.

Figure 30:
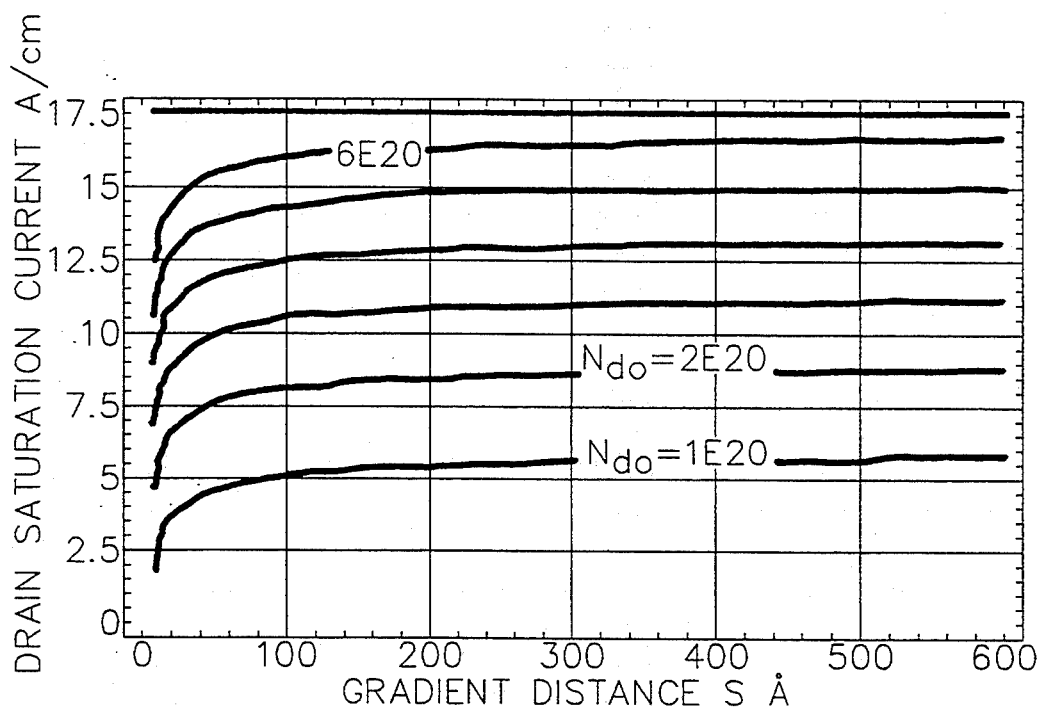
FIG. 30 graphically illustrates saturation current as a function of doping gradient region thickness for the Fermi-FET of FIG. 27.

FIG. 30 illustrates saturation current for an 0.8 micron N-Channel Fermi-FET with 50 Å silicon dioxide or 100 Å silicon nitride gate insulator thickness plotted as a function of doping gradient region thickness S in Ångstrom units. Source/drain doping concentration $N_{do}$ is the running parameter with 1500 Å source/drain depth in all cases. It is significant to note that saturation current is virtually independent of gradient distance S greater than 300 Å, irrespective of the concentration $N_{do}$ of the diffusion. It is also shown that saturation current increases as diffusion concentration increases.

Figure 31:
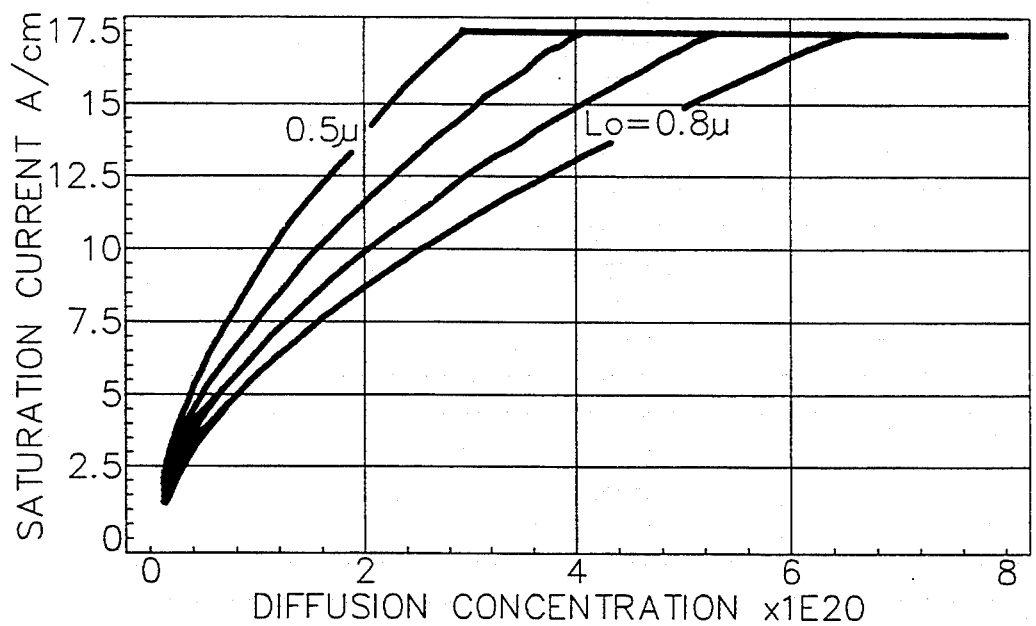
FIG. 31 graphically illustrates saturation current as a function of source/drain doping concentration for the Fermi-FET of FIG. 27.
Figure 32:
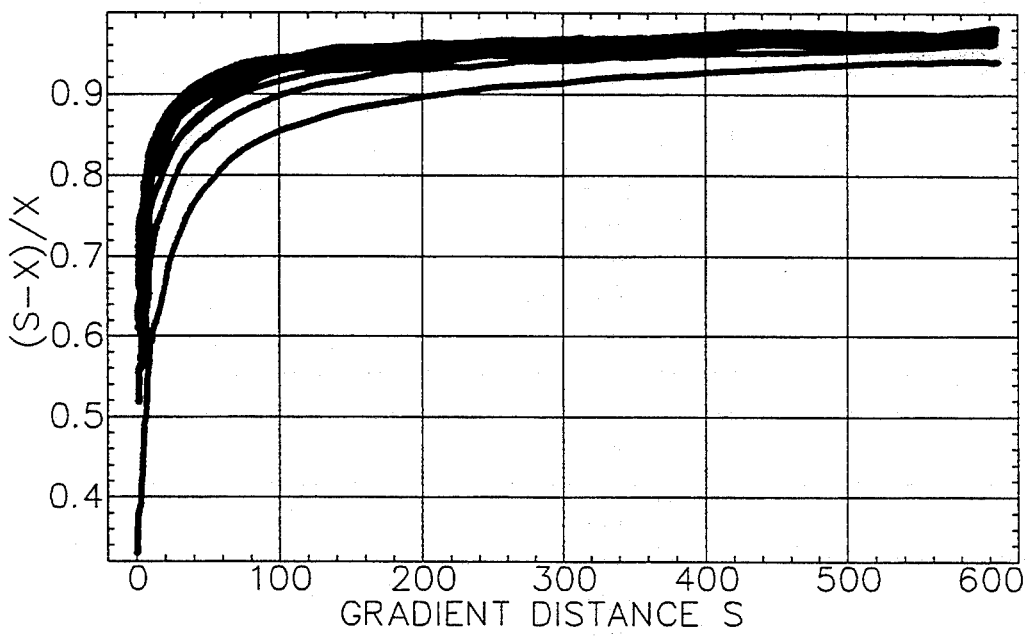
FIG. 32 graphically illustrates doping gradient region distance versus source/drain diffusion depth for the Fermi-FET of FIG. 27.

FIG. 31 illustrates saturation current for the same structure plotted as a function of source/drain doping concentration given doping gradient region thickness S=300 Å or greater. Channel length $L_o$ is running parameter in FIG. 31. It is shown that saturation current reaches a maximum value of about 17 A/cm given a gate voltage of 5 volts and a threshold voltage of 0.8 volts. Source/drain doping concentration above a critical value does not increase saturation current since the maximum value for gate capacitance $C_g^*$ has been achieved. Thin gate insulators place the highest demands on source/drain doping concentration to achieve maximum saturation current consistent with the chosen insulator thickness. Shortening the channel length of Fermi-FET devices relaxes the source/drain doping concentration requirements for the same maximum current. There is no other significant reason to shorten the channel length of a Fermi-FET.

Equation (58) is identical to Equation (47) with the exception that diffusion depth $X_j$ takes the place of Fermi depth $Y_f$ and (S-X)/S=0.95 if S>300 Å. See Equation (32). Therefore, the minimum diffusion concentration required to reach maximum current is identical to Equation (47) with $X_j$ substituted for $Y_f$. Diffusion depth $X_j$ may be used in place of Fermi depth $Y_f$ for all cases where $X_j > Y_f$.

Fermi-FET with Reduced Threshold Voltage

Figure 17:
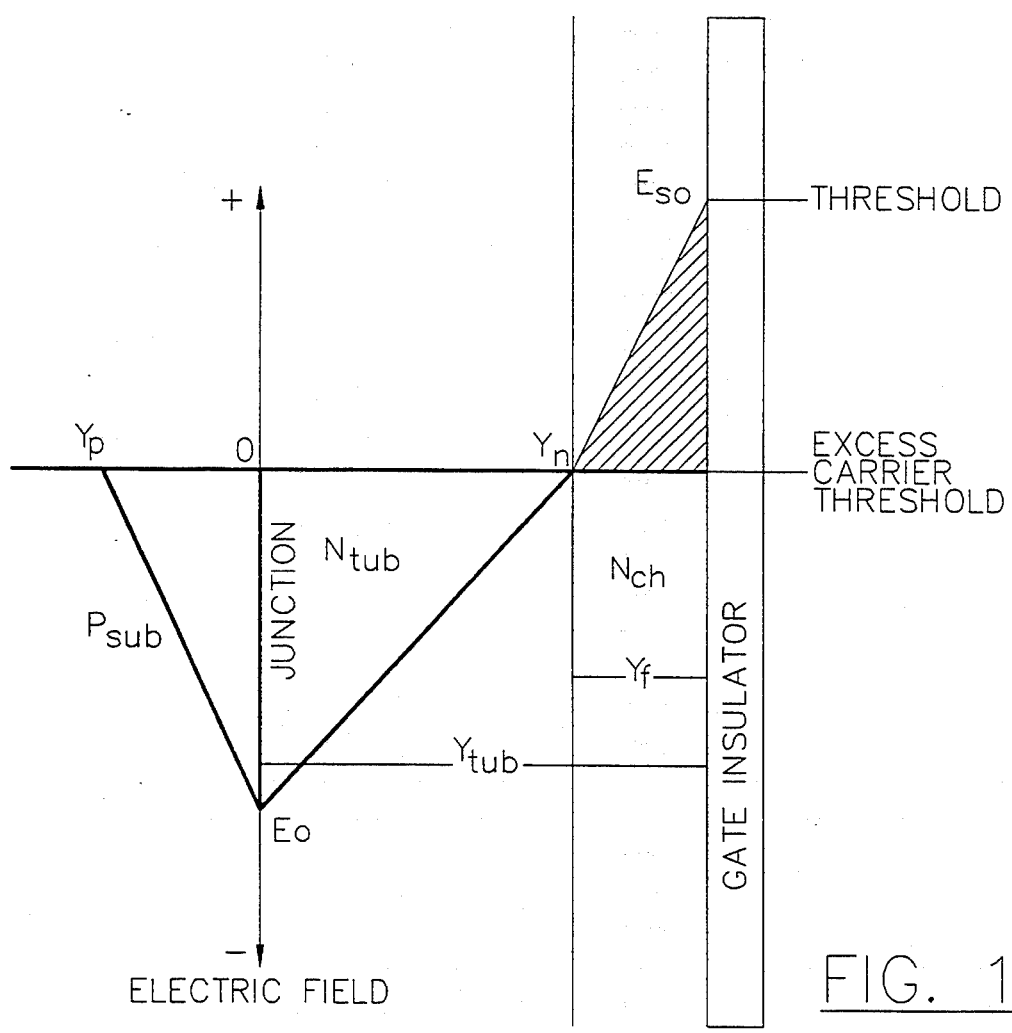
FIG. 17 graphically illustrates an electric field diagram for the transistor of FIG. 13 at threshold.

Referring again to FIG. 13, channel 36 of Fermi-FET 200 has depth $Y_f$, typically about 600 Å–700 Å, and a doping concentration $N_{ch}$ per cubic centimeter. FIG. 17 illustrates the perpendicular electric field diagram for the structure of FIG. 13. The Tub depth $Y_{tub}$ is defined by the following equation:

$$Y_{tub} = Y_o + Y_f \quad (65)$$

where;

$$Y_o = \sqrt{\frac{2e_s\phi_j N_{sub}}{q N_{tub}(N_{sub} + N_{tub})}} \quad ; \text{and} \quad (66)$$

$$\phi_j = \frac{KT}{q} \ln\left( \frac{N_{tub} N_{sub}}{N_i^2} \right) \quad (67)$$

where:
$N_{sub}$ = Substrate impurity concentration
$N_{tub}$ = Tub impurity concentration
$N_i$ = Intrinsic carrier concentration
$e_s$ = Permittivity of substrate material
KT/q = 26 millivolts at room temperature The depth $Y_p$ of the depletion region in the substrate 21 is expressed as:

$$Y_p = Y_n N_{tub}/N_{sub}. \quad (68)$$

Referring to FIG. 17, at threshold, the channel region $Y_f$ is depleted when gate voltage $V_g = V_t$. At excess carrier threshold, $V_g > V_t$, the channel is charge neutral and the perpendicular electric field from the substrate-Tub junction remains zero across the channel region independent of the density of excess conduction carriers accumulated there as gate voltage increases above the excess carrier threshold $V_{tec}$. The expression that defines excess carrier threshold $V_{tec}$ is:

$$V_{tec} = \frac{KT}{q} \ln\left( \frac{N_{pol} N_{tub}}{N_i^2} \right) \quad (69)$$

Where, $N_{pol}$ is the doping concentration in the polysilicon gate 28b at the polysilicon gate-insulator interface.

Threshold voltage $V_t$ is defined as follows:
$$V_t = V_{tec} - V_{comp} \quad (70)$$

where compensation voltage $V_{comp}$ is the sum of the surface Potential loss $\phi_s$, the shaded triangle FIG. 17, and a potential developed across the gate insulator $V_{ox}$:

$$\phi_s = \frac{qN_{ch}}{2e_s} Y_f^2; \text{ and} \quad (71)$$

$$V_{ox} = \frac{qN_{ch}}{e_i} Y_f T_{ox} \quad (72)$$

Thus, the final expression for threshold voltage can be written as:

$$V_t = \frac{KT}{q} \ln\left(\frac{N_{pol}N_{tub}}{N_i^2}\right) - qN_{ch}Y_f\left(\frac{Y_f}{2e_s} + \frac{T_{ox}}{e_i}\right) \quad (73)$$

Equation (73) shows that threshold voltage can be modified from the basic term $V_{tec}$, Equation (52), by the depth $Y_f$ of the channel and channel impurity concentration $N_{ch}$. Insulator thickness has a secondary effect. Note the basic threshold voltage term $V_{tec}$ can be controlled by the doping concentration $N_{POL}$ in the polycrystalline silicon gate.
Thus:

$$\Delta V_t = -qN_{ch}Y_f\left(\frac{Y_f}{2e_s} + \frac{T_{ox}}{e_i}\right) \quad (73a)$$

Where:
$\Delta V_t$ = the change in threshold voltage from twice the Fermi potential It is appropriate to confine the channel depth $Y_f$ to a fixed value, approximately 600 Å, independent of the implanted impurity concentration $N_{ch}$. It has been shown in the previous section that channel depth $Y_f$ is also one factor that determines drain saturation current. Fixing the value of channel depth $Y_f$ allows independent control of saturation current and threshold voltage. In order to achieve very high drive currents, the doping concentration $N_{ch}$ in the Fermi-channel $Y_f$, should be less than 5E16/cm³. Otherwise carrier mobility rapidly decreases below the value required to support high drive current at 5 V.

Figure 18:
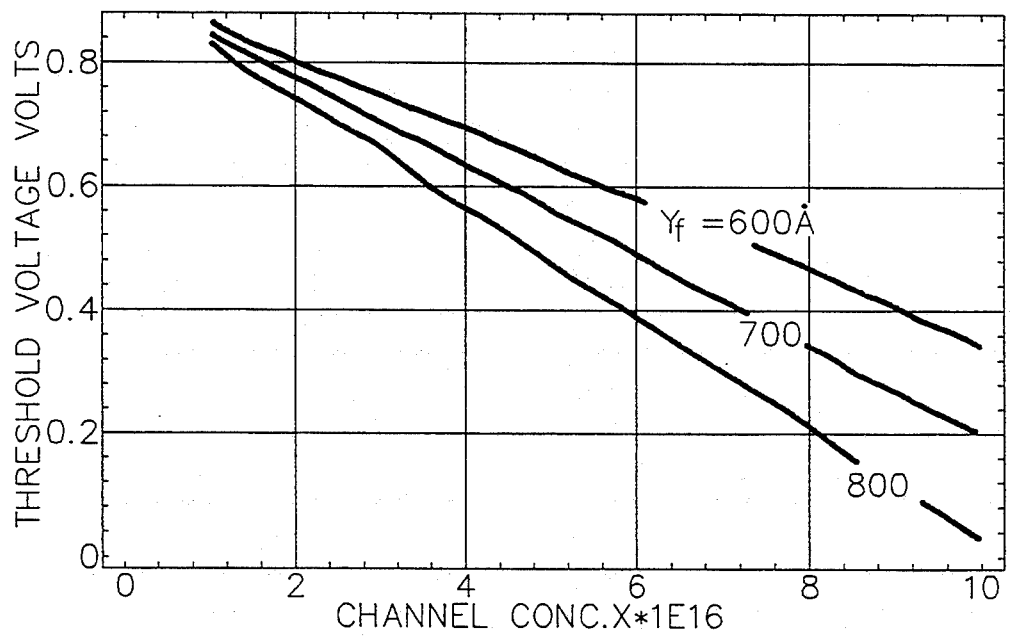
FIG. 18 graphically illustrates lowering of threshold voltage by increasing the doping concentration in the channel of the transistor of FIG. 13.

FIG. 18 is a plot of Equation (73) for $T_{ox}$=100 Å, $N_{pol}$=2E19, and $N_{tub}$=2E16. The abscissa is channel concentration. The ordinate is threshold voltage. The three running parameters are channel depth, 600 Å, 700 Å, and 800 Å. From Equation (73), threshold voltage is independent of substrate concentration $N_{sub}$. However, the depth of the Tub does depend on substrate concentration as per Equation (66), and threshold, twice the Fermi potential of the substrate, is set when the product $N_{tub} \cdot N_{poly}$ equal $N_{sub}^2$.

Thus, as illustrated in FIG. 18, threshold voltage can be lowered by increasing the doping concentration in the channel, or conversely, increased by lowering channel concentration. Lowering threshold voltage may be desirable if operation is contemplated at 3.3 Volts or less. Sub-threshold threshold differs from threshold voltage by twice the Fermi potential of the channel, 2 KT/q [$\ln(N_{ch}/N_i)$]. This is the voltage difference between points A and B of FIG. 11.

Leakage current is very sensitive to threshold voltage. A typical sub-threshold slope is 90 mV per decade. For minimum sub-threshold leakage current, sub-threshold threshold should occur when gate voltage is zero or slightly positive. Sub micron channel length FET devices suffer in the sub-threshold region (zero gate volt region). The voltage difference between sub-threshold threshold and threshold conditions is typically 790 mV. If a short channel device requires a 400 mV threshold voltage, for example, the zero gate voltage leakage will be about 5 decades above 1E-13 A/micron or about 1E-8 A/micron in value. This leakage current is too high to be acceptable for VLSI technology.

Accordingly, the threshold voltage of a Fermi-FET may be lowered, while still maintaining zero static electric field perpendicular to the substrate surface at the depth of the Fermi channel, by choosing a channel and tub depth which provides zero perpendicular static electric field and by providing a channel doping concentration which is greater than that specified in Equation (73). It will be understood by those having skill in the art that channel doping concentration cannot be increased indefinitely. In particular, at channel concentrations above about $5 \times 10^{16}$, carrier mobility begins to drop and the saturation current of the device begins to drop. However, channel doping concentration may be increased from that doping concentration which produces a threshold voltage which is twice the Fermi potential up to about a concentration of $5 \times 10^{16}$, to lower the threshold voltage of the Fermi-FET device when this is deemed necessary or desirable.

It will also be understood by those having skill in the art that for a given Fermi channel depth, such as 600 Å, the threshold voltage and the saturation current may be adjusted independently. Saturation current may be adjusted by increasing the doping concentration of the source and drain diffusions adjacent the channel as described in the previous section. Threshold voltage may be adjusted independently by increasing the doping concentration of the channel. Thus, independent control is provided.

Comparison of MOSFET and Fermi-FET

In any prior art FET device, with the exception of the Fermi-FET technology, there is a perpendicular field in addition to the lateral field that traverses the channel. The lateral electric field $E_l$ is due to drain to source potential directed along the channel between the source and drain. The perpendicular field in MOS devices originates from immobile charge developed in the depleted substrate region below the gate insulator when gate voltage reaches the threshold value. This perpendicular electric field crosses the inverted minority carrier MOS channel region and is a consequence of creating the inversion layer.

The Fermi-FET technology transports majority carriers in a Fermi-channel whose doping type is the same as the Fermi-Tub and the source and drain regions. Fermi-FET design precludes any perpendicular electric field from crossing the channel during excess majority carrier flow between the source and drain, other than that produced by the majority carriers themselves.

This section describes a closed form expression for FET drain saturation current that includes the influence of both lateral and intrinsic perpendicular electric fields. It will be demonstrated that large values of drain saturation current, greater than 7 A/cm for N-channel devices and 4 A/cm for P-channel devices, while maintaining low leakage current of about 1E-13 A/micron or less, can only be achieved by Fermi-FET designs that eliminate the perpendicular electric field component. A Fermi-FET conducts by accumulation and is shut off by inversion. A MOSFET conducts by inversion and is shut off by accumulation. The difference in potential between inversion and accumulation is twice the Fermi potential of the channel region in both cases.

It has been shown in Equation (41) that saturation current of any FET device can be described by the following fundamental equation:

$$I_{sat} = C_g^* (V_g - V_t) V_L Z \cos \theta \qquad (74)$$

Where;
$C_g^*$ = Gate capacitance/cm² due to mobile charge
$V_g$ = Gate voltage
$V_t$ = Threshold voltage
$V_L$ = Lateral Velocity
$Z$ = Channel width
$\theta$ = Angle between the vector field and lateral direction of carrier flow.

Equation (74) does not explicitly reveal the effects of channel length $L_o$. Equation (74) was derived with the benefit of a first principle notion that charge is the product of capacitance and Voltage i.e. $Q=CV$, and that current is $dQ/dt$.

There are three fundamental parameters in Equation (74), other than gate voltage $V_g$ and threshold voltage $V_t$, that determine the magnitude of current flow. These parameters are gate capacitance $C_g^*$, lateral velocity $V_L$ and angle $\theta$. The lateral velocity term accounts for the roles of carrier mobility $U_x$, channel length $L_o$, saturation velocity $V_{sat}$ and gate voltage $V_g$ in determining the transconductance character of drain saturation current. The perpendicular electric field regulates angle $\theta$. The gate capacitance term $C_g^*$ applies only to mobile charge and accounts for the effects of insulator thickness and carrier flow depth that control the maximum amount of charge that can flow in the channel per unit gate voltage.

In MOSFETs, there is a substantial immobile charge below the gate when gate voltage reaches threshold. This charge resides in the depleted substrate region below the gate and is necessary to create the minority carrier inversion layer. There is a gate capacitance $C_{go}^* = Q_{im}/V_t$ associated with this immobile charge $Q_{im}$. There is also a gate capacitance factor $C_{gmax}^*$ that accounts for mobile charge flowing in the channel:

$$C_{gmax}^* = \frac{1}{\frac{T_{ox}}{e_i} + \frac{\delta}{2e_s}} = \frac{2e_s e_i}{2e_s T_{ox} + \delta e_i} \qquad (75)$$

where;
$T_{ox}$ = Depth of the gate insulator
$\delta$ = Mobile carrier flow depth
$e_i$ = Permittivity of the gate insulator
$e_s$ = Permittivity of the semiconductor For a given gate voltage above threshold, the total charge supported by the MOS gate is:

$$Q = [C_{go}^* V_t + (C_{gmax}^*)(V_g - V_t)] A \qquad (76)$$

Where $C_{go}^* \approx e_i/(2T_{ox})$, and
Mobile charge is the second term of Equation (76).

Total gate capacitance for the Fermi-FET is only $C_{gmax}^*$ when gate voltage is above threshold. Only mobile charge is in the channel region. The rate of change of gate capacitance for the MOS device is positive for gate voltage rising from ground to threshold voltage while negative for the Fermi-FET. This property of the Fermi-FET provides for excellent noise rejection in high speed digital systems.

Figure 19:
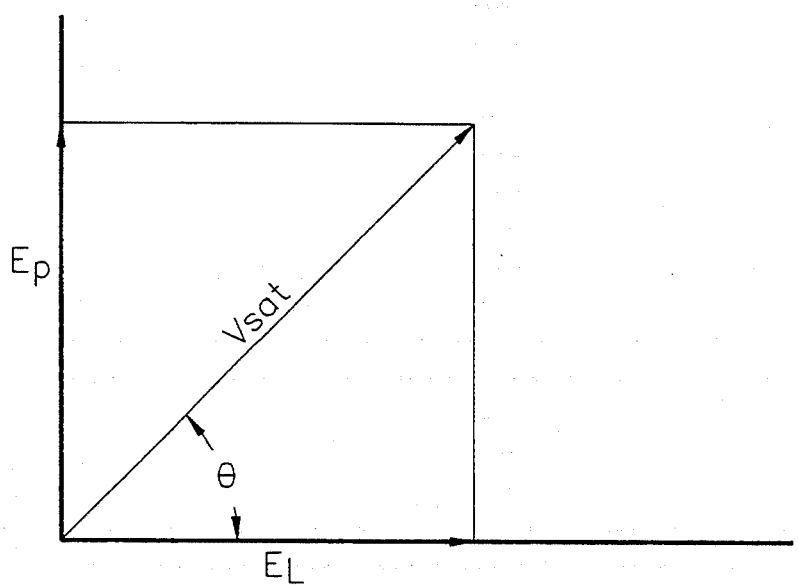
FIG. 19 graphically illustrates saturation velocity in a field effect transistor as a vector quantity.

A closed form expression for lateral mobility that includes the influence of the perpendicular electric field $E_p$ will now be derived. The expression is based upon the realization that saturation velocity is a vector quantity. This fundamental realization suggests that drift velocity can only reach the thermal saturation value in the vector field direction. Since there cannot be a net perpendicular component of velocity in the FET channel, other than hot electrons, the effects of the perpendicular field produce a dampening effect on the lateral component of velocity. The damping factor is $\cos \theta$ where $\theta$ is the angle between the vector field direction and the channel flow direction. Lateral velocity, that gives rise to drain current in FET devices, is thus $V_l \cos \theta$ where $\theta$ is the angle between the vector field and the lateral field component. This is illustrated by FIG. 19.

Lateral mobile dependence on lateral field effects is known. Equation (77a) defines lateral mobility of excess electrons and Equation (77b) defines lateral mobility for holes.

$$\mu_{ln} = \frac{\mu_{no}}{\sqrt{1 + \left(\frac{E_l}{E_c}\right)^2}} \qquad (77a)$$

$$\mu_{lp} = \frac{\mu_{po}}{1 + \frac{E_l}{E_c}} \qquad (77b)$$

Lateral velocity is the product of lateral field $E_l$ and lateral mobility $\mu_l$. $E_l$ is the lateral drain field, at the source end of the channel in an excess carrier environment, due to pinch-off voltage, and $E_c$ is the critical lateral field where for example, hole mobility is half its low field value. Thus, $$E_c = \frac{V_{sat}}{\mu_o} \qquad (78)$$

Where
$\mu_o$ is the low field mobility of the doped semiconductor; and
$V_{sat}$ is thermal saturation velocity at temperature T.

Equation (78) is true in the vector direction as well as the lateral direction.

Equations (77a) and (77b) must be modified to reflect true lateral mobility in the channel by including the effects of the perpendicular field crossing the channel. The lateral component of mobility and velocity is simply the value in the vector direction multiplied by $\cos \theta$. Using the following definitions:

$$\cos \theta = \frac{1}{\sqrt{1 + \tan^2 \theta}} \qquad (79)$$

and $$\tan \theta = E_p/E_l, \qquad (80)$$

$\cos \theta$ has the following solution in terms of the perpendicular and horizontal electric field components in the channel region:

$$\cos(\theta) = \frac{1}{\sqrt{1 + \left(\frac{E_p}{E_H}\right)^2}} \qquad (81)$$

Using Equation (78) we can modify Equations (77a) and (77b) to reflect true lateral mobility in the channel:

$$\mu_{Ln} = \frac{\mu_{no}}{\sqrt{1 + \left(\frac{E_p}{E_H}\right)^2}\sqrt{1 + \left(\frac{E_l}{E_c}\right)^2}} \quad (82)$$

$$\mu_{Lp} = \frac{\mu_{po}}{\left(1 + \frac{E_l}{E_c}\right)\sqrt{1 + \left(\frac{E_p}{E_H}\right)^2}} \quad (83)$$

Since lateral velocity is the product of lateral field and lateral mobility, general expressions for lateral velocity for both holes and electrons may be written as follows:

$$V_{Ln} = \frac{\mu_{no}E_l}{\sqrt{1 + \left(\frac{E_l}{E_c}\right)^2}\sqrt{1 + \left(\frac{E_p}{E_H}\right)^2}} \quad (84a)$$

$$V_{LP} = \frac{\mu_{po}E_l}{\left(1 + \frac{E_l}{E_c}\right)\sqrt{1 + \left(\frac{E_p}{E_H}\right)^2}} \quad (84b)$$

In general, lateral velocity for holes and electrons can be expressed as:

$$V_{Ln} = \frac{\mu_{no}E_l \cos\theta}{\sqrt{1 + \left(\frac{E_l}{E_c}\right)^2}} \quad (84c)$$

$$V_{Lp} = \frac{\mu_{po}E_l \cos\theta}{1 + \left(\frac{E_l}{E_c}\right)} \quad (84d)$$

Where:

$$E_l = \frac{V_g - V_t}{2L_o}$$

is the lateral field due to drain pinch-off;

$$E_p = \sqrt{\frac{4\phi_f q N_{sub}}{e_s}}$$

is the perpendicular field required to support MOS inversion;

$$E_p = \frac{V_t C_i^*}{e_s} \text{ for } N_{sub} = \left(\frac{V_t e_i}{T_{ox}}\right)^2 \frac{1}{4\phi_f e_s q}$$

$$E_{cp} = \frac{V_{satp}}{\mu_{po}};$$

$$E_{cn} = \frac{V_{satn}}{\mu_{no}};$$

$E_h = V_{dd}/L_o$ is the lateral field due to drain voltage;
$N_{sub}$=Substrate concentration, $N_i$ for Fermi FET;

$$\phi_f = \frac{KT}{q} \ln\left(\frac{N_{sub}}{N_i}\right) \text{Fermi Potential;}$$

$$\theta = \text{Tan}^{-1}\left(\frac{E_p}{E_H}\right);$$

$L_o$=Channel length
$V_{dd}$=Supply voltage

Figure 20A:
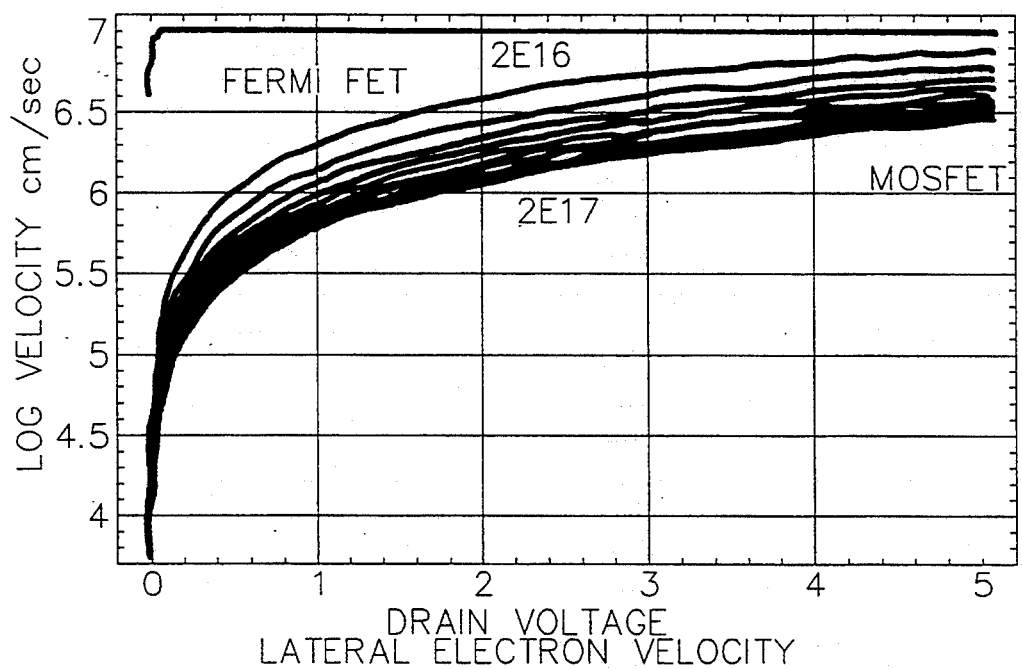
FIGS. 20A and 20B graphically illustrate maximum lateral velocity for electrons and holes, respectively.
Figure 20B:
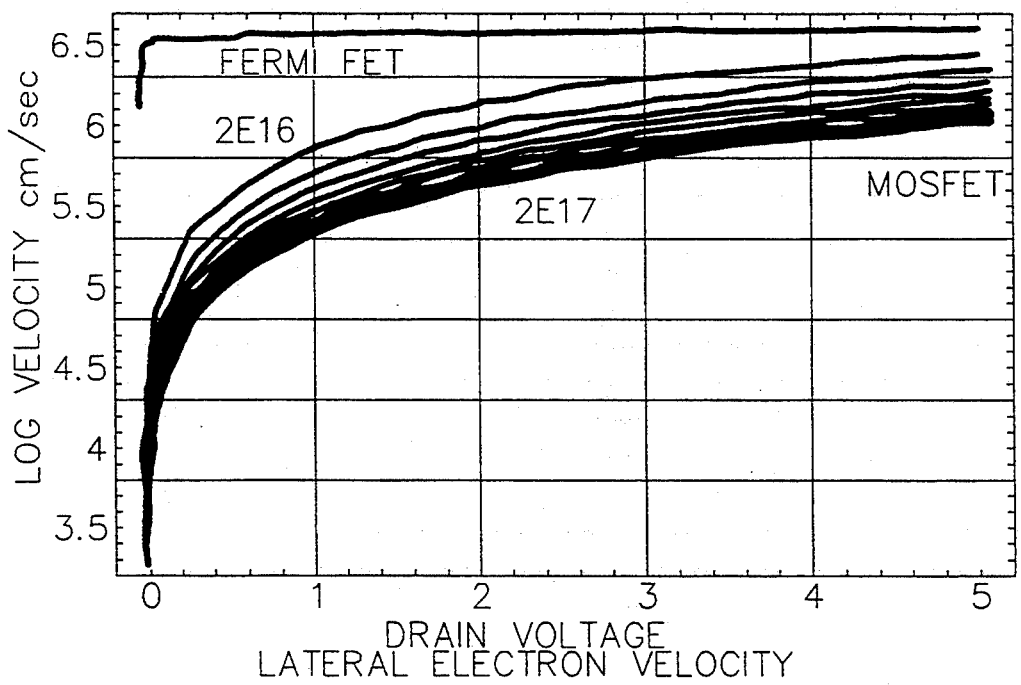

Using Equations (84a) and (84b), FIGS. 20A and 20B are plots of maximum lateral velocity for electrons and holes, respectively. Velocity in both cases is plotted as a function of drain voltage, (electric field=$V_d/L_o$), and substrate concentration $N_{sub}$ in the range 2E16 to 2E17 for the MOS device and $N_{sub}=N_i$ for the Fermi FET. As shown, that lateral electron velocity reaches almost the saturation value for the Fermi-FET when gate voltage is 5 Volts. All excess carrier flow is below the surface and therefore the perpendicular field produced by the MOS device has nearly the maximum value $E_p$ across the carrier flow depth $\delta$.

In both FIGS. 20A and 20B, lateral majority carrier velocity in the Tub-FET reaches the maximum value and is the result of no perpendicular electric field across the channel. The other curves correspond to MOS devices with substrate doping concentrations in the range of 2E16 to 2E17 that produce perpendicular electric field at threshold and above. For the minority carrier MOS structure, the perpendicular field is needed to create the inversion mechanism. Angle $\theta$ is affected by drain voltage, not pinch-off voltage. It is for this reason that MOS device drain saturation current is less than half the Tub-FET value.

Figure 21A:
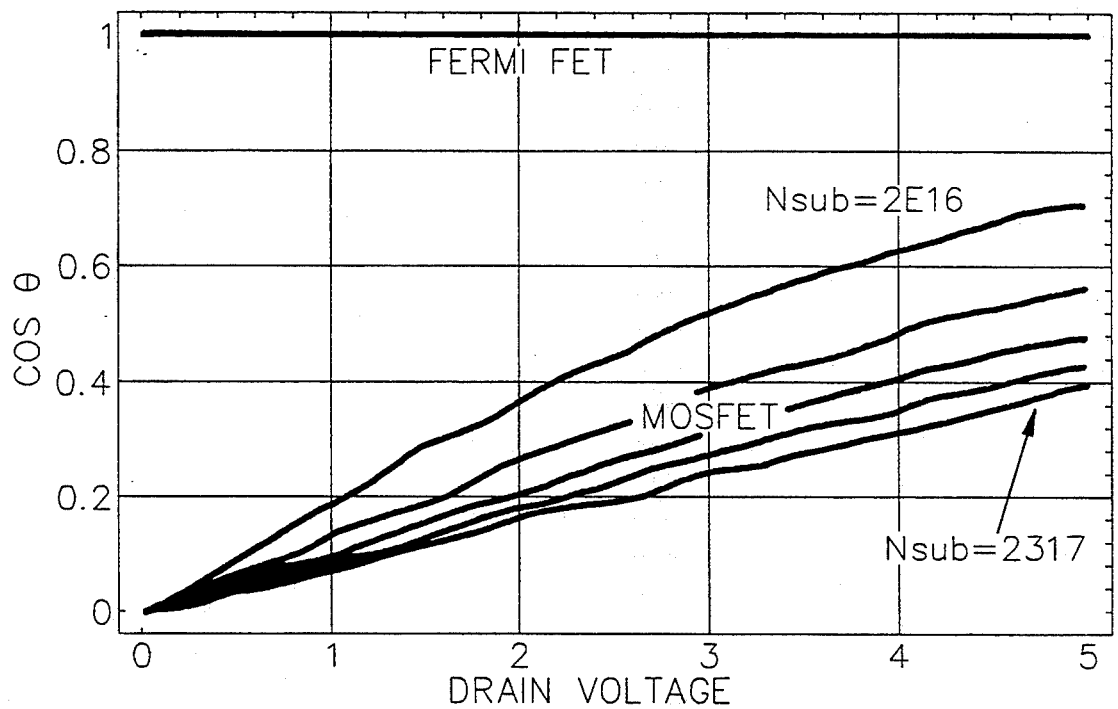
FIGS. 21A and 21B illustrate the cosine factor for the conditions of FIGS. 20A and 20B respectively.
Figure 21B:
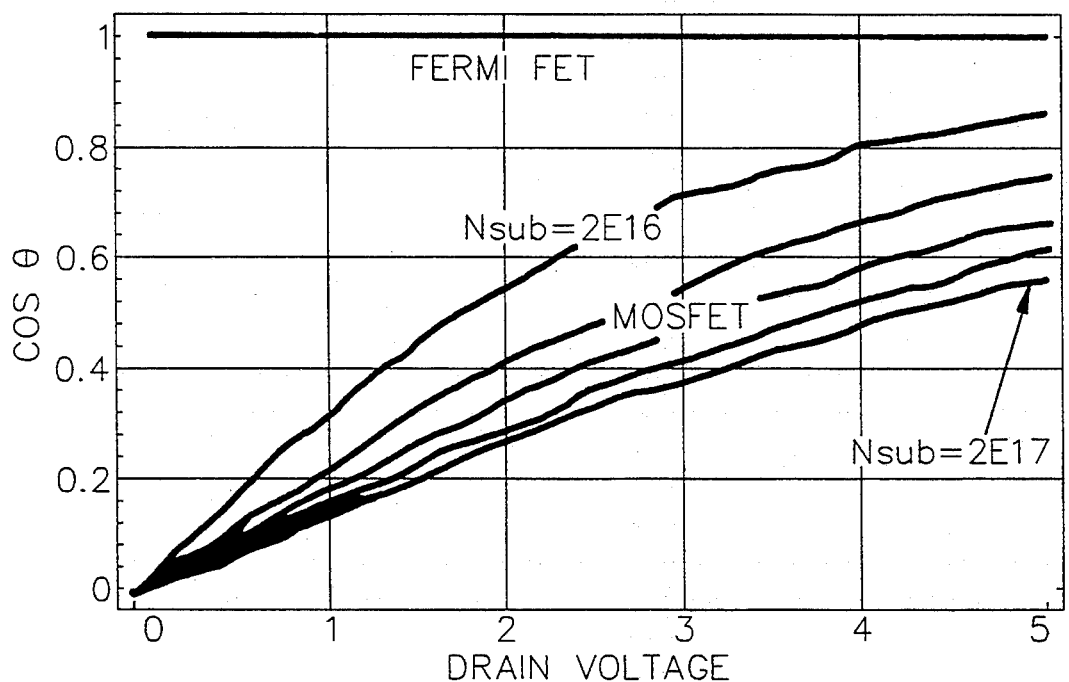

FIGS. 21A and 21B illustrate the factor $\cos\theta$ for the conditions given above. Channel length $L_o$ is 0.8 micron for FIG. 21A and is 0.5 micron for FIG. 21B. In both cases $\cos\theta$ has a maximum value of 1.0 only for the Fermi FET. Since drain saturation current $I_{sat}=C_g^*(V_g-V_t)V_lZ \cos\theta$, the Fermi FET realizes the maximum drive current capabilities.

For MOS devices, there is a relationship between perpendicular field $E_p$ and threshold voltage $V_t$. Both quantities involve substrate doping concentration. This relationship will now be derived so that drain saturation current for the MOS device can be compared with the Fermi-FET value.

The sum of potential taken along a contour from the center of the gate electrode to the substrate contact of an N-channel MOS device is given below:

$$V_g = V_{ox} + \phi_s - \frac{KT}{q} \ln\left(\frac{N_{sub}N_{poly}}{N_i^2}\right) - DFTL \quad (85)$$

where:
$\phi_s$ is the rise in potential in the perpendicular direction across the substrate region below the gate;
$N_{sub}$=substrate concentration;
$N_{poly}$=doping concentration in the polygate;
DFTL=potential drop across the gate insulator at the source end of the channel due to the perpendicular component of the drain field;
$V_{ox}$=potential developed across the gate insulator due to a perpendicular electric field.

If a P-type polycrystalline silicon gate is used, the solution for a P-channel device is identical to Equation (85), except for polarity of terms. Using the divergence theorem and Poisson's equation, expressions for $V_{ox}$ and $\phi_s$ are given below:

$$V_{ox} = \frac{e_s}{e_i} E_s T_{ox} \pm \left( q T_{ox} \frac{N_{tc}}{C_i} \right) \quad (86a)$$

where $E_s$, is the perpendicular surface electric field in the substrate below the insulator.

$$E_s = \frac{qN_{ch}\delta}{e_s} + \frac{qN_{sub}Y_i}{e_s} \quad (86b)$$

and $N_{tc}$ is the volume density of trapped charge in the gate insulator. The positive sign in Equation (86a) applies to trapped electrons. Substitution gives:

$$V_{ox} = \frac{T_{ox}}{e_i} [qN_{ch}\delta + qN_{sub}Y_i \pm qN_{tc}T_{ox}] \quad (87)$$

where
$C_i$=insulator capacitance $e_i/T_{ox}$.
$\delta$=carrier flow depth
$Y_i$=Substrate depletion depth under the gate The factors $qN_{ch}\delta$, $qN_{sub}Y_i$ and $qN_{tc}T_{ox}$ can be written in terms of charge density as follows.
$qN_{ch}\delta = Q_{ch}^*$, Channel charge density
$qN_{sub}Y_i = Q_{sub}^*$, Substrate depletion charge density
$qN_{tc}T_{ox} = Q_{tc}^*$, Density of trapped charge in gate insulator.

Substituting these expressions into Equation (87) and collecting terms yields the following expression for oxide potential drop $V_{ox}$:

$$V_{ox} = \frac{T_{ox}}{e_i} [Q_{ch}^* + Q_{sub}^* \pm Q_{tc}^*] \quad (88)$$

Surface potential $\phi_s$ has the following expression:

$$\phi_s = Q_{ch}^* \frac{\delta}{2e_s} + Q_{sub}^* \frac{Y_i}{2e_s}. \quad (89)$$

Based on the above definitions for $V_{ox}$ and $\phi$, the expression for gate voltage, Equation (85) can be expanded:

$$V_s = Q_{ch}^* \left[ \frac{T_{ox}}{e_s} + \frac{\delta}{2e_s} \right] + Q_{sub}^* \left[ \frac{T_{ox}}{e_i} + \frac{Y_i}{2e_s} \right] + \quad (90)$$

$$Q_{tc}^* \frac{T_{ox}}{e_i} - \frac{KT}{q} \ln \left( \frac{N_{sub}N_{poly}}{N_i^2} \right) - DFTL$$

The first voltage term in Equation (90) is due to mobile charge. The second and third terms are due to immobile charge in the substrate and trapped charge in the gate insulator respectively. The final terms are flatband voltage and a voltage developed across the insulator due to a perpendicular component of the drain field. This effect is called DFTL, Drain Field Threshold Lowering.

From Equation (90) threshold voltage is:

$$V_t = Q_{sub}^* \left[ \frac{T_{ox}}{e_i} + \frac{Y_i}{2e_s} \right] \pm Q_{tc}^* \frac{T_{ox}}{e_i} - \quad (91)$$

$$\frac{KT}{q} \ln \left( \frac{N_{sub}N_{poly}}{N_i^2} \right) - DFTL$$

When hard inversion occurs, the depth of the depletion region below the insulator is:

$$Y_i = \sqrt{\frac{4\phi_f e_s}{qN_{sub}}} \quad (92)$$

Using Equation (92) and the definition for charge density, the following expression defines threshold voltage:

$$V_t = \frac{1}{C_i} \sqrt{4\phi_f e_s q N_{sub}} + 2\phi_f \pm \frac{qN_{tc}T_{ox}^2}{e_i} - \quad (93)$$

$$\frac{KT}{q} \ln \left( \frac{N_{sub}N_{poly}}{N_i^2} \right) - DFTL$$

Since $2\phi_f = KT/q \ln(N_{sub}/N_i)^2$ and $DFTL = V_d e_s T_{ox}/2L_o e_i$, substitution yields:

$$V_t = \frac{1}{C_i} \left[ \sqrt{4\phi_f e_s q N_{sub}} \pm qN_{tc}T_{ox} - \frac{V_d e_s}{\alpha L_o} \right] - \quad (94)$$

$$\frac{KT}{q} \ln \left( \frac{N_{poly}}{N_{sub}} \right)$$

The trapped oxide charge term in Equation (94) will now be discussed. If trapped charge is negative, the positive sign applies. If trapped charge is positive, the negative sign applies. The contribution to threshold voltage due to trapped charge depends on the square of the gate insulator thickness, $T_{ox}^2$.

$$V_{tc} = \pm \frac{qN_{tc}T_{ox}^2}{e_i} \quad (95)$$

The volume and area density of trapped charge that is required to alter threshold voltage by 100 mv given Tox-100 Å is $$N_{tc} = \frac{0.1 e_i}{qT_{ox}^2} = 2.15E17/cm^3 \text{ or } 3.6E11/cm^3$$

It is clear from Equation (95) that substantial trapped charge is required before threshold voltage can be significantly altered. From this analysis of threshold voltage and its dependence on trapped charge, it is possible to deduce the actual mechanism responsible for the so called "hot electron" problem with MOS devices. The perpendicular electric field at the insulator-substrate interface produced by the depleted substrate region in MOS devices greatly influences the probability of electron trapping in the gate insulator, thereby producing "hot electrons".

Returning to the determination of threshold voltage for a MOSFET, the expression for threshold voltage, Equation (94) is modified by extracting the log term and defining a net threshold voltage $V_{tnet}=V_t+KT/q \ln(N_{poly}/N_{sub})$. Thus, Equation (94) reduces to:

$$V_{tnet} = \frac{1}{C_i}\left[\sqrt{4\phi_f e_s q N_{sub}} \pm qN_{tc}T_{ox} - \frac{V_d e_s}{\alpha L_o}\right] \quad (96)$$

In order to find a fundamental expression for the perpendicular field $E_p$, Equation (96) is solved for substrate concentration $N_{sub}$. $E_p$ at the source end of the channel is given as follows in terms of substrate doping concentration $N_{sub}$:

$$E_p = \sqrt{\frac{4\phi_f q N_{sub}}{e_s}} - \frac{V_d}{\alpha L_o} \quad (97)$$

Thus solving Equation (96) for $N_{sub}$:

$$N_{sub} = \frac{\left(V_t C_i \mp qN_{tc}T_{ox} + \frac{V_d e_s}{\alpha L_o}\right)^2}{4\phi_f e_s q} \quad (98)$$

Substituting Equation (98) into Equation (97) we obtain the expression for the perpendicular electric field $E_p$ for the MOS device:

$$E_p = \frac{V_t C_i}{e_s} \mp \frac{qN_{tc}T_{ox}}{e_s} \approx \frac{V_t C_i}{e_s} \quad (99)$$

It can be seen that the trapped charge expression appears in the perpendicular field equation and that the drain field threshold term does not. The negative sign corresponds to electron trapping. Thus, electron trapping lowers the perpendicular MOS electric field. In other words, trapped charge can influence drain saturation current by influencing $\cos\theta$. The perpendicular field in a typical MOS device required to achieve inversion is in the order of 1E5 Volts/cm, large enough to support charge trapping in the insulator. The trapped charge can easily modify this value by 10%.

Equation (99) must be used in determining MOS drain saturation current. The value for threshold voltage must not be less than twice the Fermi potential of the channel region, otherwise leakage current will increase one decade for each threshold increment of 80 mV below $2\Phi_f$.

Equation (99) implies an appropriate value for substrate concentration. It can be shown that Equation (99) can be used without fear of violating MOS punch-through conditions for all channel lengths down to 0.15 micron.

In summary, Equation (99) is very revealing. In its simplest form, the intensity of the MOS perpendicular field varies directly with threshold voltage and inversely with gate insulator thickness. MOS scaling theory would suggest holding the ratio $V_t/T_{ox}$ constant. However, this condition fails because sub-threshold leakage current will increase one decade for each increment of 80 mV of threshold voltage below twice the Fermi potential. Saturation current is predicted by Equation (99) to increase by lowering threshold voltage $V_t$. However leakage current will dramatically increase.

Figure 22A:
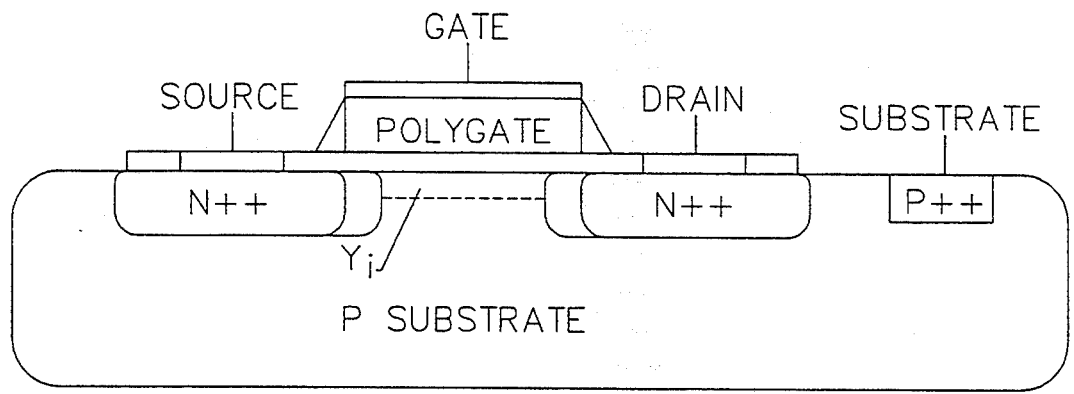
FIG. 22A illustrates a cross-sectional view of an N-channel MOS device with lightly doped diffusions.

FIG. 22A is a cross-section of a typical N-channel MOS device with "lightly doped" diffusions, LDD. Light doping for MOS devices is in the order of 1E19 impurity ions/cm³.

Figure 22B:
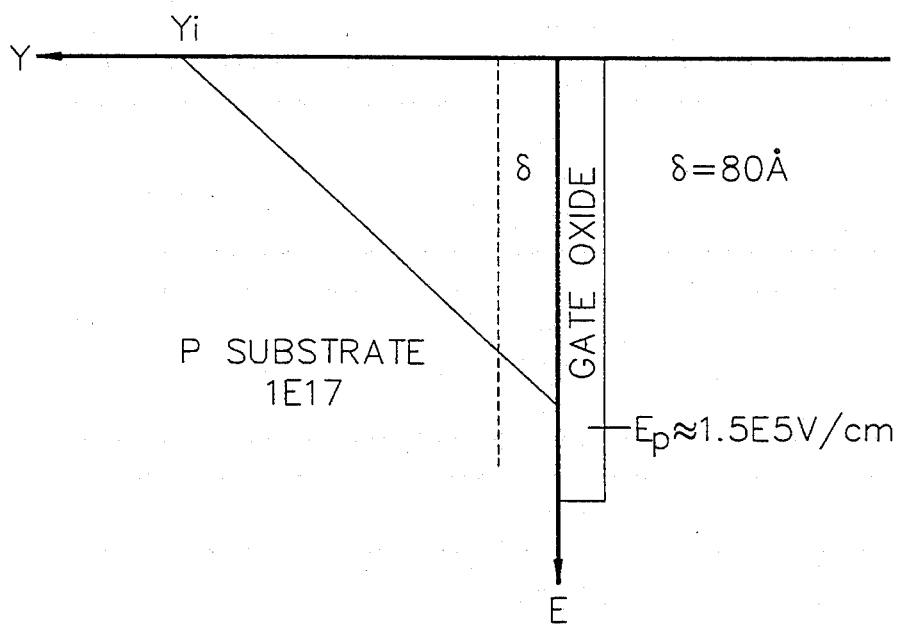
FIG. 22B is a perpendicular electric field diagram for the device of FIG. 22A.

The perpendicular electric field diagram for this MOS device at threshold is shown in FIG. 22B. $Y_i$ defines the depth of the depleted region below the MOS gate at the threshold. Also shown is a flow depth $\delta$ below the insulator-substrate junction, called the inversion depth. Excess injected carriers flowing within this depth experience a substantial perpendicular electric field component with the consequence of lowering lateral carrier velocity.

Figure 23A:
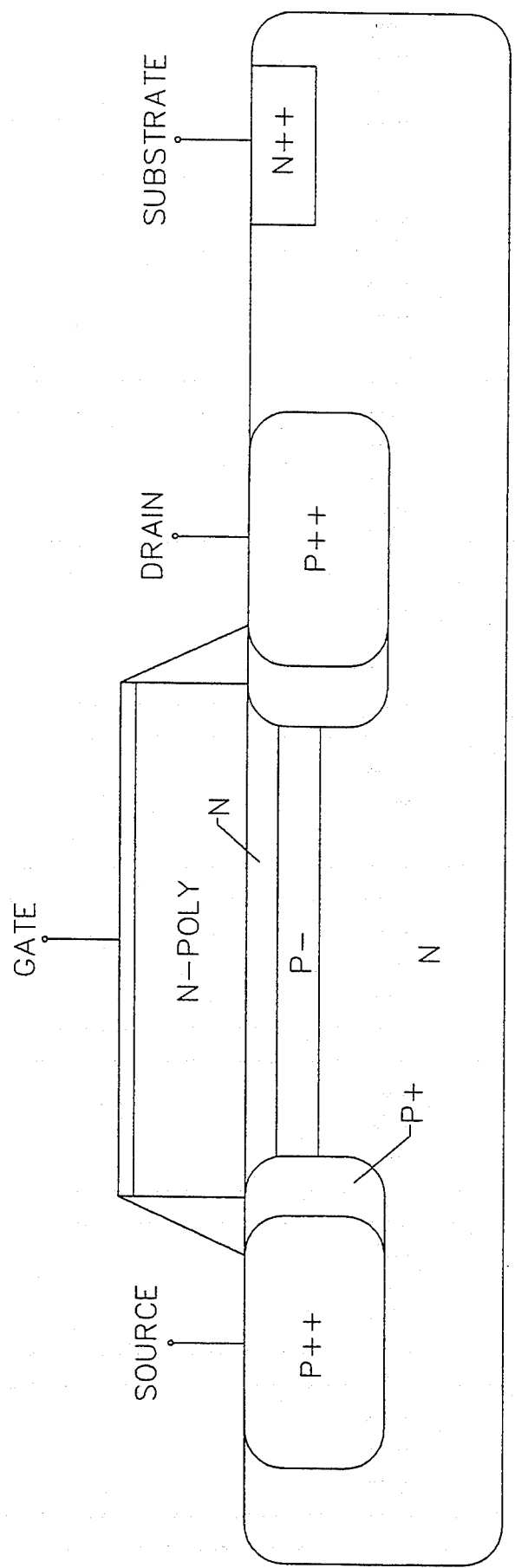
FIG. 23A is a cross-sectional view of a buried channel MOS device with lightly doped diffusions.
Figure 23B:
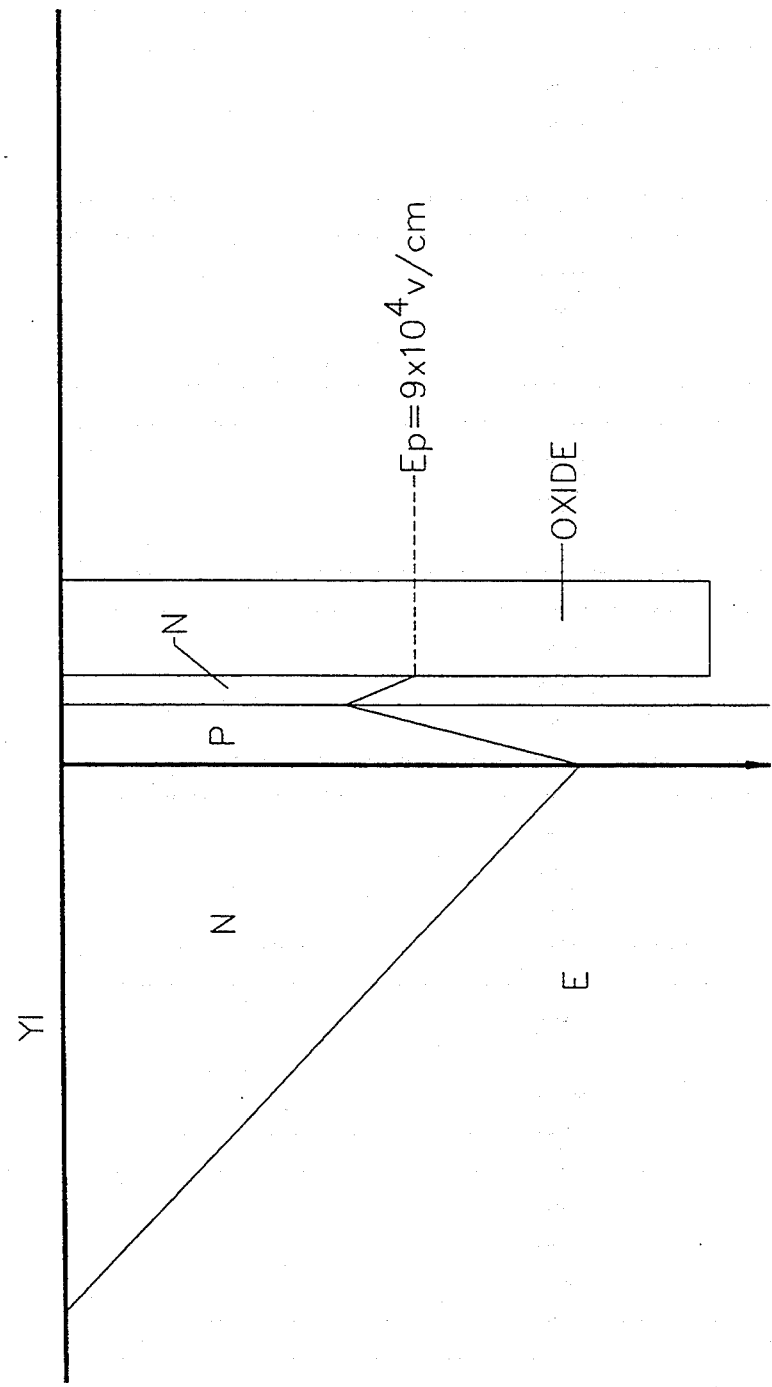
FIG. 23B is a perpendicular electric field diagram for the device of FIG. 23A.

FIG. 23A is a cross-section of a typical P type "buried channel" MOS device with lightly doped diffusions. The perpendicular electric field diagram shown in FIG. 23B for a typical buried channel deice is drawn for threshold conditions. The depth of the depleted substrate region below the gate insulator corresponds to gate voltage at threshold. The buried channel modifies threshold voltage by lowering the perpendicular field crossing the insulator.

Figure 24:
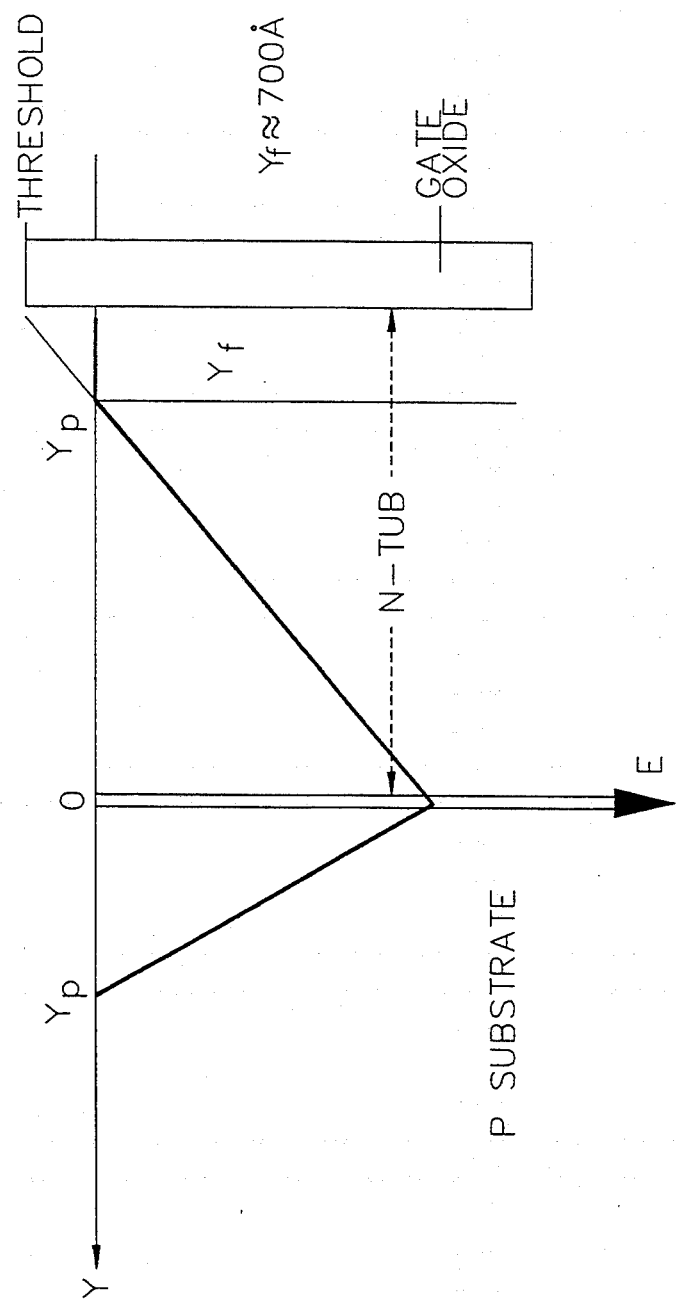
FIG. 24 graphically illustrates a perpendicular electric field diagram for the Fermi-FET transistor of FIG. 13.

FIG. 24 illustrates a perpendicular electric field diagram for the Fermi-FET of FIG. 13. For all gate voltages above threshold no perpendicular electric field is allowed to traverse the entire depth of the Fermi channel, labeled $Y_f$ in FIG. 24. Consequently, accumulated excess majority carriers flowing in this region have maximum lateral mobility. Furthermore, excess carrier threshold voltage is independent of gate insulator thickness. This fact is due to the absence of any static perpendicular field near threshold. Therefore, Fermi-FET drive current capabilities can be chosen by oxide thickness and diffusion concentration without consideration or modification of other structural design considerations.

Fermi Tub-FET saturation current for an N-channel device is:

$$I_{satn} = \frac{C_g^* Z(V_g - V_t)^2 \mu_{no}}{2L_o\sqrt{1 + \left(\frac{(V_g - V_t)\mu_{no}}{2L_o V_{satn}}\right)^2}} \quad (100a)$$

Figure 25A:
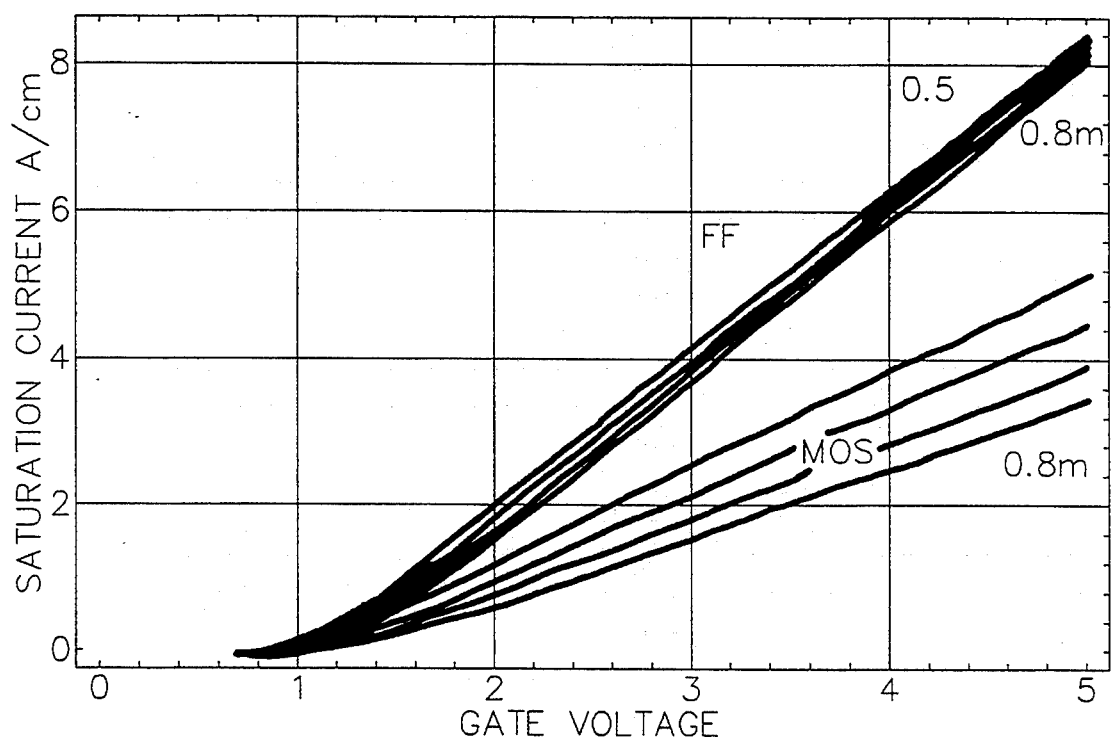
FIGS. 25A–25C graphically illustrate NMOS and N-Fermi-FET drain saturation current as a function of gate function and channel length.
Figure 25B:
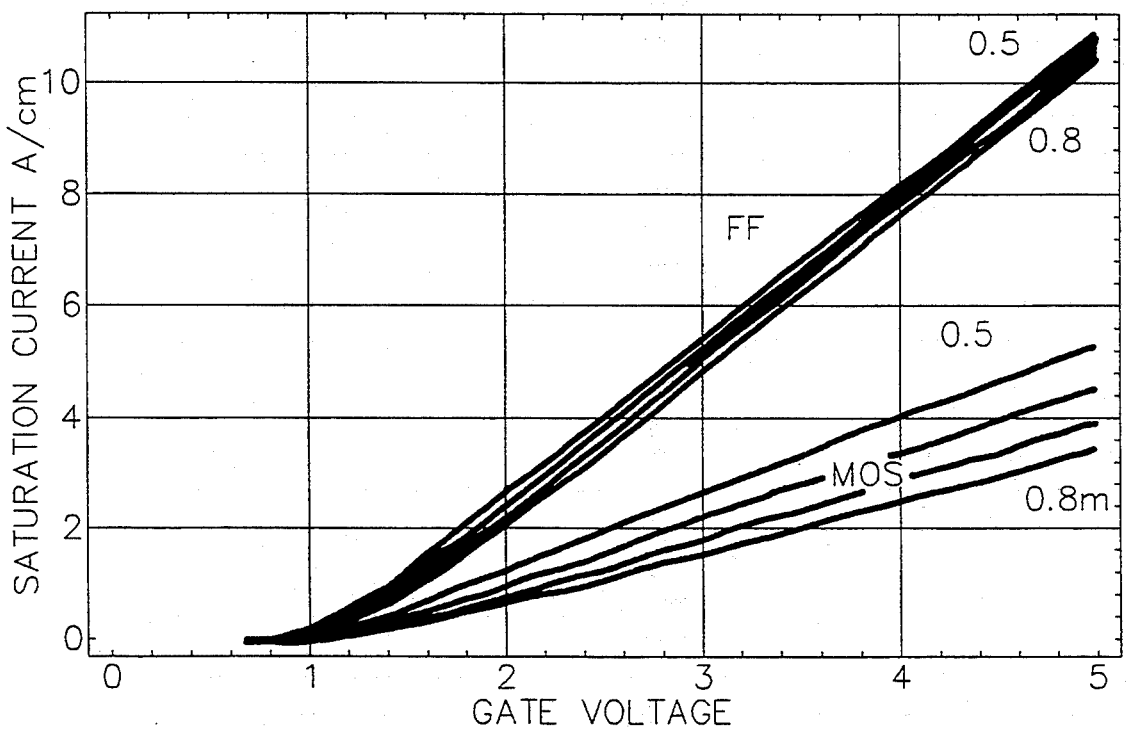
Figure 25C:
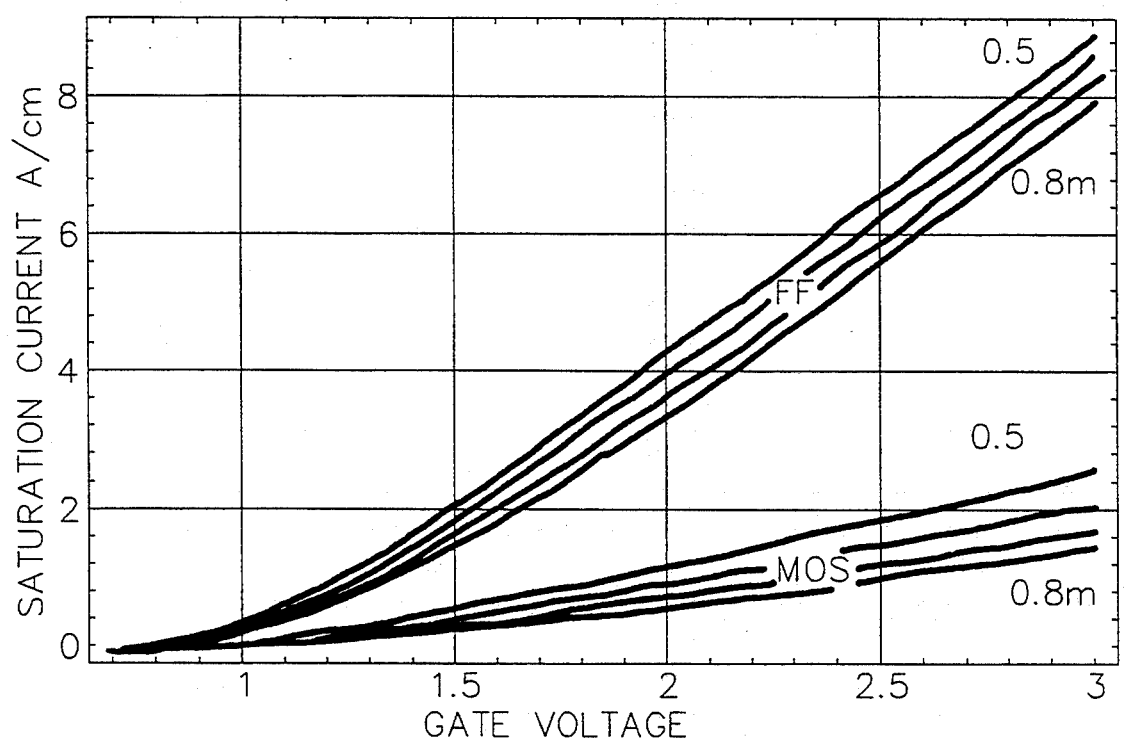
Figure 26A:
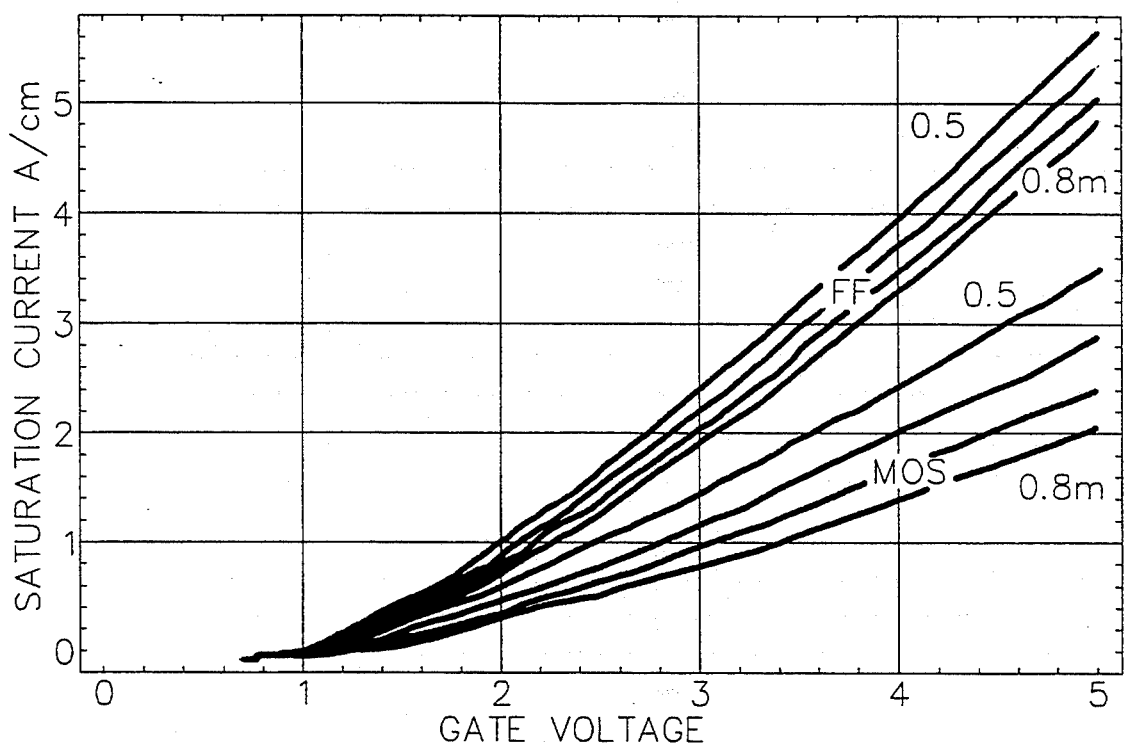
FIGS. 26A–26C graphically illustrate PMOS and P-Fermi-FET drain saturation current as a function of gate function and channel length.
Figure 26B:
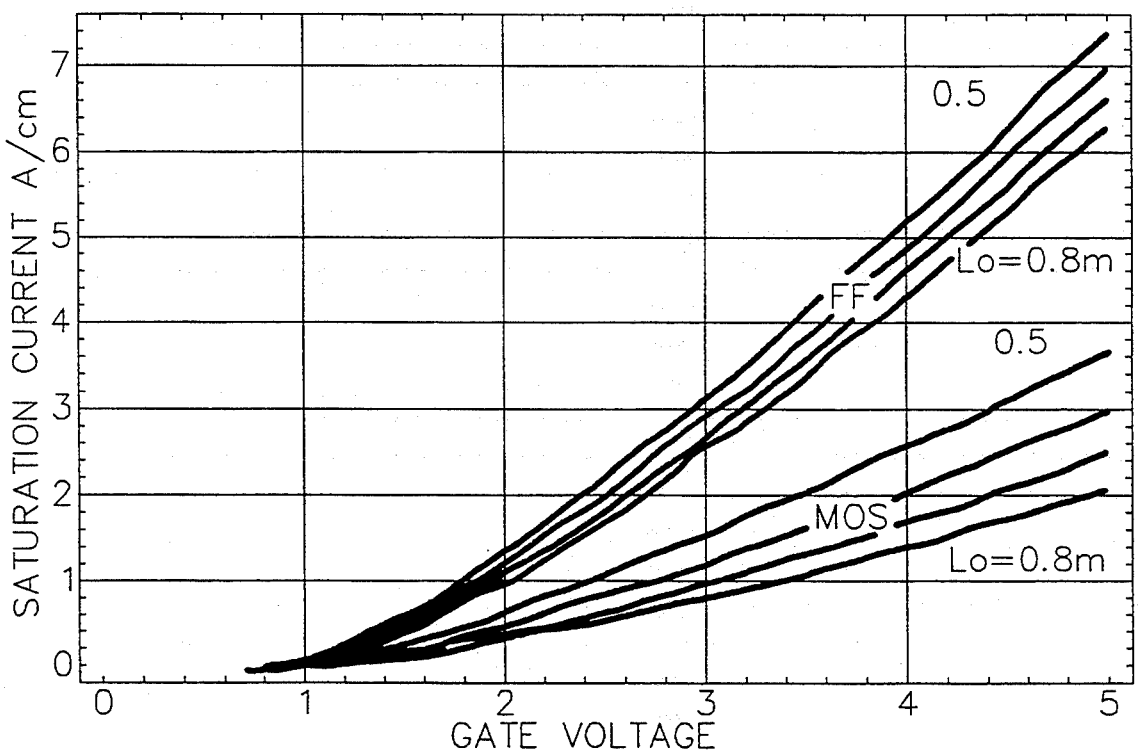
Figure 26C:
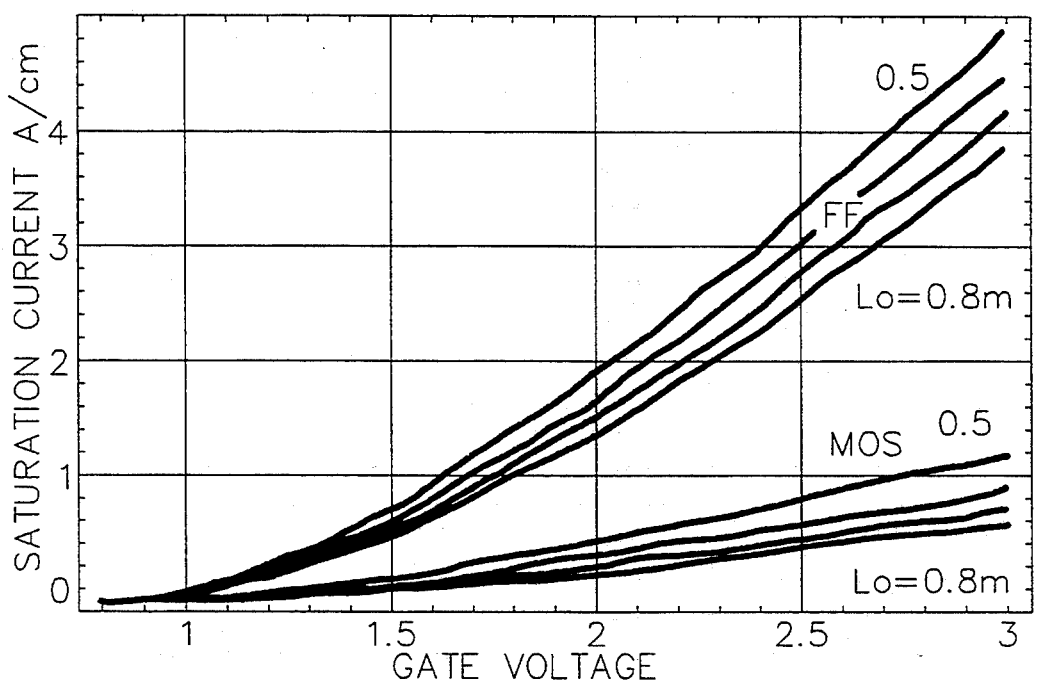

For a P-channel device:
For all of the above equations, the following definitions apply:

$$I_{satP} = \frac{C_g^*(V_g - V_t)^2 \mu_{po}}{2L_o\left[1 + \frac{\mu_{po}}{V_{satp}} \frac{(V_g - V_t)}{2L_o}\right]} \quad (100b)$$

$$C_g^* = \frac{1}{\frac{T_{ox}}{e_i} + \frac{\delta}{2e_s}},$$

maximum gate capacitance, F/cm²
$\delta$ = Flow depth of excess injected carriers
$T_{ox}$ = Gate insulator thickness
$e_s$ = Permittivity of silicon
$e_i$ = Permittivity of the gate insulator
$V_{sat}$ = Thermal saturation velocity
$V_t$ = Threshold voltage $L_o$ = Channel length
$Z$ = Channel width
$\mu_{xo}$ = Low field mobility of species x
$N_{sub}$ = Substrate doping concentration FIGS. 25A–25C compare N-MOS and N-Fermi-FET drain saturation current as a function of gate voltage $V_g$ and channel length $L_o$ as a running parameter. FIGS. 26A–26C are for P-channel technology. In all plots, threshold voltage is twice the Fermi potential or about 0.8 V. This threshold voltage guarantees minimum leakage current i.e. less than 1E-13 Amps per micron when gate voltage is at ground potential. Gate insulator thickness is 140 Å of $SiO_2$ in FIGS. 25A and 26A, 100 Å in FIGS. 25B and 26B and 50 Å in FIGS. 25C and 26C. In FIGS. 25C and 26C, drain supply voltage is 3 Volts rather than 5 Volts as is in the other figures. It is clear from the figures that only the Fermi FET can produce saturation currents in excess of 7 A/cm for N-channel devices and 4 A/cm or greater for P-channel devices. These large currents are attributed to no perpendicular field crossing the flow channel; i.e. Cos $\theta$ approaches a unity value.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
a semiconductor substrate of first conductivity type;
a tub region of second conductivity type in said substrate at a surface thereof, and extending a first depth from said substrate surface;
spaced apart source and drain regions of said second conductivity type in said tub region at said substrate surface;
a channel of said second conductivity type in said tub region, between said spaced apart source and drain regions, and extending a second depth from said substrate surface, wherein said second depth is less than said first depth, at least one of said first and second depths being selected to produce zero static electric field perpendicular to said substrate surface, from said substrate surface to said second depth, and at least one of said source and drain regions being doped said second conductivity type facing said channel at a doping concentration which is sufficiently high to maximize the saturation current of said field effect transistor;
a gate insulating layer on said substrate surface, between said spaced apart source and drain regions; and
source, drain and gate electrodes contacting said source and drain regions and said gate insulating layer, respectively.

2. The field effect transistor of claim 1 wherein the doping concentration of said at least one of said source and drain regions is at least:

$$\frac{1}{2e_s\phi_x q}\left[\frac{e_s e_i L_o(V_{gmax} - V_t)}{Y_f(2e_s T_{ox} + \delta e_i)}\right]^2$$

where:
$E_s$ = Permittivity of substrate
$\phi_x$ = Flat band voltage between said at least one of said source and drain regions and said channel
$q = 1.6 \times 10^{-19}$ coulomb
$e_i$ = Permittivity of the gate insulating layer
$L_o$ = Channel length
$V_{gmax}$ = Maximum gate voltage anticipated
$V_t$ = Threshold voltage
$Y_f$ = Depth of the channel adjacent the source and drain regions
$T_{ox}$ = Gate insulating layer thickness
$\delta$ = Flow depth of excess carriers in the channel.

3. The field effect transistor of claim 1 wherein at least one of said first and second depths are selected to produce a threshold voltage for said field effect transistor which is twice the Fermi-potential of said semiconductor substrate.

4. The field effect transistor of claim 1 wherein at least one of said first and second depths are selected to produce a threshold voltage for said field effect transistor which is less than twice the Fermi-potential of said semiconductor substrate.

5. The field effect transistor of claim 1 wherein at least one of said first and second depths are selected to allow carriers of said second conductivity type to flow from said source region to said drain region in said channel region, extending from said second depth toward said substrate surface upon application of voltage to said gate electrode beyond the threshold voltage of said field effect transistor.

6. The field effect transistor of claim 1 wherein said at least one of said first and second depths are selected to allow carriers of said second conductivity type to flow within said channel region, from said source region to said drain region and beneath said substrate surface, without creating an inversion layer in said channel.

7. The field effect transistor of claim 2 wherein said channel is doped said second conductivity type at a concentration of less than $5 \times 10^{16}$ cm$^{-3}$.

8. The field effect transistor of claim 1 wherein said substrate is doped at a first doping concentration of said first conductivity type; wherein said tub region is doped at a second doping concentration of said second conductivity type; and wherein said first doping concentration is greater than said second doping concentration.

9. The field effect transistor of claim 8 wherein said first doping concentration is at least four times greater than said second doping concentration.

10. A field effect transistor comprising:
a semiconductor substrate of first conductivity type;
a tub region of second conductivity type in said substrate at a surface thereof, and extending a first depth from said substrate surface;
spaced apart source and drain regions of said second conductivity type in said tub region at said substrate surface;
a channel of said second conductivity type in said tub region, between said spaced apart source and drain regions, and extending a second depth from said substrate surface, wherein said second depth is less than said first depth, at least one of said first and second depths being selected to produce zero static electric field perpendicular to said substrate surface, from said substrate surface to said second depth, said channel being doped said second conductivity type at a channel doping concentration which is sufficiently high to lower the threshold voltage of said field effect transistor to below twice the Fermi potential of said semiconductor substrate;

a gate insulating layer on said substrate surface, between said spaced apart source and drain regions; and source, drain and gate electrodes contacting said source and drain regions and said gate insulating layer, respectively.

11. The field effect transistor of claim 10 wherein said threshold voltage of said field effect transistor is lowered to below twice the Fermi potential of said semiconductor substrate by an amount equal to:

$$-qN_{ch}Y_f\left(\frac{Y_f}{2e_s} + \frac{T_{ox}}{e_i}\right)$$

where:
$q = 1.6 \times 10^{-9}$ coulomb
$N_{ch}$ = channel doping concentration
$T_{ox}$ = Gate insulating layer thickness
$Y_f$ = Depth of the Fermi-channel adjacent the source and drain regions
$e_s$ = Permittivity of substrate
$e_i$ = Permittivity of the gate insulating layer.

12. The field effect transistor of claim 10 wherein at least one of said source and drain regions are doped said second conductivity type facing said channel at a doping concentration which is sufficiently high to maximize the saturation current of said field effect transistor.

13. The field effect transistor of claim 10 wherein at least one of said first and second depths are selected to allow carriers of said second conductivity type to flow from said source region to said drain region in said channel region, extending from said second depth toward said substrate surface upon application of voltage to said gate electrode beyond the said threshold voltage of said field effect transistor.

14. The field effect transistor of claim 10 wherein said at least one of said first and second depths are selected to allow carriers of said second conductivity type to flow within said channel region, from said source region to said drain region and beneath said substrate surface, without creating an inversion layer in said channel.

15. The field effect transistor of claim 10 wherein said channel doping concentration is less than $5 \times 10^{16}$ cm$^3$.

16. The field effect transistor of claim 10 wherein said substrate is doped at a first doping concentration of said first conductivity type; wherein said tub region is doped at a second doping concentration of said second conductivity type; and wherein said first doping concentration is greater than said second doping concentration.

17. The field effect transistor of claim 16 wherein said first doping concentration is at least four times greater than said second doping concentration.

18. The field effect transistor of claim 10 wherein said channel doping concentration is less than the source doping concentration, said field effect transistor further comprising:

a source doping gradient region of said second conductivity type between said source region and said channel, and being doped at a doping gradient which decreases from said source doping concentration adjacent said source region to said channel doping concentration adjacent said channel, said source doping gradient region having thickness greater than 300 Ångstroms.

19. The field effect transistor of claim 18 further comprising:

a drain doping gradient region of said second conductivity type between said drain region and said channel, and being doped at a doping gradient which decreases from the drain doping concentration adjacent said drain region to said channel doping concentration adjacent said channel, said drain doping gradient region having thickness greater than 300 Ångstroms.

20. The field effect transistor of claim 18 wherein said gate insulating layer and said gate electrodes extend over said source doping gradient region.

21. The field effect transistor of claim 19 wherein said gate insulating layer and said gate electrode extend over said drain doping gradient region.

22. A field effect transistor comprising:

a semiconductor substrate of first conductivity type;

a tub region of second conductivity type in said substrate at a surface thereof, and extending a first depth from said substrate surface;

spaced apart source and drain regions of said second conductivity type in said tub region at said substrate surface;

a channel of said second conductivity type in said tub region, between said spaced apart source and drain regions, and extending a second depth from said substrate surface, wherein said second depth is less than said first depth, at least one of said first and second depths being selected to produce zero static electric field perpendicular to said substrate surface, from said substrate surface to said second depth, and at least one of said source and drain regions being doped said second conductivity type facing said channel, at a first concentration which is sufficiently high to maximize the saturation current of said field effect transistor, said channel being doped said second conductivity type at a second concentration which is sufficiently high to lower the threshold voltage of said field effect transistor to below twice the Fermi potential of said semiconductor substrate;

a gate insulating layer on said substrate surface, between said spaced apart source and drain regions; and source, drain and gate electrodes contacting said source and drain regions and said gate insulating layer, respectively.

23. The field effect transistor of claim 22 wherein the doping concentration of said at least one of the source and drain regions is at least:

$$\frac{1}{2e_s\phi_xq}\left[\frac{e_se_iL_o(V_{gmax} - V_t)}{Y_f(2e_sT_{ox} + \delta e_i)}\right]^2$$

where:
$E_s$ = Permittivity of substrate
$\phi_x$ = Flat band voltage between said at least one of said source and drain regions and said channel
$q = 1.6 \times 10^{-19}$ coulomb
$e_i$ = Permittivity of the gate insulating layer
$L_o$ = Channel length
$V_{gmax}$ = Maximum gate voltage anticipated
$V_t$ = Threshold voltage $Y_f$=Depth of the channel adjacent the source and drain regions $T_{ox}$=Gate insulating layer thickness $\delta$=Flow depth of excess carriers in the channel.

24. The field effect transistor of claim 23 wherein said threshold voltage of said field effect transistor is lowered to below twice the Fermi potential of said semiconductor substrate by an amount equal to:

$$-qN_{ch}Y_f\left(\frac{Y_f}{2e_s}+\frac{T_{ox}}{e_i}\right)$$

where:

$\Delta V_T$=Change in threshold voltage from twice the Fermi potential of the substrate $q=1.6\times10^{-9}$ coulomb $N_{ch}$=second concentration $T_{ox}$=Gate insulating layer thickness $Y_f$=Depth of the channel adjacent the source and drain regions $e_s$=Permittivity of substrate $e_i$=Permittivity of the gate insulating layer.

25. The field effect transistor of claim 22 wherein at least one of said first and second depths are selected to allow carriers of said second conductivity type to flow from said source region to said drain region in said channel region, extending from said second depth toward said substrate surface upon application of voltage to said gate electrode beyond the said threshold voltage of said field effect transistor.

26. The field effect transistor of claim 22 wherein said at least one of said first and second depths are selected to allow carriers of said second conductivity type to flow within said channel region, from said source region to said drain region and beneath said substrate surface, without creating an inversion layer in said channel.

27. The field effect transistor of claim 22 wherein said channel doping concentration is less than $5\times10^{16}$ cm$^3$.

28. The field effect transistor of claim 22 wherein said substrate is doped at a third doping concentration of said first conductivity type; wherein said tub region is doped at a fourth doping concentration of said second conductivity type; and wherein said third doping concentration is greater than said fourth doping concentration.

29. The field effect transistor of claim 28 wherein said third doping concentration is at least four times greater than said fourth doping concentration.

30. The field effect transistor of claim 22 wherein said channel doping concentration is less than the source doping concentration, said field effect transistor further comprising:

a source doping gradient region of said second conductivity type between said source region and said channel, and being doped at a doping gradient which decreases from said source doping concentration adjacent said source region to said channel doping concentration adjacent said channel, said source doping gradient region having thickness greater than 300 Ångstroms.

31. The field effect transistor of claim 30 further comprising:

a drain doping gradient region of said second conductivity type between said drain region and said channel, and being doped at a doping gradient which decreases from the drain doping concentration adjacent said drain region to said channel doping concentration adjacent said channel, said drain doping gradient region having thickness greater than 300 Ångstroms.

32. The field effect transistor of claim 30 wherein said gate insulating layer and said gate electrodes extend over said source doping gradient region.

33. The field effect transistor of claim 31 wherein said gate insulating layer and said gate electrode extend over said drain doping gradient region.

34. A field effect transistor comprising:

a semiconductor substrate having a first doping concentration of first conductivity type;

a tub region having a second doping concentration of second conductivity type in said substrate at a surface thereof, and extending a first depth from said substrate surface;

spaced apart source and drain regions of said second conductivity type in said tub region at said substrate surface;

a channel of said second conductivity type in said tub region, between said spaced apart source and drain regions, and extending a second depth from said substrate surface, wherein said second depth is less than said first depth, and wherein said first doping concentration is greater than said second doping concentration;

a gate insulating layer on said substrate surface, between said spaced apart source and drain regions; and source, drain and gate electrodes contacting said source and drain regions and said gate insulating layer, respectively.

35. The field effect transistor of claim 34 wherein said first doping concentration is at least four times greater than said second doping concentration.

36. The field effect transistor of claim 34 wherein at least one of said first and said second depths are selected to produce zero static electric field perpendicular to said substrate surface from said substrate surface to said second depth.

* * * * *